United States Patent [19]
Kitaoka et al.

[11] Patent Number: 5,960,259
[45] Date of Patent: Sep. 28, 1999

[54] OPTICAL APPARATUS AND METHOD FOR PRODUCING THE SAME

[75] Inventors: Yasuo Kitaoka; Kazuhisa Yamamoto, both of Osaka; Makoto Kato; Tomoaki Uno, both of Hyogo-ken; Kiminori Mizuuchi; Kenichi Nishiuchi, both of Osaka, all of Japan

[73] Assignee: Matsushita Electric Industrial Co., Ltd., Osaka, Japan

[21] Appl. No.: 08/937,131

[22] Filed: Sep. 24, 1997

Related U.S. Application Data

[62] Division of application No. 08/910,097, Aug. 12, 1997, which is a division of application No. 08/746,718, Nov. 15, 1996.

[51] Int. Cl.⁶ .......................... H01L 21/00; H01L 21/44; H01L 21/48; H01L 21/50
[52] U.S. Cl. .............................. 438/106; 438/25
[58] Field of Search ............................... 438/106

[56] References Cited

U.S. PATENT DOCUMENTS

| | | | |
|---|---|---|---|
| 4,750,799 | 6/1988 | Kawachi et al. | 385/49 |
| 4,821,273 | 4/1989 | Hori . | |
| 5,071,213 | 12/1991 | Chan . | |
| 5,299,212 | 3/1994 | Koch et al. . | |
| 5,481,629 | 1/1996 | Tabuchi | 385/14 |
| 5,574,811 | 11/1996 | Bricheno et al. | 385/49 |
| 5,659,566 | 8/1997 | Takemoto | 385/14 |

FOREIGN PATENT DOCUMENTS

| | | |
|---|---|---|
| 0 331 336 | 9/1989 | European Pat. Off. . |
| 0 343 591 | 11/1989 | European Pat. Off. . |
| 0 411 131 | 2/1991 | European Pat. Off. . |
| 0 420 249 | 4/1991 | European Pat. Off. . |
| 0 495 559 | 7/1992 | European Pat. Off. . |
| 0 529 732 | 3/1993 | European Pat. Off. . |
| 0 585 758 | 3/1994 | European Pat. Off. . |
| 0 636 911 | 2/1995 | European Pat. Off. . |
| 0 703 649 | 3/1996 | European Pat. Off. . |
| 60-214432 | 10/1985 | Japan . |
| 60-245288 | 12/1985 | Japan . |
| 63-280206 | 11/1988 | Japan . |
| 3-100505 | 4/1991 | Japan . |
| 5-29892 | 5/1993 | Japan . |
| 5-323139 | 12/1993 | Japan . |
| 6-35019 | 2/1994 | Japan . |
| 6-167627 | 6/1994 | Japan . |
| 6-326392 | 11/1994 | Japan . |
| 6-338650 | 12/1994 | Japan . |
| 6-342954 | 12/1994 | Japan . |

OTHER PUBLICATIONS

K. Mizuuchi et al., "Characteristics of Periodically Domain–Inverted (List continued on next page.)

Primary Examiner—John F. Niebling
Assistant Examiner—Josetta I. Jones
Attorney, Agent, or Firm—Ratner & Prestia

[57] ABSTRACT

A light generating apparatus includes: a submount; a semiconductor laser chip mounted on the submount; a substrate which is mount on the submount and includes an optical waveguide; and a substance having a predetermined thickness which is disposed between the semiconductor laser chip and the substrate. In an oscillation wavelength stabilizing apparatus for a light source, the light source is a semiconductor laser which includes: an active region for providing gain; and a distributed Bragg reflection (DBR) region for controlling an oscillation wavelength. The apparatus includes a control section which monotonously varies, in a first direction, a DBR current to be input to the DBR region while detecting the oscillation wavelength of an output light of the semiconductor laser so as to detect a DBR current value $I_o$ corresponding to a predetermined wave-length value, and then monotonously varies the DBR current in a second direction which is opposite the first direction beyond the detected value $I_o$ and then monotonously varies the DBR current in the first direction again to set the DBR current at the detected value $I_o$, thereby fixing the oscillation wavelength of the semiconductor laser chip at the predetermined wavelength value.

8 Claims, 35 Drawing Sheets

OTHER PUBLICATIONS

LiTaO$_3$", *Journal of Applied Physics,* vol. 72, No. 11, pp. 5061–5069 (Dec. 1992).

L. Balliet et al., "Coined Block for Self–Aligning Edge Emitters to Fiber", *IBM Technical Disclosure Bulletin,* vol. 25, No. 8, pp. 4258–4260 (Jan. 1983).

European Search report dated Mar. 17, 1997 corresponding to European Patent Application No. 96118385.2.

K. Mizuuchi et al., "Broadening of the Phase–Matching Bandwidth in Quasi–Phase–Matched Second–Harmonic Generation", *IEEE Journal of Quantum Electronics,* vol. 30, No. 7, pp. 1596–1604 (Jul. 1994).

K. Yamamoto, et al., "Milliwatt–order blue–light generation in a periodically domain–inverted LiTaO$_3$ waveguide", *Optics Letters,* vol. 16, No. 15, pp. 11–56–1158 (Aug. 1, 1991).

Y. Kitaoka, et al., "An SHG Blue–light Source Using Domain–inverted Waveguide Device in LiTaO$_3$", *The Review of Laser Engineering,* vol. 23, No. 9, pp. 78–84 (Sep., 1995).

European Search Report dated Mar. 4, 1998.

Mitsuhiro Teshima, "Dynamic Wavelength Tuning Characteristics of the 1.5–$\lambda$m Three–Section DBR Lasers: Analysis and Experiment", IEEE Journal of Quantum Electronics, No. 8, pp. 1389–1400, Aug., 31, 1995.

O. Ishida et al., "Tuning–current splitting network for three–section DBR lasers", Electronics Letters, No. 3, pp. 241–242, Feb. 3, 1994.

C. Zimmermann et al., "Second harmonic generation at 972 nm using a distributed Bragg reflection semiconductor laser", Applied Physics Letters, No. 23, pp. 2741–2743, Dec. 7, 1992.

S. Benedetto et al., "Switching Characteristics of Distributed Bragg Reflector Lasers", Proceedings of the ICCS/ISITA, Conference on Communications on the Move, Singapore 16–20, vol. 3, pp. 1362–1366, Nov. 1992.

FIG. 10A
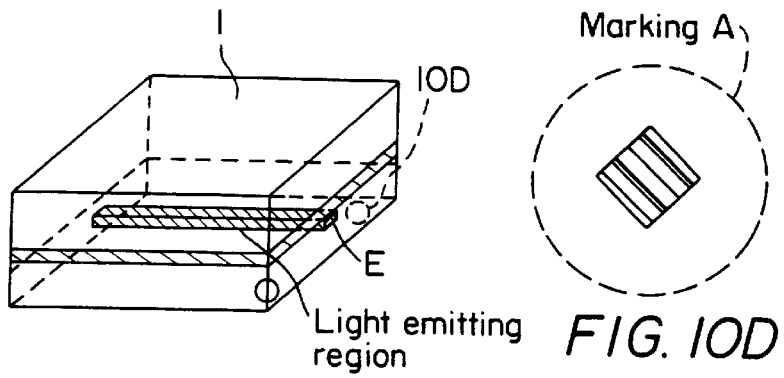
FIG. 10D
FIG. 10B
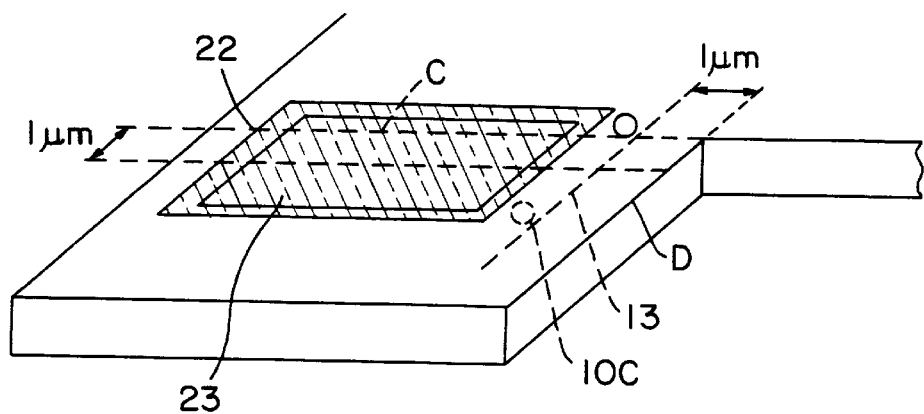
FIG. 10C
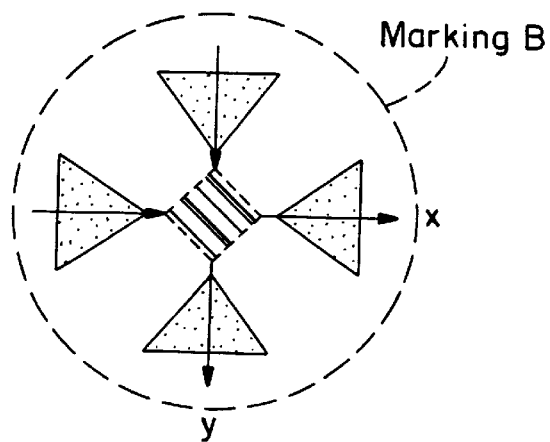

OPTICAL APPARATUS AND METHOD FOR PRODUCING THE SAME

This application is a division of U.S. application Ser. No. 08/910,097 filed on Aug. 12, 1997, which is a division of U.S. Ser. No. 08/746,718, filed Nov. 15, 1996.

BACKGROUND OF THE INVENTION

1. Field of the Invention

The present invention generally relates to an optical apparatus and a method for producing the same. Specifically, the present invention relates to a light generator including a semiconductor laser and a waveguide type optical function device, and a method for producing the same. The present invention also relates to an oscillation wavelength stabilizer for a light source such as a semiconductor laser having a distributed Bragg-reflector (DBR) region, a harmonic output stabilizer for a short wavelength light source which includes a semiconductor laser having a DBR region and a wavelength converting device, and further to an optical disk system including the same.

2. Description of the Related Art

In the optical information processing field, optical functional devices for modulating light output from a semiconductor laser at high speeds or halving the wavelength of laser light have been vigorously developed. In particular, waveguide type optical functional devices are promising for realizing the modulation of laser light at a frequency of several gigahertz or more or obtaining 1 mW or more of short-wavelength laser light. Hereinbelow, a waveguide type second harmonic generation (SHG) device (Mizuuchi et al., IEEE, Journal of Quantum Electronics, 30 (1994), pp. 1596) and an optical modulation device will be briefly described.

A typical SHG device 50 will be explained referring to FIG. 16, which is a perspective view of the SHG device 50.

The SHG device 50 includes a z-cut $LiTaO_3$ crystal substrate 31. A waveguide 32 and periodical domain inverted regions 33 extending perpendicular to the waveguide 32 are formed on the z-cut $LiTaO_3$ crystal substrate 31. The SHG device 50 allows harmonics to be generated with high efficiency by compensating the unmatching of the propagation constant between a fundamental wave and a generated harmonic with the periodical structure of the domain inverted regions 33.

Such an SHG device 50 is fabricated in the following manner.

A Ta electrode pattern is formed on the z-cut $LiTaO_3$ crystal substrate 31 (made of nonlinear optical crystal) by evaporation and photolithography having a periodic spacing of several micrometers. A voltage of 2 $kV/mm$ is then applied to the resultant substrate to form the periodic domain inverted regions 33. Thereafter, a stripe made of Ta, extending perpendicular to the periodic domain inverted regions 33, is formed on the substrate. The resultant substrate is heat-treated with pyrophosphoric acid for about 16 minutes, subjected to proton exchange, and annealed at about 420° C. for about one minute, to form the waveguide 32.

The proton-exchanged waveguide 32 allows only light having a polarized component in the z direction to propagate therethrough. In general, the SHG device using the z-cut $LiTaO_3$ crystal substrate has a higher conversion efficiency into a harmonic, though the SHG device can also be fabricated using an x-cut $LiTaO_3$ crystal substrate.

A conventional light generator including such a waveguide type SHG device and a semiconductor laser will now be described.

Referring to FIG. 17, light emitted from a semiconductor laser 34 is guided into a waveguide 40 having a waveguide type SHG device 39 via two coupling lenses 35 and 38. More specifically, light emitted from a semiconductor laser 34 is collimated by a collimator lens 35, passes through a half-wave plate 36 and a bandpass filter 37, and is focused on the waveguide 40 of the waveguide type SHG device 39 by a focusing lens 38. The semiconductor laser 34 oscillates at a TE mode, while the waveguide 40 allows only a light component polarized in the z direction to propagate therethrough. The half-wave plate 36 is uses to obtain the maximum overlap between the light emitted from the semiconductor laser 34 and the light propagating through the waveguide 40. The laser light emitted from the semiconductor laser 34 is converted into harmonic light while propagating in the waveguide 40 and output from the emergent end face thereof.

This conventional light generator generates about a 2.8 mW blue light with a wavelength of 430 nm from 120 mW laser light with a wavelength of 860 nm emitted from an AlGaAs semiconductor laser as the fundamental wave. The module volume of this light generator using the above two coupling lenses 35 and 38 is about 3 cc (Kitaoka et al, Laser Study, 23 (1995), pp. 787).

As optical disk systems and optical communication systems have been generally and widely used, demands for reducing the size and cost of relevant components have increased. In order to reduce the size and cost of the light generator including the semiconductor laser and the waveguide type optical functional device, it is required to simplify the optical coupling adjustment (i.e., the alignment adjustment for obtaining the optical coupling) and omit any coupling lens. In the conventional module structure, as shown in FIG. 17, using two coupling lenses 35 and 38 for guiding laser light of the semiconductor laser 34 to the waveguide 40, there are required four axial adjustments: i.e., adjustments of the focusing lens 38 and the collimator lens 35 both along the optical axis (direction y in FIG. 17); and adjustments of the semiconductor laser 34 in directions x and z in FIG. 17. Thus, a certain period of time is required for realizing the adjustment, and fabrication cost is increased. Further, the module structure including two coupling lenses has a relatively large volume of about 3 cc and occupies a relatively large space. The time and cost required for the optical coupling adjustment and the module volume of about 3 cc of the conventional optical functional device are disadvantageous in the application of the device to consumer appliances such as optical disk systems.

A direct-coupling module including no coupling lens has been proposed to achieve size reduction (Japanese Patent Publication No. 5-29892). This type of module, however, still requires alignment adjustments for optical coupling along two or three axes, requiring time and cost for the optical coupling.

Another problem of the conventional light generator is that presently it is difficult to optically couple the wavegu de formed on the z-cut crystal substrate by proton exchange and the semiconductor laser light oscillating at the TE mode on one submount in a simple manner. The waveguide formed on the z-cut crystal substrate by proton exchange allows only light of a TM mode to propagate therethrough. Therefore, a half-wave plate is required to mount both the waveguide and the semiconductor laser emitting light of a TE mode on one submount.

By the way, optical disk systems using a near infrared semiconductor laser with a wavelength of a 780 nm band or a red semiconductor laser with a wavelength of 670 nm have been vigorously developed. In order to enhance the density of an optical disk, it is required to reproduce smaller spots. To reproduce smaller spots, a higher numerical aperture (NA) of a focusing lens and a shorter-wavelength of a light source are required. One of the conventional techniques for shortening the wavelength is second harmonic generation (SHG), where a near infrared semiconductor laser and a domain inverted type waveguide device of a quasi-phase matching (QPM) method is used (see Yamamoto et al., Optics Letters, Vol. 16, No. 15, 1156 (1991)).

FIG. 34 is a schematic structural view of a blue light source using a domain inverted type waveguide device (the SHG blue laser).

Referring to FIG. 34, the light source includes a 0.85 $\mu$m-band, 100 mW-class AlGaAs DBR semiconductor laser 123, a collimator lens 124 with an NA of 0.5, a half-wave plate 125, a focusing lens 126 with an NA of 0.5, and a domain inverted type waveguide device 127. The DBR semiconductor laser 123 includes a DBR region for fixing the oscillation wavelength. The DBR region has an internal heater for varying the oscillation wavelength. The domain inverted type waveguide device 127 includes a waveguide 129 and periodic domain inverted regions 130 formed on an LiTaO$_3$ subs-rate 128. The polarized direction of laser light collimated by the collimator lens 124 is rotated by the half-wave plate 125, and the resultant light is focused on the incident end face of the waveguide 129 of the domain inverted type waveguide device 127. The focused light propagates through the waveguide 129 having the domain inverted regions 130, to be output from the emergent end face of the waveguide 129 as a harmonic and a non-converted fundamental wave.

In the domain inverted type waveguide device 127, the phase-matching wavelength allowance where high efficiency wavelength conversion is possible is as narrow as 0.1 nm. To overcome this problem, the current amount supplied to the DBR region of the DBR semiconductor laser 123 is controlled, to fix the oscillation wavelength within the phase-matching wavelength allowance of the domain inverted type waveguide device 127. As a result, typically, about a 3 mW blue light with a wavelength of 425 nm is obtained for 70 mW laser light incident on the waveguide 129.

The DBR semiconductor laser includes an active region for obtaining a gain and the DBR region for controlling the oscillation wavelength. The DBR region is made of a material having a band gap larger than that of the active region so that the DBR region is transparent for the laser light with a wavelength of 850 nm. Since the DBR region has a lattice, the oscillation wavelength is controlled by the wavelength of the light reflected from the DBR region.

Thus, the oscillation wavelength can be varied by varying the refractive index of the DBR region. The refractive index of the DBR region can be varied by methods such as (1) supplying a current to the DBR region, and (2) varying the temperature of the semiconductor laser using an electronic cooling element (Peltier element) and the like.

However, in the case of varying the oscillation wavelength by varying the DBR current, it may difficult to precisely fix the oscillation wavelength at a desired value.

On the other hand, in the case of varying the oscillation wavelength by varying the temperature of the semiconductor laser, an electronic cooling element having a heat absorption capacitance of about 1 W is required for the control of the temperature of the semiconductor laser, which increases power consumption. Moreover, when the ambient temperature under which the semiconductor laser is used becomes wider, operational reliability may be deteriorated. In addition, output intensity of laser light varies as the temperature o the semiconductor laser varies for changing the oscillation wavelength. If the current supplied to the active region is adjusted to compensate the output variation, the phase condition changes, causing mode hopping.

In order to avoid the mode hopping, a semiconductor laser having a phase control section has been proposed. However, it is likely to be difficult to find a control method for stably and continuously varying the oscillation wavelength irrespective of a variation of the ambient temperature.

In the short-wavelength light source including the semiconductor laser having the DBR region and the wavelength converting device, it is required to match the oscillation wavelength of the semiconductor laser with the phase-matching wavelength of the wavelength converting device, In the short-wavelength light source, the output of short-wavelength light varies if the oscillation wavelength shifts from the phase-matching wavelength. In particular, when a quasi-phase matching (QPM) type wavelength converting device having a periodic domain inverted structure is used as the wavelength converting device, it is significantly important to control the oscillation wavelength of the semiconductor laser because the allowance for the phase-matching wavelength is as narrow as about 0.1 nm.

Another problem of the short-wavelength light source is that LiTaO$_3$ crystal and LiNbO$_3$ crystal used for the substrate of the QPM type device have optical damage characteristics. The optical damage as used herein refers to the variation of the refractive index caused by irradiation with short-wavelength light. As the refractive index varies, the phase-matching wavelength of the QPM type device shifts. In order to obtain a stable harmonic output, therefore, it is required to always control the wavelength of the semiconductor laser to match with the phase-matching wavelength.

SUMMARY OF THE INVENTION

A light generating apparatus of the present invention includes: a submount; a semiconductor laser chip mounted on the submount; a substrate which is mounted on the submount and includes an optical waveguide; and a substance having a predetermined thickness which is disposed between the semiconductor laser chip and the substrate.

Preferably, the substrate is a ferroelectric crystal substrate. The ferroelectric crystal substrate may include LiTa$_x$Nb$_{1-x}$O$_3$ ($0 \leq x \leq 1$). A periodic domain inverted structure formed on the ferroelectric substrate may further be included.

The optical waveguide may be formed by an ion-exchange technique.

In one embodiment, the substance is a glass ball. Alternatively, the substance can be an optical fiber.

According to another aspect of the invention, a light generating apparatus includes: a submount including a first surface and a second surface; a semiconductor laser chip mounted on the first surface of the submount; and a substrate which is mounted on the second surface of the submount and includes an optical waveguide, wherein the first surface and the second surface are positionally perpendicular to each other.

Preferably, the substrate is a ferroelectric crystal substrate. The ferroelectric crystal substrate may include LiTa$_x$Nb$_{1-x}$O$_3$ ($0 \leq x \leq 1$). A periodic domain inverted structure formed on the ferroelectric substrate may be further included.

The optical waveguide may be formed by an ion-exchange technique.

According to still another aspect of the invention, a light generating apparatus includes: a submount including a first portion and a second portion; a semiconductor laser chip mounted onto the first portion of the submount; and a substrate which is mounted onto the second portion of the submount and includes an optical waveguide, wherein material constituting the first portion is different from material constituting the second portion.

Preferably, the substrate is a ferroelectric crystal substrate. The ferroelectric crystal substrate may include $LiTa_xNb_{1-x}O_3$ ($0 \leq x \leq 1$). A periodic domain inverted structure formed on the ferroelectric substrate may be further included.

The optical waveguide may be formed by an ion-exchange technique.

In one embodiment, a crystal thin plate having birefringence which is disposed between the first portion and the second portion of the submount is further provided.

Preferably, a thermal conductivity of the first portion is larger than that of the second portion.

In one embodiment, the first portion and the second portion are made of a ceramic.

According to still another aspect of the invention, a method for fabricating a light generating apparatus includes the steps of: forming an alignment marking on each of a submount, a semiconductor laser chip and a substrate, the submount including a first surface and a second surface which are positionally perpendicular to each other, and the substrate including an optical waveguide; aligning the submount and the semiconductor laser chip using the alignment markings on the submount and the semiconductor laser chip to mount the semiconductor laser chip on the first surface of the submount; and aligning the submount and the substrate using the alignment markings on the submount and the substrate to mount the substrate on the second surface of the submount.

Preferably, the substrate is a ferroelectric crystal substrate. The ferroelectric crystal substrata may include $LiTa_xNb_{1-x}O_3$ ($0 \leq x \leq 1$). The method may further include the step of providing a periodic domain inverted structure on the ferroelectric substrate.

The method may further includes the step of forming the optical waveguide by an ion-exchange technlique.

According to still another aspect of the invention, a method for fabricating a light generating apparatus includes the steps of: forming an alignment marking on each of a submount and a semiconductor laser chip, the submount including a first surface and a second surface; irradiating a surface of the submount opposite to the first surface with light which is allowed to pass through the submount, and respectively identifying an image of the alignment making on each of the submount and the semiconductor laser chip; aligning the submount and the semiconductor laser chip using the alignment markings on the submount and the semiconductor laser chip to mount the semiconductor laser chip on the first surface of the submount; and mounting a substrate including an optical waveguide onto the second surface of the submount.

The light may be a laser light emitted from an InP type semiconductor laser.

Preferably, the substrate is a ferroelectric crystal substrate. The ferroelectric crystal substrate may include $LiTa_xNb_{1-x}O_3$ ($0 \leq x \leq 1$). The method may further include the step of providing a periodic domain inverted structure on the ferroelectric substrate.

The method may further include the step of forming the optical waveguide by an ion-exchange technique.

According to still another aspect of the invention, a method for fabricating a light generating apparatus includes the steps of: allowing at least a portion of a layered structure for laser oscillation in a semiconductor laser chip to emit light so as to form a light emitting region; identifying the light emitting region of the semiconductor laser chip to obtain a positional information of the semiconductor laser chip, and mounting the semiconductor laser chip at a predetermined position on a submount based on the positional information; and mounting a substrate on the submount, the substrate including an optical waveguide.

In one embodiment, the light emitting region is formed by optical excitation. In another embodiment, the light emitting region is formed by coupling external light to an active layer of the semiconductor laser chip. In still another embodiment, the light emitting region is formed by pulse-driving the semiconductor laser chip.

Preferably, the substrate is a ferroelectric crystal substrate. The ferroelectric crystal substrate may include $LiTa_xNb_{1-x}O_3$ ($0 \leq x \leq 1$). The method may further include the step of providing a periodic domain inverted structure on the ferroelectric substrate.

The method may further include the step of forming the optical waveguide by an ion-exchange technique.

According to still another aspect of the invention, a light generating apparatus includes: a submount; a semiconductor laser chip mounted on the submount; and a substrate which is mounted on the submount and includes a plurality of optical waveguides, herein a surface of the substrate at which the optical waveguides are formed and a surface of the submount onto which the substrate is mounted are in a non-parallel relationship.

In one embodiment, a projection formed on the surface of the substrate at which the optical waveguides are formed is further included, the projection providing the non-parallel relationship.

In another embodiment, a projection formed on the surface of the submount on which the substrate is mounted is further included, the projection providing the non-parallel relationship.

In still another embodiment, the substrate includes a top surface and a bottom surface which are not in parallel with each other, thereby providing the non-parallel relationship.

Preferably, the substrate is a ferroelectric crystal substrate. The ferroelectric crystal substrate may include $LiTa_xNb_{1-x}O_3$ ($0 \leq x \leq 1$). A periodic domain inverted structure formed on the ferroelectric substrate may be further included.

The optical waveguide may be formed by an ion-exchange technique.

According to still another aspect of the present invention, provided is a method for fabricating a light generating apparatus includes: a submount; a semiconductor laser chip; and a substrate including an optical waveguide, wherein a surface of the substrate on which the optical waveguide is formed and a surface of the submount onto which the substrate is mounted are in a non-parallel relationship with each other. The method includes the steps of: processing at least one of the submount and the substrate to obtain the non-parallel relationship; mounting the semiconductor laser chip on the submount; and moving the substrate on the submount in a direction parallel with an optical axis of the mounted semiconductor laser chip to adjust an optical coupling between the substrate and the semiconductor laser chip in a direction of a thickness of the substrate, and mounting the substrate at a predetermined position on the substrate.

In one embodiment, the method may further include the step of forming a projection on the surface of the substrate on which the optical waveguides are formed, the projection providing the non-parallel relationship.

In another embodiment, the method may further include the step of forming a projection on the surface of the submount on which the substrate is mounted, the projection providing the non-parallel relationship.

In still another embodiment, the method may further include the step of making a top surface and a bottom surface of the substrate unparallel with each other, thereby providing the non-parallel relationship.

Preferably, the substrate is a ferroelectric crystal substrate. The ferroelectric crystal substrate may include $LiTa_xNb_{1-x}O_3$ ($0 \leq x \leq 1$). The method may further include the step of providing a periodic domain inverted structure on the ferroelectric substrate.

The method may further include the step of forming the optical waveguide by an ion-exchange technique.

According to still another aspect of the present invention, provided is an oscillation wavelength stabilizing apparatus for a light source, wherein the light source is a semiconductor laser, includes: an active region for providing gain; and a distributed Bragg reflection (DBR) region for controlling an oscillation wavelength. The apparatus includes a control section which monotonously varies, in a first direction, a DBR current to be input to the DBR region while detecting the oscillation wavelength of an output light of the semiconductor laser so as to detect a DBR current value $I_o$ corresponding to a predetermined oscillation wavelength value, and then monotonously varies the DBR current in a second direction which is opposite the first direction beyond the detected value $I_o$, and then monotonously varies the DBR current in the first direction again to set the DBR current at the detracted value $I_o$, thereby fixing the oscillation wavelength of the semiconductor laser at the predetermined oscillation wavelength value.

In one embodiment, the control section provides a different input rate of the DBR current into the DBR region between a range of the DBR current in which the oscillation wavelength continuously changes and a range of the DBR current in the vicinity of a current level at which mode-hopping occurs.

In another embodiment, the detected value $I_o$ of the DBR current is set so as to satisfy equation $I_o=(I_1+I_2)/2$ where $I_1$ is a first DBR current value at which mode-hopping occurs and $I_2$ is an adjacent DBR current value at which mode-hopping occurs.

According to still another aspect of the present invention, provided is an oscillation wavelength stabilizing apparatus for a light source, wherein the light source is a semiconductor laser includes: an active region for providing gain; a distributed Bragg reflection (DBR) region for controlling an oscillation wavelength and an electronic cooling element. The apparatus includes a control section which varies a DBR current to be input to the DBR region to set an oscillation wavelength of an output light of the semiconductor laser in the vicinity of a predetermined oscillation wavelength value, and then allows a temperature of the semiconductor laser to vary by the electronic cooling element, thereby fixing the oscillation wavelength of the semiconductor laser at the predetermined oscillation wavelength value.

Preferably, in an initial setting process, the control section may set the temperature of the semiconductor laser in the vicinity of ambient temperature.

According to still another aspect of the present invention, provided is as oscillation wavelength stabilizing apparatus for a light source, wherein the light source is a semiconductor laser including: an active region for providing gain; a distributed Bragg reflection (DBR) region for controlling an oscillation wavelength; and an electronic cooling element. The apparatus includes a control section which allows a temperature of the semiconductor laser to vary by the electronic cooling element to vary the oscillation wavelength of the semiconductor laser, and further causes the DBR current to be input to the DBR region to be varied, thereby compensating for a phase change of the semiconductor laser.

In one embodiment, the control section further adjusts a current to be input to the active region in response to a change in an output of the semiconductor laser.

According to still another aspect of the present invention, provided is as oscillation wavelength stabilizing apparatus for a light source, wherein the light source is a semiconductor laser including: an active region for providing gain: a distributed Bragg reflection (DBR) region for controlling an oscillation wavelength; a phase control region; and a temperature sensor. The apparatus includes:a first control circuit for adjusting a current to be input to the active region so as to maintain a uniform output of the semiconductor laser; a second control circuit for adjusting a DBR current to be input to the DBR region so as to set the oscillation wavelength of the semiconductor laser at a predetermined oscillation wavelength value; and a third control circuit for adjusting a current to be input to the phase control region so as to compensate for a phase change detected by the first control circuit, the second control circuit, and the temperature sensor.

According to still another aspect of the present invention, provided is an oscillation wavelength stabilizing apparatus for a light source, wherein the light source is a semiconductor laser including: an active region for providing gain; a distributed Bragg reflection (DBR) region for controlling an oscillation wavelength; and a phase control region. The apparatus includes a control section which allows a DBR current to be input to the DBR region to vary in a initial setting process so as to set the oscillation wavelength of the semiconductor laser in the vicinity of a predetermined oscillation wavelength value, and then varies both a current to be input to the phase control region and the DBR current, thereby fixing the oscillation wavelength of the semiconductor laser at the predetermined oscillation wavelength value.

According to still another aspect of the present invention, provided is a harmonic output stabilizing apparatus for a light source, wherein the light source is a short wavelength light source including: a semiconductor laser including an active region for providing gain and a distributed Bragg reflection (DBR) region for controlling an oscillation wavelength; and a wavelength converting device made of non-linear optical crystal. The apparatus includes a control section which monotonously varies, in a first direction, a DBR current to be input to the DBR region while detecting a harmonic optical output of the short wavelength light source so as to detect a DBR current value $I_o$ corresponding to a monotonously varies the DBR current in a second direction which is opposite the first direction beyond the detected value $I_o$, and then monotonously varies the DBR current in the first direction again to set the DBR current at the detected value $I_o$, thereby fixing the oscillation wavelength of the semiconductor laser at a phase-matching wavelength of the wavelength converting device.

According to still another aspect of the present invention, provided is a harmonic output stabilizing apparatus for a light source, wherein the light source is a short wavelength light source including: a semiconductor laser including an active region for providing gain and a distributed Bragg reflection (DBR) region Eor controlling an oscillation wavelength; a wavelength converting device made of non-linear optical crystal; and an electronic cooling device, the apparatus comprising a control section which varies a DBR current to be input to the DBR region to set an oscillation wavelength of an output light of the semiconductor laser in the vicinity of a phase-matching wavelength of the wavelength converting device, and then allows a temperature of the short wavelength light source to vary by the electronic cooling element, thereby fixing the oscillation wavelength of the semiconductor laser at the phase-matching wavelength of the wavelength converting device.

In one embodiment, in an initial setting process, the control section sets the temperature of the semiconductor laser in the vicinity of an ambient temperature.

According to still another aspect of the present invention, provided is a harmonic output stabilizing apparatus for a light source, wherein the light source is a short wavelength light source including: a semiconductor laser including an active region for providing gain and a distributed Bragg reflection (DBR) region for controlling an oscillation wavelength; a wavelength converting device made of a non-linear optical crystal; and an electronic cooling element. The apparatus includes a control section which allows a temperature of the short wavelength light source to vary by the electronic cooling element to vary the oscillation wavelength of the semiconductor laser toward a phase-matching wavelength of the wavelength converting device, and further causes a DBR current to be input to the DBR region to be varied, thereby compensating for a phase change of the semiconductor laser.

In one embodiment, the control section further adjusts a current to be input to the active region in response to a change in an output of the semiconductor laser.

According to still another aspect of the present invention, provided is a harmonic output stabilizing apparatus for a light source, wherein the light source is a short wavelength light source including: a semiconductor laser including an active region for providing gain, a distributed Bragg reflection (DBR) region for controlling an oscillation wavelength, a phase control region and a temperature sensor; and a wavelength converting device made of a non-linear optical crystal. The apparatus includes: a first control circuit for adjusting a current to be input to the active region so as to maintain a uniform output of the semiconductor laser; a second control circuit for adjusting a DBR current to be input to the DBR region so as to set the oscillation wavelength of the semiconductor laser at a phase-matching wavelength of the wavelength converting device; and a third control circuit for adjusting a current to be input to the phase control region so as to compensate for a phase change detected by the first control circuit, the second control circuit, and the temperature sensor.

According to still another aspect of the present invention, provided is a harmonic output stabilizing apparatus for a light source, wherein the light source is a short wavelength light source including: a semiconductor laser including an active region for providing gain, a distributed Bragg reflection (DBR) region for controlling an oscillation wavelength and a phase control region; and a wavelength converting device made of a nonlinear optical crystal. The apparatus includes a control section which allows a DBR current to be input to the DBR region to vary in an initial setting process so as to set the oscillation wavelength of the semiconductor laser in the vicinity of a phase-matching wavelength of the wavelength converting device, and then varies both a current to be input to the phase control region and the DBR current, thereby fixing the oscillation wavelength of the semiconductor laser at the phase-matching wavelength of the wavelength converting device.

In one embodiment, the wavelength converting device is a quasi-phase-matching type wavelength converting device having a periodic domain inverted structure. In another embodiment, the wavelength converting device an optical waveguide type wavelength converting device. The wavelength converting device may be a bulk type wavelength converting device.

The non-linear optical crystal may include $LiTa_xNb_{1-x}O_3$ ($0 \leq x \leq 1$).

According to still another aspect of the present Invention, an optical disk system includes a short wavelength light source including: a semiconductor laser including an active region for providing gain and a distributed Bragg reflection (DBR) region for controlling an oscillation wavelength; and a wavelength converting device made of a non-linear optical crystal which is integrated with the semiconductor laser. An output light from the short wavelength light source scans an optical disk to conduct at least one of a recording operation and a reproducing operation for a signal. The optical disk system further includes a control section for re-controlling the oscillation wavelength of the semiconductor laser at a phase-matching wavelength of the wavelength converting device during a predetermined period in a system operation.

In one embodiment, the predetermined period is a standby period of the system.

In another embodiment, the predetermined period is at least one of a transition period from the reproducing operation to the recording operation and a seek period at a transition from the recording operation to the reproducing operation.

In still another embodiment, a memory is further provided or storing a reproduced signal, wherein during the predetermined period, a harmonic output of the short wavelength light source is varied and the signal stored in the memory is used.

In still another aspect of the present invention, a memory is further provided for storing a reproduced signal, wherein during the predetermined period, the memory is full with the stored signal with a signal-storing rate being larger than a signal-readout rate, and the signal stored in the memory is used.

In still another embodiment, a system may further include an electronic cooling element integrated with the short wavelength light source, wherein the control section re-adjusts a temperature of the short wavelength light source in the Vicinity of an ambient temperature using the electronic cooling element, and varies a DBR current to be input to the DBR region, thereby re-adjusting the oscillation wavelength of the semiconductor laser at the phase-matching wavelength of the wavelength converting device.

In still another aspect of the present invention, the semiconductor laser further includes a phase control region, and the control section resets a current to be input to the phase control section, and varies both the current to be input to the phase control region and a current to be input to the DBR region, thereby re-adjusting the oscillation wavelength of the semiconductor laser at the phase-matching wavelength of the wavelength converting device.

In one embodiment, the wavelength converting device is a quasi-phase-matching type wavelength converting device having a periodic domain inverted structure. In another embodiment, the wavelength converting device is an optical waveguide type wavelength converting device. In still another embodiment, the wavelength converting device is a bulk type wavelength converting device.

The non-linear optical crystal may include $LiTa_xNb_{1-x}O_3$ ($0 \leq x \leq 1$).

Thus, the invention described herein makes possible the advantages of (1) providing a small light generator including a semiconductor laser and a waveguide type optical functional device where alignment adjustment for obtaining optical adjustment therebetween can be easily performed, (2) providing the method for producing the same, (3) providing an oscillation wavelength stabilizer for a semiconductor laser having a DBR region capable of performing stable oscillation wavelength control, (4) providing a harmonic output stabilizer capable of providing stable short-wavelength light is output, and (5) providing an optical disk system including such a harmonic output stabilizer.

These and other advantages of the present invention will become apparent to those skilled in the art upon reading and understanding the following detailed description with reference to the accompanying figures.

BRIEF DESCRIPTION OF THE DRAWINGS

FIGS. 10A to 10D illustrate the method of Example 8 in detail.

DESCRIPTION OF THE PREFERRED EMBODIMENTS

Figure 1A:
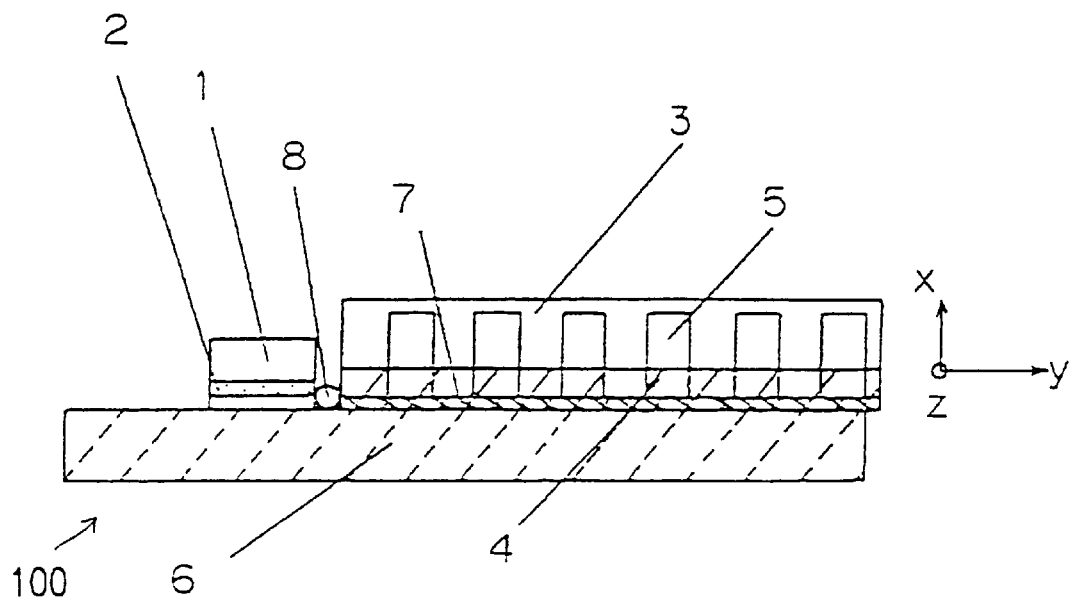
FIGS. 1A and 1B are views schematically showing a light generator of Example 1 according to the present invention.

With reference to the drawings attached hereto, various embodiments of the present invention will be described below. In the drawings, like components are designated with like reference numerals, and the similar description concerning the similar components is omitted.

EXAMPLE 1

Figure 1B:
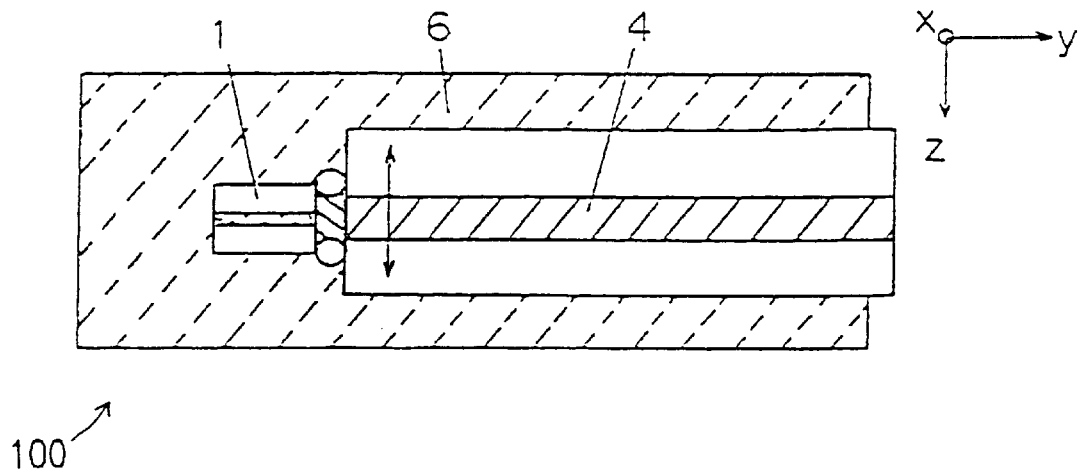

Referring to FIGS. 1A and 1B, a light generator 100 of Example 1 according to the present invention will be described.

In the light generator 100 of this example, a semiconductor laser chip 1 and a substrate (optical functional device) 3 having a waveguide 4 formed thereon are fixed on a submount 6. A plurality of balls 8 are inserted between the semiconductor laser chip 1 and the substrate 3. An x-cut LiTaO$_3$ crystal substrate is used as the substrate. The waveguide 4 is formed on the x-cut LiTaO$_3$ crystal substrate by proton exchange, a type of ion exchange, and a periodic domain inverted structure 5 is formed perpendicular to the waveguide 4 by application of an electric field. Thus, the substrate with the waveguide and the periodic domain inverted structure formed thereon functions as an SHG device 3 halving the wavelength of semiconductor laser light.

FIGS. 1A and 1B are a side view and a plan view, respectively, of the light generator 100. Referring to FIGS. 1A and 1B, the light generator 100 of Example 1 includes an AlGaAs semiconductor laser chip 1 with a wavelength of 850 nm, a waveguide type SHG device 3, and a submount 6 made of Si.

The semiconductor laser chip 1 oscillates at the TE mode, so that the polarized direction of the laser light is parallel to a surface of the substrate or an active layer 2. A waveguide 4 of the waveguide type SHG device 3 formed by proton exchange has a refractive index distribution in the z direction of the substrate, allowing light polarized in the direction parallel to the substrate to propagate therethrough (x, y, and z directions in FIGS. 1A and 1B represent crystal axes). As a result, the semiconductor laser chip 1 and the waveguide type SHG device 3 can be optically coupled in the same plane of the Si submount 6.

The semiconductor laser chip 1 is bonded to the portion of the St submount 6 via Au which is deposited by soldering with the side of an active layer 2 of the semiconductor laser chip 1 facing the Si submount 6 (in a junction-down direction). The height of the active layer 2 of the semiconductor laser chip 1 is about 5 μm from the surface of the Si submount 6. The waveguide type SHG device 3 includes the waveguide 4 and domain inverted regions 5 formed with a period of about 3.8 μm. A protection layer 7 having a thickness of about 5 μm made of SiO$_2$ is formed on the waveguide 4 so that the waveguide 4 is at the same height level as the active layer 2 of the semiconductor laser chip 1 when fixed on the Si submount 6.

Balls 8, insarted between the semiconductor laser chap 1 and the SHG device 3, are made of SiO$_2$ glass having a diameter of about 4 μm. In this example, glass balls which are typically used for defining the space for liquid crystal formed between two substrates in a liquid crystal display are used.

The distance between the semiconductor laser chip 1 and the waveguide type SHG device 3 is thus kept fixed with the insertion of the balls 8. This allows light emitted from the semiconductor laser chip 1 (hereinafter, also simply referred to as the "semiconductor laser light") to be coupled to the waveguide 4 only by uniaxial adjustment in the direction shown by the arrow in FIG. 1B. Practically, 70 MW light can be coupled to the waveguide 4 for 100 mW output of the semiconductor laser chip 1.

The waveguide type SHG device 3 is fixed on the Si submount 6 with ultraviolet-curable resin with the side of the waveguide 4 facing the Si submount 6. In this example, a wavelength-tunable DBR (distributed Bragg-reflector) semiconductor laser was used as the semiconductor laser chip 1. The wavelength of the semiconductor laser light is adjusted to a phase-matching wavelength of the waveguide type SHG device 3. As a result, a blue light of about 1 mW can be obtained from the emergent end face of the waveguide 4.

With the above module structure of this example, the volume can be 1 cc or less, smaller than that of the conventional lens-coupling type module. Since the distance between the semiconductor laser chip 1 and the SHG device 3 is automatically determined by the insertion of the balls 8, semiconductor laser light can be coupled to the waveguide 4 by uniaxial alignment adjustment, reducing the time required for the optical coupling adjustment. Typically, it takes about five minutes to assemble the conventional lens-coupling type module and about one minute to assemble the conventional direct-coupling type module requiring three axial alignment adjustments. In this example, however, it takes only about 30 seconds to assemble the module. Moreover, with the balls 8 inserted between the semiconductor laser chip 1 and the waveguide type SHG device 3, the optical coupling adjustment can be performed without damaging the end faces of the active layer 2 and the waveguide 4.

In this example, the distance between the semiconductor laser chip 1 and the waveguide SHG device 3 can be adjusted using the balls 8. The same effect can also be obtained by inserting a cylindrical member such as a single-mode fiber.

The x-cut LiTaO$_3$ crystal substrate is used for forming the SHG device 3 in this example. The same effect can also be obtained by using an x-cut LiNbO$_3$ crystal substrate or an x-cut KTiOPO$_4$ crystal substrate.

EXAMPLE 2

Figure 2A:
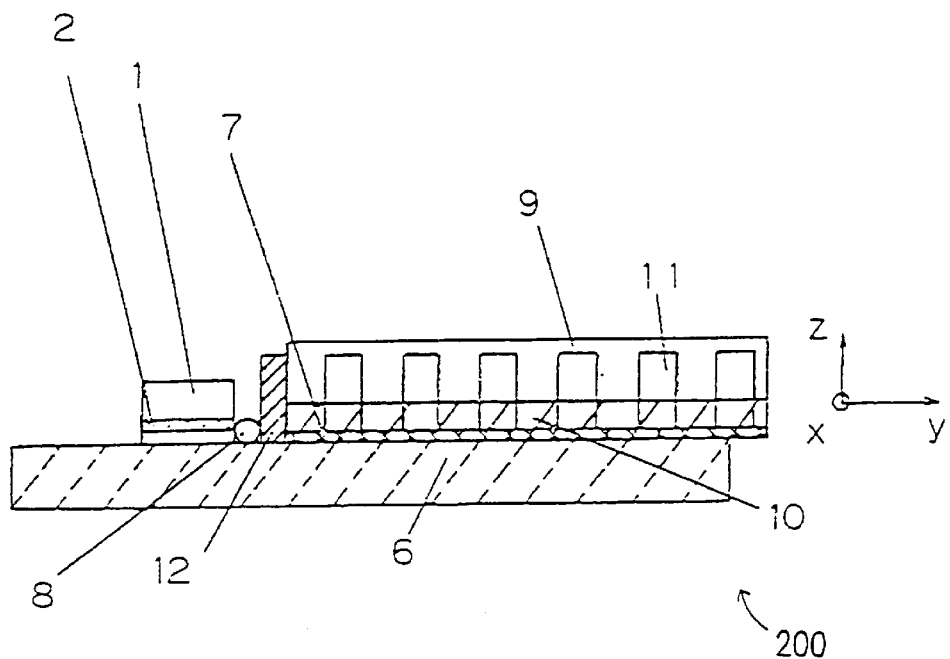
FIGS. 2A and 2B are views schematically showing a light generator of Example 2 according to the present invention.
Figure 2B:
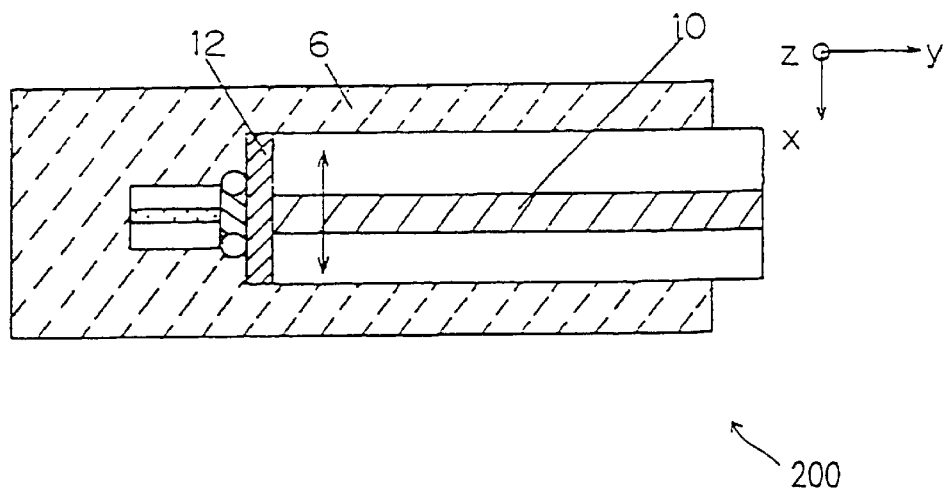

FIGS. 2A and 2B are a side view and a plan view, respectively, of a light generator 200 of this example.

In Example 1, the X-cut LiTaO$_3$ crystal substrate is used for the waveguide type SHG device 3. In reality, a device with a higher conversion efficiency can be obtained by using a z-cut LiTaO$_3$ crystal substrate. In a light generator 200 of Example 2 illustrated in FIGS. 2A and 2B, therefore, a z-cut LiTaO$_3$ crystal substrate is used. More specifically, as illustrated in FIGS. 2A and 2B, a half-wave film 12 is formed on the incident end face of a waveguide 10 of a waveguide type SHG device 9, where a z-cut LiTaO$_3$ crystal substrate is used, to adjust the wavelength while being mounted on the same plane of a submount 6 made of Si.

The half-wave film 12 is formed by obliquely depositing Ta$_2$C$_5$ using an EB apparatus. The coupling efficiency in this example is lowered to about 60% as compared with the case where no half-wave film is provided, since the distance between a semiconductor laser chip 1 and the waveguide type SHG device 9 becomes longer by the thickness of the half-wave film 12. However, with an increased conversion efficiency of the SHG device 9, a blue light of about 3 mW is obtained.

The same effect can also be obtained by using a z-cut LiNbO$_3$ crystal substrate or a z-cut KTiOPO$_4$ crystal substrate.

EXAMPLE 3

Figure 3A:
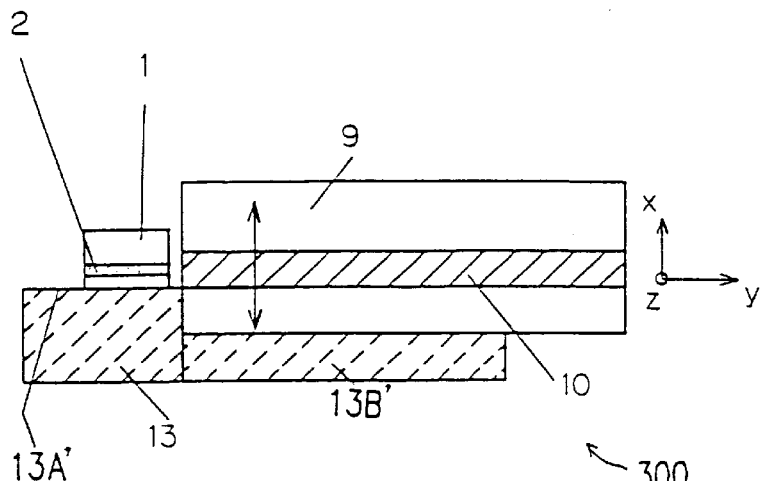
FIGS. 3A to 3C are views schematically showing a light generator of Example 3 according to the present invention.
Figure 3B:
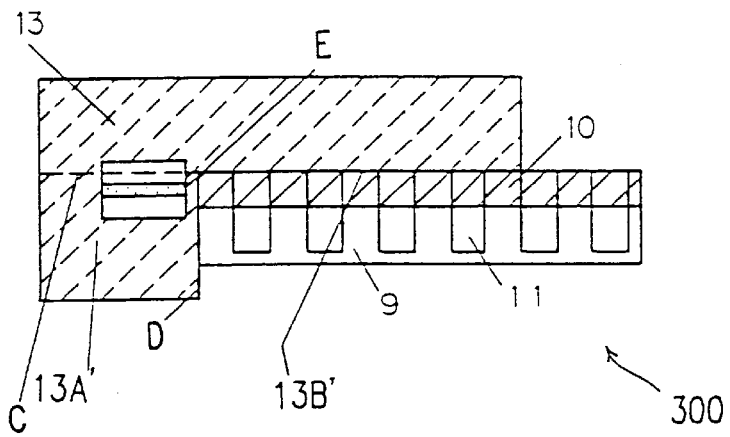
Figure 3C:
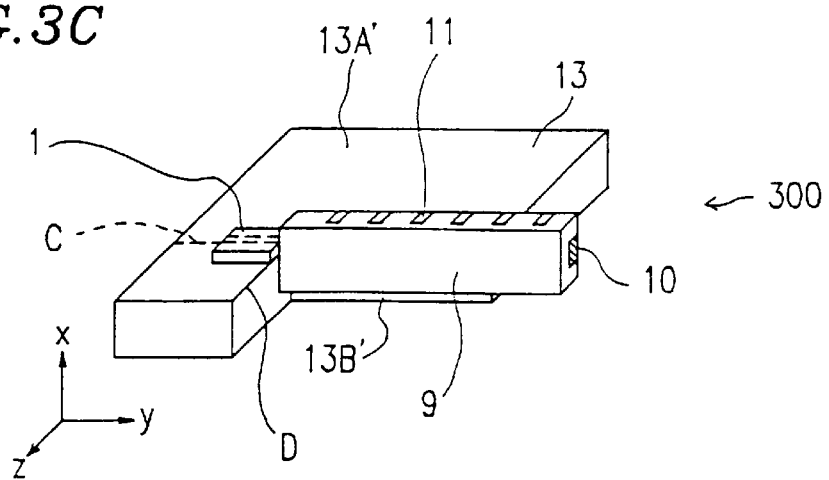

FIGS. 3A to 3C illustrate a side view, a plan view and a perspective view of a light generator 300 of Example 3 according to the present invention, which will be described. In the light generator 300 of this example, a semiconductor laser chip 1 and a substrate (an optical functional device) 9 having a waveguide 10 formed thereon are fixed on different surfaces of a submount 13 which are perpendicular to each other.

In this example, as in Example 2, a waveguide type SHG device 9 including a z-cut LiTaO$_3$ crystal substrate is used. On this substrate, a waveguide 10 is formed by proton exchange and a periodic domain inverted structure 11 is formed perpendicular to the waveguide 10 by application of an electric field. Thus, the SHG device 9 in this example has a function of halving the wavelength of semiconductor laser light.

Referring to FIG. 3A, the light generator 300 of this example includes an AlGaAs semiconductor laser chip 1 with an output of 100 mV and a wavelength of 850 nm, a waveguide type SHG device 9, and an L-shaped submount 13 made of Si. The semiconductor laser chip 1 is fixed on a first surface 13A' (also referred to as the surface A) of the Si submount 13, while the waveguide type SHG device 9 is fixed on a second surface 13B' (also referred to as the surface B) thereof.

The assembly of this module will be described in detail.

The L-shaped Si submount 13 is produced by cutting an Si substrate (about 5 mm thick) so that the first and second surfaces 13A' and 13B' are perpendicular to each other. A thin Au film is formed on the first surface 13A' of the Si submount 13. An Au/Sn solder layer is deposited on the portion of the first surface 13A' where the semiconductor laser chip 1 is to be bonded.

As shown in FIG. 3B, the semiconductor laser chip 1 is fixed so that the light emitting region of an active layer 2 of the semiconductor chip 1 is located at the position apart by about 1 μm from a reference line C (included in the second surface 13B') of the first surface 13A' of the Si submount 13. A light emitting point E is apart from a reference line D by about 1 μm In this example, the light emitting point E is identified by operating the semiconductor laser chip 1 with pulse driving, to adjust and fix the semiconductor laser chip 1 at a predetermined position. If a semiconductor laser chip 1 which is not fixed on a submount is operated with direct-current driving, it will deteriorate in a short period since heat to be generated is not fully radiated. However, when the semiconductor laser chip 1 is operated with pulse driving as in this example, the positioning of the semiconductor laser chip 1 is possible while operating the semiconductor laser chip 1 to emit light.

Thereafter, the waveguide type SHG device 9 is adjusted and fixed on the second surface 13B' of the Si submount 13. More specifically, alignment of the waveguide type SHG device 9 is uniaxially adjusted in the direction shown by the arrow in FIG. 3A on the second surface 13B' under the state where the incident end face of the waveguide type SHG device 9 abuts against the reference line D.

Since the semiconductor laser chip 1 oscillates at the TE mode, the polarized direction of the laser light is parallel to the first surface 13A'. On the other hand, a waveguide 10 of the waveguide type SHG device 9 formed on the z-cut LiTaO$_3$ crystal substrate by proton exchange, which has a refraction index distribution in the z direction, allows light polarized in the direction perpendicular to the substrate (TM mode) to propagate therethrough. In this example, since the semiconductor laser chip 1 and the waveguide type SMG device 9 are fixed on different surfaces of the Si submount 13 which are perpendicular to each other, semiconductor laser light can be coupled to the waveguide 10 without the aid of a half-wave plate.

Moreover, the light emitting point E of the semiconductor laser chip 1 is fixed at a position higher than the second surface 13B' by about 1 μm and the distance between the semiconductor laser chip 1 and the waveguide type SHG device 9 is set at about 1 μm. Accordingly, semiconductor laser light can be coupled to the waveguide 10 by the uniaxial alignment adjustment in the direction shown by the arrow in FIG. 3A. Thus, a coupling efficiency of about 60% can typically be obtained.

The waveguide type SHG device 9 is fixed on the submount 13 with ultraviolet-curable resin. In this example, also, a DBR semiconductor laser is used as the semiconductor laser chip 1. The wavelength of the semiconductor laser light is matched with the phase-matching wavelength of the waveguide type SHG device 9. As a result, a blue light of about 3 mW can be stably obtained.

With the above module structure of this example, the volume can be 1 cc or less, much smaller than that of the conventional lens-coupling type module. Since the waveguide type SHG device using the z-cut LiTaO$_3$ crystal substrate can be used without providing a half-wave plate, a highly-efficient SHG blue laser can be obtained. Since semiconductor laser light can be coupled to the waveguide with uniaxial alignment adjustment, the optical coupling adjustment is easy. Actually, it typically takes only about 30 seconds to assemble and adjust the module.

One of the most advantageous points of this example is that the control of the thicknesses of a solder (Au/Sn) layer and the thin Au film deposited on the submount is not required for alignment of the optical axes. The alignment of the optical axes can be conducted only with the positional adjustment of the waveguide type SHG device 9. In general, it is difficult to adjust the thickness of a solder layer used for the bonding of a semiconductor laser chip 1, and thus to control the height of the active layer 2 of the semiconductor laser chip 1. In this example, the waveguide type SHG device is adjusted in the direction of the height of the semiconductor laser chip (i.e., in a direction x in FIG. 3C). Accordingly, the alignment adjustment for the optical coupling can be performed without the necessity of controlling the thickness of the solder layer.

Another advantageous point of this example is that the margin regarding the alignment adjustment for the optical coupling (i.e., the amount of displacement where a half of the maximum coupling efficiency can be obtained) is larger than those in Examples 1 and 2. In the conventional lens-coupling type light generator, the adjustment margin in the most strict direction, i.e., the direction vertical to the substrate is approximately ±0.6 μm. The adjustment margin is increased to about 2 μm in this example since the substrate of the semiconductor laser chip and the ferroelectric crystal substrate in the SHG device 9 are adjusted with each other while they are disposed on the different surfaces perpendicular to each other.

The light emitting point is identified by pulse-driving the semiconductor laser chip 1. This allows the semiconductor laser chip 1 to oscillate without being heated. Thus, the semiconductor laser chip 1 can be fixed on a predetermined position on the submount without being deteriorated.

The z-cut LiTaO$_3$ crystal substrate is used in this example. The same effect can also be obtained by using a z-cut LiNbO$_3$ crystal substrate or a z-cut KTiOPO$_4$ crystal substrate.

EXAMPLE 4

In the light generator 300 of Example 3, the semiconductor laser chip and the waveguide type SHG device are fixed on different surfaces of the L-shaped Si submount formed by cutting. In Example 4, a light generator 400 using an L-shaped Si submount formed by bonding two Si subnounts together will be described.

Figure 4A:
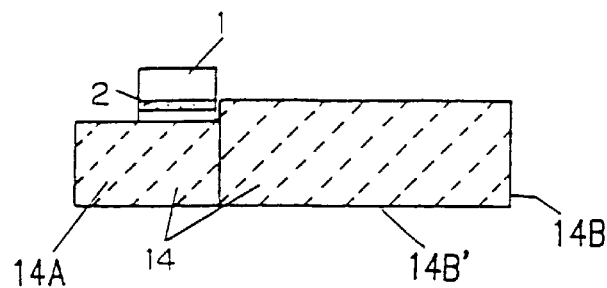
FIGS. 4A to 4D are views schematically showing a light generator of Example 4 according to the present invention.

Referring to FIGS. 4A to 4D, an L-shaped Si submount 14 includes a first portion 14A (also referred to as the portion A) and a second portion 14B (also referred to as the portion B) bonded together so that a step is formed at the interface of the portions 14A and 14B. The light generator 400 of this example is different from the light generator 300 of Example 3 in that a semiconductor laser chip 1 is fixed on the first portion 14A with a predetermined distance from a reference line D by abutting the semiconductor laser chip 1 against the step at the interface of the portions 14A and 14B, as shown in FIG. 4A. Thus, in order to fix the semiconductor laser chip 1 at a predetermined position, only uniaxial alignment adjustment is required where the light emitting region of an active layer 2 of the semiconductor laser chip 1 is adjusted to a position apart from a reference line C by 1 μm, which corresponds to an extended line of a second surface 14B' (also referred to as the surface B), on a first surface 14A' (also referred to as the surface A) of the Si submount 14.

Figure 4B:
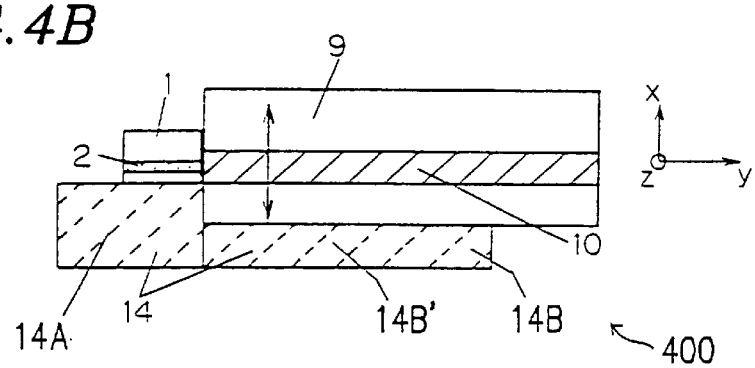
Figure 4C:
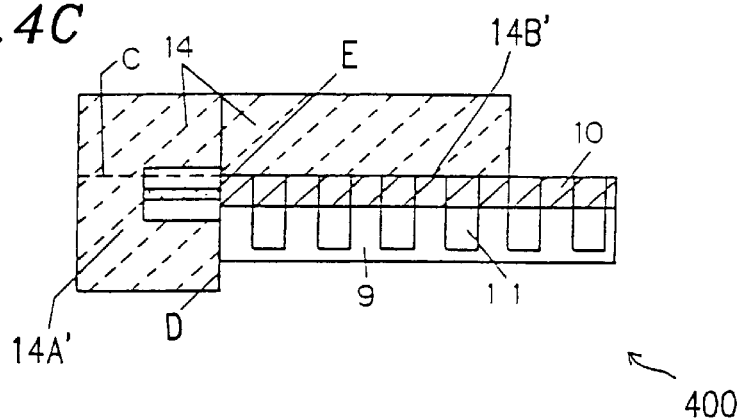
Figure 4D:
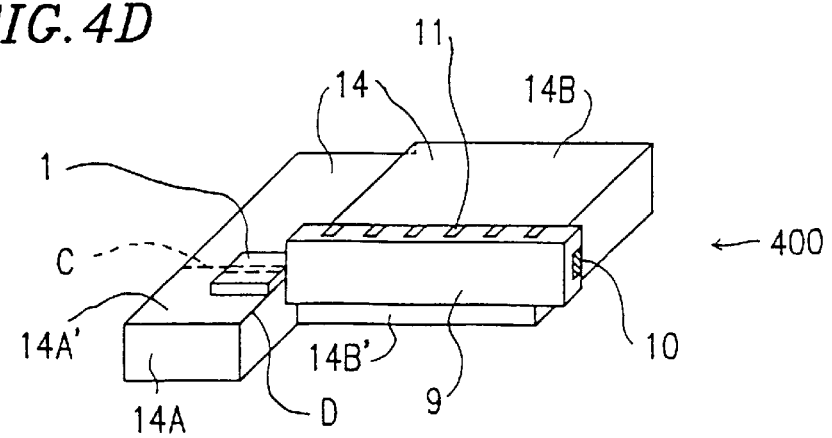

FIGS. 4B, 4C, and 4D are a side view, a plan view and a perspective view of the light generator 400, respectively. As in Example 3, the semiconductor laser chip 1 is fixed on the Si submount 14 with an Au/Sn soldering. As in Example 3, a position of the waveguide type SHG device 9 is adjusted on the second surface 14B'. A z-cut LiTaO$_3$ crystal substrate is used for the waveguide type SHG device 9.

With the smaller distance between the semiconductor laser chip 1 and the waveguide type SHG device 9, the coupling efficiency in this example is as high as about 70%. The waveguide type SHG device 9 is fixed on the submount 14 with ultraviolet-curable resin. As a result, a blue light of about 4 mW can be obtained for about 100 mW output of the semiconductor laser chip 1.

In Example 3, It is difficult to obtain rightangle corners of the L-shaped Si submount 13. In this example, however, right-angle corners can be easily obtained since two Si submounts (the first and second portions 14A and 14B) are bonded together to form the submount 14. One advantage of this example is that, with the step formed at the interface between the portions 14A and 14B, the distance between the semiconductor laser chip 1 and the waveguide type SHG device 9 can be automatically adjusted, allowing light from the semiconductor laser chip 1 to be coupled to the waveguide 10 with simple uniaxial alignment adjustment. Since the fixation of the semiconductor laser chip 1 is easier than in Example 3, it typically takes only about 20 seconds to assemble and adjust the module of this example.

In this example, also, a small SHG blue laser with a module volume of 1 cc or less is realized. Using the z-cut LiTaO$_3$ crystal substrate for the waveguide SHG device 9, blue light is obtained with high efficiency. As in Example 3, the control of the thicknesses of the Au/Sn soldering and the Au thin film deposited on the submount 14 is not required, and only the positional adjustment of the waveguide type SHG device 9 is performed for the optical coupling adjustment.

The z-cut LiTaO$_3$ crystal substrate is used in this example. The same effect can also be obtained by using a z-cut LiNbO$_3$ crystal substrate or a z-cut KTiOPO$_4$ crystal substrata.

EXAMPLE 5

In consideration of the heat radiation of a semiconductor laser chip, a submount is preferably made of a material having a high thermal conduction. The submount is also desirably made of a material with good processability in consideration that not only the semiconductor laser chip but also an optical functional device are mounted on the submount. On the other hand, the heat radiation of the semiconductor laser chip should not be conducted to a ferroelectric crystal substrate on which a waveguide is formed. For example, in the case of the SHG device, the temperature of the SHG device is made non-uniform by receiving the heat produced by the semiconductor laser, thereby deteriorating the conversion efficiency of the SHG device to harmonic light.

Ceramic materials are generally highly processable. A desirable thermal conductivity and linear expansion coefficient can be obtained by selecting an appropriate type of ceramic materials. For example, The thermal conductivities of ceramics of AlN (0.4 cal/cm/sec/°C.) and SiC (0.15 cal/cm/sec/°C.) are as high as or higher than that of Si (0.3 cal/cm/sec/°C.). Conversely, ZrO$_2$ is a material with a low thermal conductivity (0.01 cal/cm/sec/°C.).

The submount made of Si is used in the light generators of Examples 1 to 4. Since ceramics of AlN and SiC have high thermal conduction as described above, they can be used in place of the Si submount in Examples 1 to 4 to obtain the same effect.

In a light generator 500 of Example 5 according to the present invention, different materials are used for a first portion 15A (also referred to as the portion A) of a submount 15 on which a semiconductor laser chip 1 is mounted and a second portion 15B thereof on which a substrate (the optical functional device) 3 with a waveguide 4 formed thereon is mounted. In this example, a waveguide type SHG device 3 having an x-cut LiTaO$_3$ crystal substrate is used.

Figure 5A:
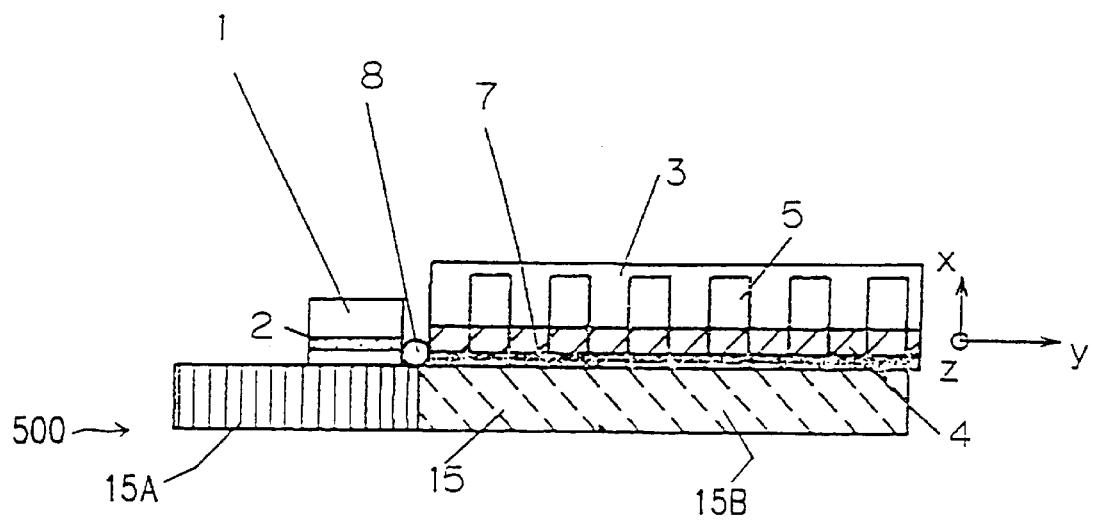
FIGS. 5A and 5B are views schematically showing a light generator of Example 5 according to the present invention.
Figure 5B:
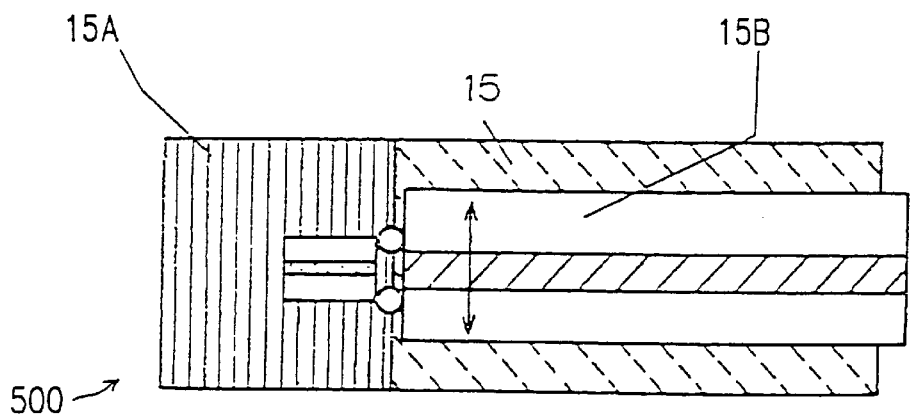

FIGS. 5A and 5B are a side view and a top view of a light generator 500 of this example.

Referring to FIGS. 5A and 5B, a submount 15 is composed of a first portion 15A (also referred to as the portion A) on which a semiconductor laser chip 1 is mounted and a second portion 15B (also referred to as the portion B) on which a waveguide type SHG device 3 is mounted. The first portion 15A is made of an AlN ceramic which has a high thermal conductivity, while the second portion 15B is made of a ZrO$_2$ ceramic which has a low thermal conductivity. The portions 15A and 15B are integrated by bonding to form the submount 15. The surfaces of the submount 15 on which the semiconductor laser chip 1 and the waveguide type SHG device 3 are fixed are mirror-finished.

Figure 6:
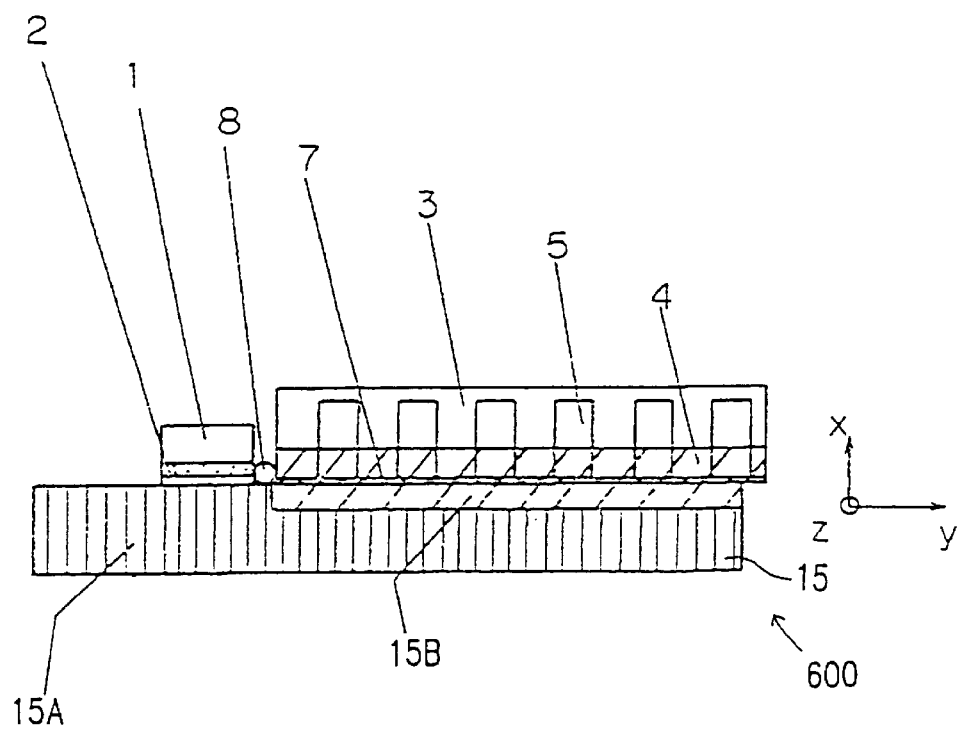
FIG. 6 is a view of another light generator of Example 5 according to the present invention.

Alternatively, the portions 15A and 15B may be Just put together without bonding and then integrated by sintering. In such a case, the structure as a light generator 600 shown in FIG. 6 is advantageous in the aspect of the mechanical strength. In the light generator 600, the first portion 15A of the submount 15 is formed to have a terrace-like portion, and the second portion 15B is mounted on the terrace-like portion.

The semiconductor laser chip 1 and the waveguide type SHG device 3 are fixed in the same plane of the submount 15, as in Example 1, for coupling semiconductor laser light to a waveguide 4. The distance between the semiconductor laser chip 1 and the waveguide type SHG device 3 is kept fixed with balls 8. Thus, semiconductor laser light can be coupled to the waveguide 4 with only uniaxial alignment adjustment in the direction shown by the arrow in FIG. 5B. Typically, light with about 70 mW can be coupled to the waveguide 4 for about 100 mW output of the semiconductor laser chip 1. In this example, as in the previous examples, a wavelength-tunable DBR semiconductor laser is used. The wavelength of the semiconductor laser is matched with the phase-matching wavelength of the waveguide type SHG device 3. As a result, 1.5 mW blue light can be obtained from the emergent end face of the waveguide 4.

When the submount 15 is fixed to a copper stem or the like, the heat from the semiconductor laser chip 1 is transmitted through the highly-conductive AlN ceramic (the first portion 15A) toward the stem. The waveguide type SHG device 3 which is fixed on the $ZrO_2$ ceramic (the second portion 15B) is hardly affected by the heat from the semiconductor laser chip 1. As a result, the heat conduction from the semiconductor laser chip 1 to the waveguide type SHG device 3 can be reduced. Practically, a conversion efficiency 1.5 times as high as that in Example 1 can be obtained.

In this example, the heat conductivity of the first portion 15A was 40 times that of the second portion 15B by using an AlN ceramic for the first portion 15A. The same effect can also be obtained by using an SiC ceramic in place of the AlN ceramic. Using $Al_2O_3$ (thermal conductivity: 0.05 cal/cm/sec/°C.), however, does not exhibit good results. The thermal conductivity of the first portion 15A is therefore preferably 10 or more times that of the second portion 15B.

In this example, ceramic is used in consideration of the processability and the linear expansion coefficient. The same effect can also be obtained by using metal as the high thermally conductive material or glass and the like as the low thermally conductive material.

The x-cut $LiTaO_3$ crystal substrate is used in this example. The same effect can also be obtained by using an x-cut $LiNbC_3$ crystal substrate or an x-cut $KTiOPO_4$ crystal substrate.

EXAMPLE 6

Figure 7A:
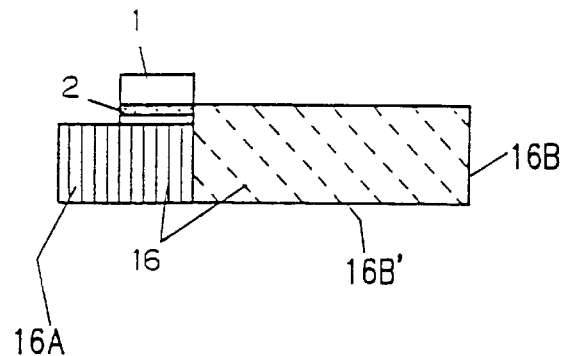
FIGS. 7A to 7D are views schematically showing a light generator of Example 6 according to the present invention.

In a light generator 700 of Example 6 as shown in FIG. 7A, different materials are used for a first portion 16A of an L-shaped submount 16 on which a semiconductor laser chip 1 is mounted and a second portion 16B thereof on which a substrate (an optical functional device) 9 with a waveguide 10 formed thereon is mounted. In this example, a waveguide type SHG device 9 having a z-cut $LiTaO_3$ crystal substrate is used.

Figure 7B:
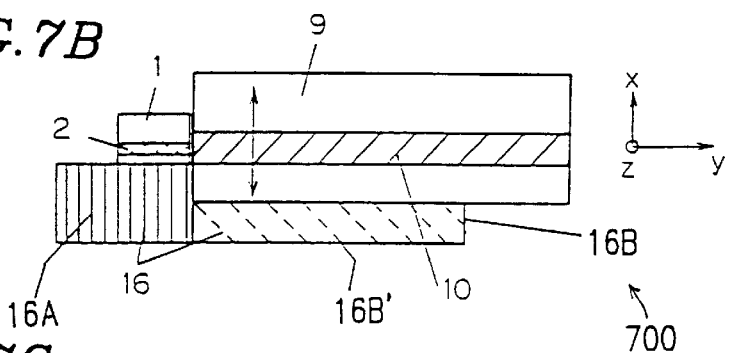
Figure 7C:
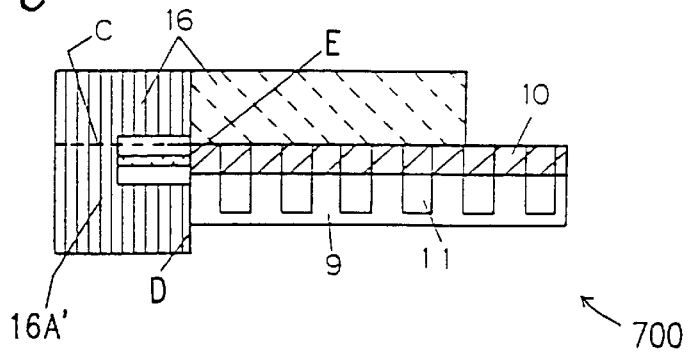
Figure 7D:
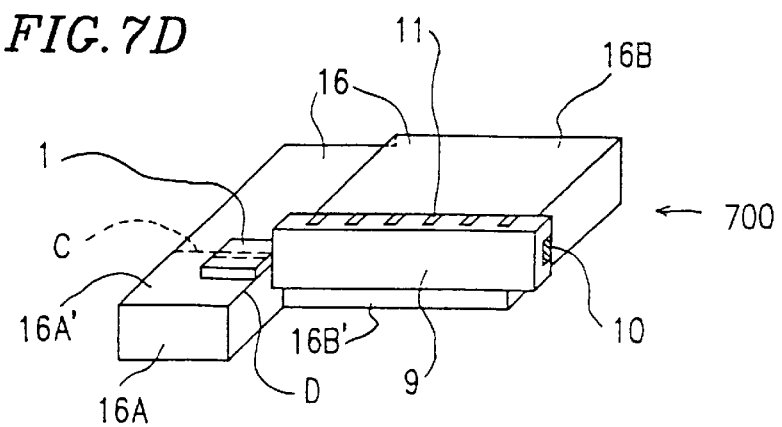

Referring to FIGS. 7B to 7D which are a side view, a plan view and a perspective view, respectively, of the light generator 700 of this example, an L-shaped submount 16 is composed of a first portion 16A (also referred to as the portion A) on which a semiconductor laser chip 1 is mounted and a second portion 16B (also referred to as the portion B) on which a waveguide type SHG device 9 is mounted. The first portion 16A is made of an AlN ceramic which has a high thermal conductivity, while the second portion 16B is made of a $ZrO_2$ ceramic which has a low thermal conductivity. The portions 16A and 16B are integrated by bonding so that a step is formed therebetween, to form the submount 16. The surfaces of the submount 16 on which the semiconductor laser chip 1 and the waveguide type SHG device 9 are formed are mirror-finished.

Alternatively, the portions 16A and 16B may be put together without bonding and then integrated by sintering. In this case, the structure described hereinbefore with reference to FIG. 6 is advantageous in the aspect of its mechanical strength.

The semiconductor laser chip 1 and the waveguide type SHG device 9 are aligned with each other and then fixed as described in Example 4. As a result, a coupling efficiency as high as 70% is typically obtained, and a blue light of about 6 mW can be obtained for about 100 mW output of the semiconductor laser chip 1. in this example, as in Examples 3 and 4, the module volume is 1 cc or less. Since semiconductor laser light can be coupled to the waveguide with simple uniaxial alignment adjustment, a small SHG blue laser can be realized at low cost and the margin for the optical coupling adjustment is increased. Moreover, since the thermal conduction of the heat generated in the semiconductor laser chip 1 to the waveguide type SHG device 9 is reduced, a conversion efficiency 1.5 times as high as that in Examples 3 and 4 is obtained.

The z-cut $LiTaO_3$ crystal substrate is used in this example. The same effect can also be obtained by using a z-cut $LiNbO_3$ crystal substrate or a z-cut $KTiCPO_4$ crystal substrate.

EXAMPLE 7

In Example 7, a light generator 800 where a half-wave plate is interposed between the first portion (portion A) and the second portion (portion B) of the submount in Example 5 will be described.

Figure 8A:
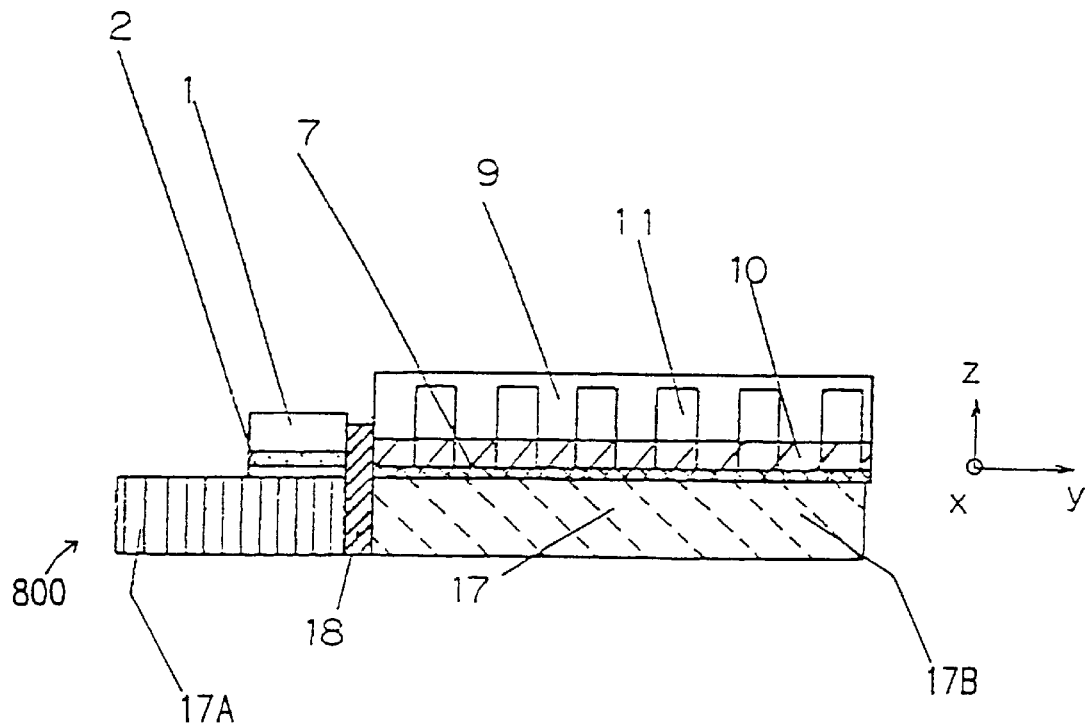
FIGS. 8A and 8B are views schematically showing a light generator of Example 7 according to the present invention.
Figure 8B:
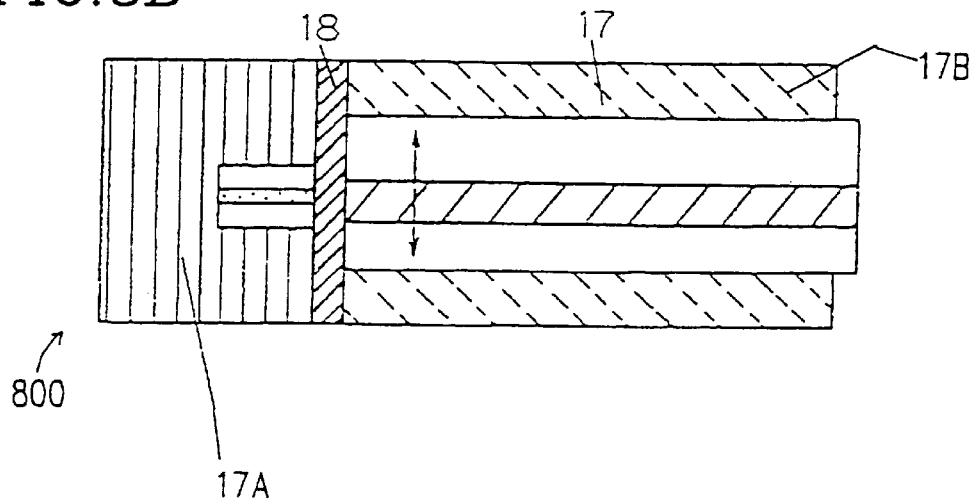

FIGS. 8A and 8B are a side view and a top view of a light generator 800 of this example.

In the light generator 800, a submount 17 is composed of a first portion 17A (also referred to as the portion A) on which a semiconductor laser chip 1 is mounted and a second portion 17B (also referred to as the portion B) on which a waveguide type SHG device 9 is mounted. The first portion 17A is made of an AlN ceramic which has a high thermal conductivity, while the second portion 17B is made of a $ZrO_2$ ceramic which has a low thermal conductivity. A 5.4 $\mu$m thick $LiNbO_3$ crystal thin plate 18 is interposed between the portions 17A and 17B, and are integrated by bonding. The surfaces of the submount 17 on which the semiconductor laser chip 1 and the waveguide type SHG device 9 are formed are mirror-finished. In this example, a z-cut $LiTaO_3$ crystal substrate with the optical waveguide 10 formed thereon is used for the waveguide type SHO device 9.

The semiconductor laser chip 1 and the waveguide type SHG device 9 are mounted in the same plane of the submount 17, as in Example 5, for the coupling of semiconductor laser light to a waveguide 10. The semiconductor laser chip 1 is mounted on the submount 17 with an Au/Sn solder with the emergent end face being in contact with the $LiNbO_3$ crystal thin plate (half-wave plate) 18. A 5 $\mu$m thick $SiO_2$ protection film 7 is formed on the waveguide type SHG device 9 so that an active layer 2 of the semiconductor laser chip 1 and the waveguide 10 of the waveguide type SHG device 9 are on the same height level when they are fixed on the submount 17.

In the light generator 800, the waveguide type SHG device 9 is uniaxially alignment adjusted in the direction shown by the arrow in FIG. 8B under the state where the incident end face thereof abuts against the $LiNbO_3$ crystal thin plate 18, to allow semiconductor laser light to be coupled to the waveguide 10. As a result, light of about 50 mW can be coupled to the waveguide 10 for about 100 mW output of the semiconductor laser, and a blue light of about 1 mW can be obtained from the emergent end face of the waveguide 10.

Since the waveguide type SHG device using the zcut $LiTaO_3$ crystal substrate can be used in this example, a highly efficient SHG blue laser can be realized. Since the distance between the semiconductor laser chip 1 and the waveguide type SEG device 9 is automatically determined by the thickness of the $LiNbO_3$ crystal thin plate 18, only uniaxial alignment is required for realizing the optical coupling adjustment.

The z-cut $LiTaO_3$ crystal substrate is used in this example. The same effect can also be obtained by using a z-cut $LiNbO_3$ crystal substrate or a z-cut $KTiOPO_4$ crystal substrate.

In this example, the $LiNbO_3$ crystal than plate which is a birefringent crystal thin plate is used as the half-wave plate 18. The same effect can also be obtained by using other birefringent crystal such as quartz crystal or $LiTaO_3$ crystal. $LiNbO_3$ crystal is more preferable as the crystal thin plate because, having a larger birefringence, it can be more thin to allow the semiconductor laser chip 1 and the waveguide 10 to be more closer, thus increasing the coupling efficiency. The $LiNbO_3$ crystal also has good processability.

EXAMPLE 8

In the fabrication of the light generators of Examples 1 to 7, it is important to first fix the semiconductor laser chip at a predetermined position on the surmount. In the light generator using the L-shaped submount as in Examples 3, 4, and 6, especially, the semiconductor laser chip needs to be positioned with a precision on the order of submicrons. In Example 1, the semiconductor laser chip 1 is adjusted and fixed while being actually pulse-driven to allow it to emit light and thus to identify the light emitting point. In Example 8, a method for adjusting and fixing the semiconductor laser chip is described where the bottom of the submount is irradiated with light transparent to the submount to obtain a highly precise image of the semiconductor laser chip.

First, referring to FIGS. 9 and 10A to 10D, the method of this example will be described using the light generator 300 of Example 3 shown in FIGS. 3A and 3B. In this method, the light emitting point E of the active layer 2 of the semiconductor laser chip 1 is fixed at a predetermined position (the position apart from the reference line C by 1 μm and from the reference line D by 1 μm) on the surface A of the Si surmount 13.

Figure 9:
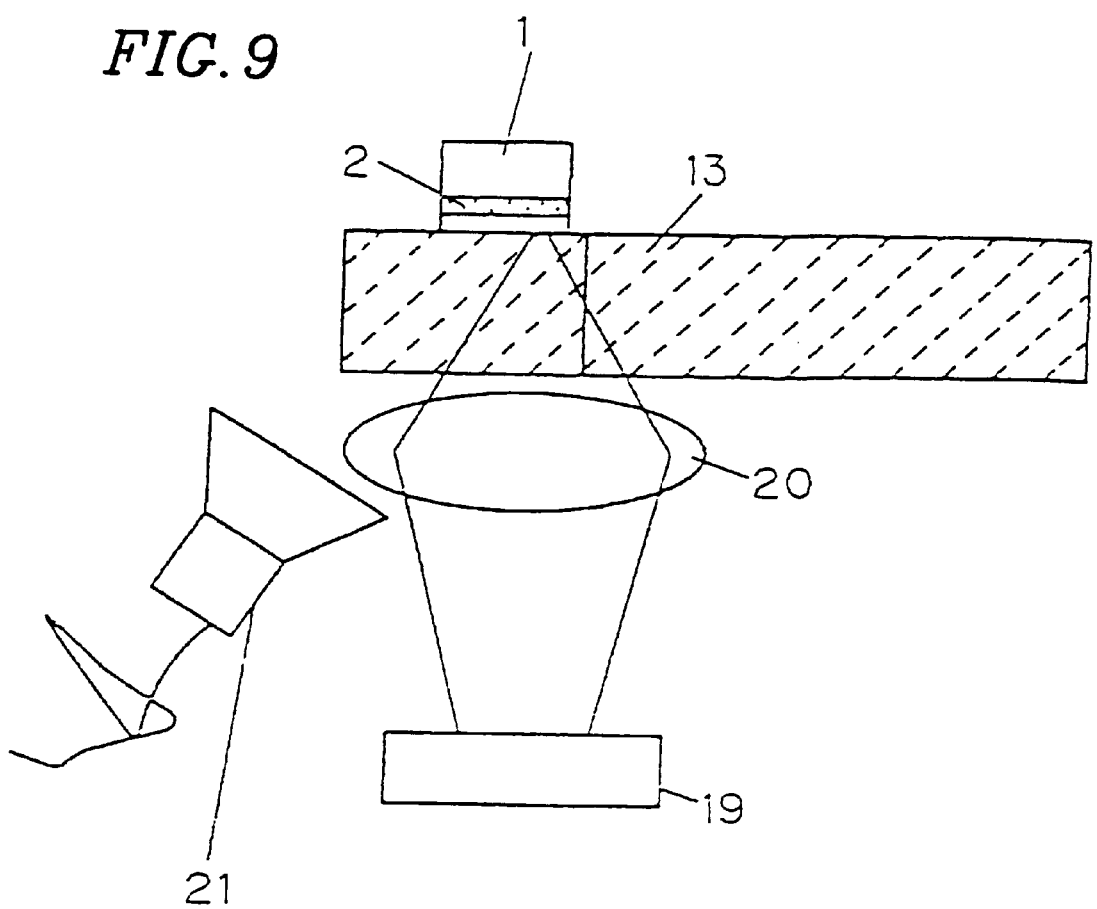
FIG. 9 schematically shows a method for fixing a semiconductor laser chip on a submount of Example 8 according to the present invention.

Referring to FIG. 9, a detector 19, a microscope 20 capable of providing a magnification of ×500, and an infrared light source 21 capable of emitting light transparent to Si are used. Referring to FIGS. 10A to 10D, a marking A having a rectangular shape is provided on a surface of the semiconductor laser chip 1, while a marking B as a combination of four triangles is provided on a surface of the submount 13, both in the form of thin Au films. A thin Au film 22 as an electrode and a solder layer 23 are also formed on the Si submount 13 as shown in FIG. 10B. In FIG. 10C, the marking A is illustrated as overlapping at the center of the marking B. The marking A is illustrated in FIG. 10D.

Light emitted from the infrared light source 21 is incident on the bottom surface of the Si submount 13 and reflected by the markings A and B. The reflected light is magnified with the microscope 20 and focused on the detector 19. In this example, an InP semiconductor laser, operated in a 1.3 μm wavelength band, is used as the infrared light source 21. The position of the semiconductor laser chip 1 is adjusted so that the intensity distribution of the reflected light on the detector 19 is point-symmetrical, i.e., each marking A is positioned in the center of the corresponding marking B composed of four marks in the x and y directions as shown in FIG. 10C. Once the semiconductor laser chip 1 is correctly positioned, the submount 13 is heated to melt the solder 23 and thus to fix the semiconductor laser chip 1 at the predetermined position.

Figure 11A:
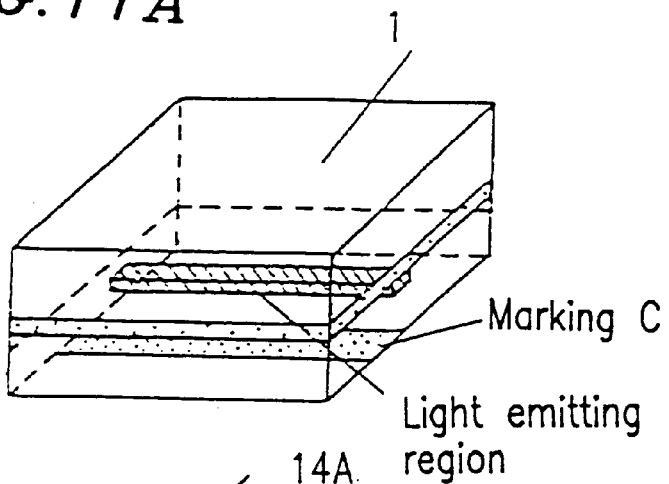
FIGS. 11A and 11B illustrate another method of Example 8 according to the present invention.

Then, referring to FIGS. 11A and 11B, a method for uniaxially adjusting the position of the semiconductor laser chip 1 will be described using the light generator of Example 4 or 6.

Figure 11B:
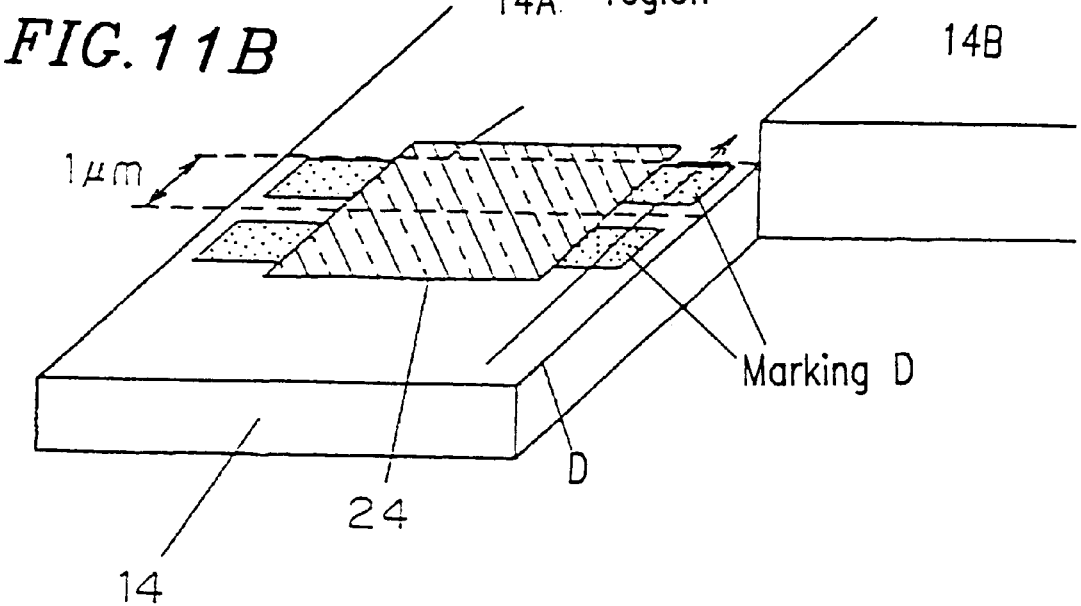

The submount 14 shown in FIG. 11B has a step at the interface of the portions 14A and 14B as described in Example 4. The emergent end face of the semiconductor laser chip 1 can be positioned along the reference line D by abutting it against this step. A line-shaped marking C is formed right above the light emitting region of the semiconductor laser chip 1, while markings D and a solder layer 24 are formed on the Si submount 14.

The semiconductor laser chip 1 is then oriented upside down, and, while being moved in the direction shown by the arrow in FIG. 11B, positioned so that the marking C is located between the markings D. Light emitted from the infrared light source 21 is incident on the bottom surface of the Si submount 13 as shown in FIG. 9. Light passing through the Si submount 13 is reflected by the markings C and D. The reflected light is magnified with the microscope 20 and focused on the detector 19. When the marking C is located between the markings D, the light intensity reflected from the three markings becomes maximum. Once the semiconductor laser chip 1 is correctly positioned, the Si submount 13 is heated to melt the solder 24 and thus fix the semiconductor laser chip 1 at the predetermined position.

If the top surface of the semiconductor laser chip 1 is irradiated with light to recognize the markings, it is difficult to correct the aberration of the lens of the microscope 20 since the semiconductor laser chip 1 is of a multilayer structure. If the Au electrode is formed on the top surface of the semiconductor laser chip 1, the identification of the markings is difficult since the Au film does not transmit infrared Light In this example, since the lens of the microscope 20 is designed taking the thickness of the Si submount into consideration, the reflected light can be focused on the detector 19 without aberration. Thus, highly precise positional adjustment can be realized by irradiating the bottom surface or the Si submount with light and recognizing the markings A to D from the bottom surface of the submount.

EXAMPLE 9

In Example 8, the formation of the markings A or the marking C on the semiconductor laser chip 1 is required to identify the light emitting region of the semiconductor laser chip 1. In Example 9, a method for detecting the light emitting region without the use of a marking on the semiconductor laser chip 1 will be described.

Figure 12:
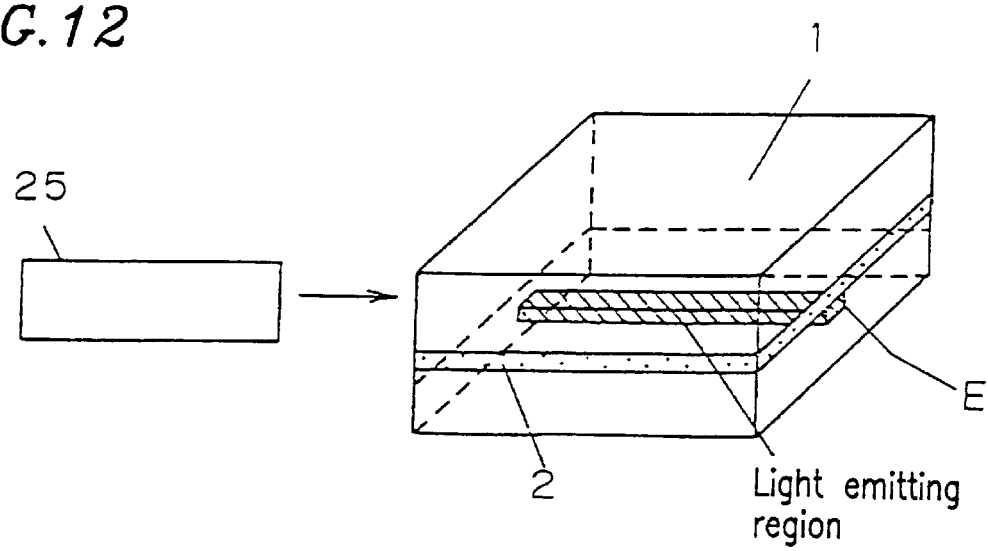
FIG. 12 illustrates still another method for fixing a semiconductor laser chip on a submount according to the present invention.

Referring to FIG. 12, the semiconductor laser chip 1 is irradiated with light emitted from a pigment pulse laser 25 with a wavelength of 650 nm. With this irradiation, electrons in the active layer 2 are excited to cause laser oscillation, which then causes the light emitting point E to emit light. Thus, the light emitting point E is identified while the alignment adjustment is conducted.

Figure 13:
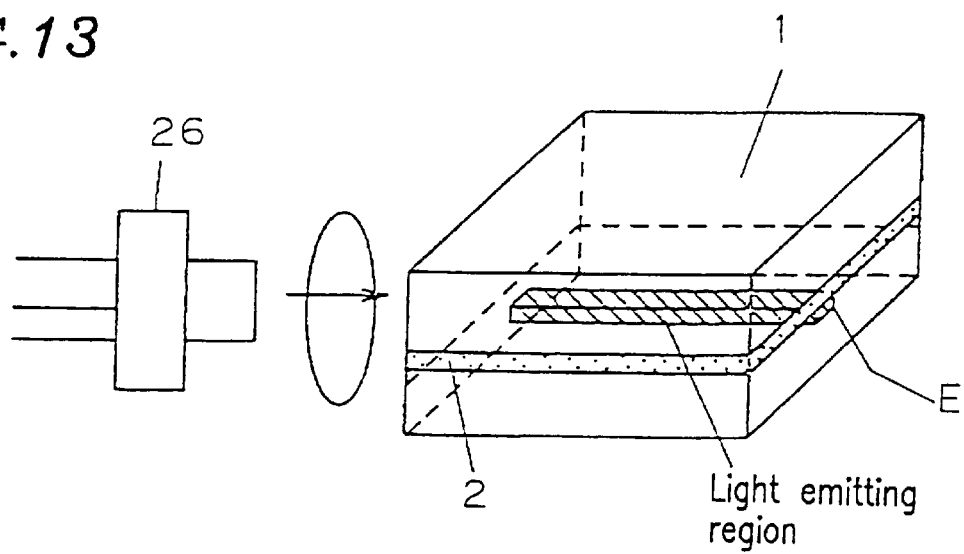
FIG. 13 illustrates still another method for fixing a semiconductor laser chip on a submount according to the present invention.

Alternatively, referring to FIG. 13, light emitted from an AlGaAs semiconductor laser 26 with a wavelength of a 850 nm band is focused on the rear end face of the semiconductor laser chip 1. The light then propagates through the light emitting region (the active layer 2) of the semiconductor laser chip 1, allowing electrons in the active layer 2 to be excited and the light emitting point E to emit light. Thus, the light emitting point E is identified.

In the methods of this example, the light emitting point E can be identified without applying current to the semiconductor laser chip 1 or providing markings on the semiconductor laser chip 1. The semiconductor laser chip 1 can therefore be adjusted and fixed in a period as short as about 20 seconds and easily assembled,

EXAMPLE 10

Referring to FIGS. 14A to 14E, a light generator of Example 10 according to the present invention will be described. In the light generator of this example, the surface of a substrate on which a waveguide is formed and the surface of a submount on which the substrate is fixed are not parallel to each other, and the height of the waveguide with respect to the submount can be adjusted by moving the substrate.

A process for providing such a non-parallel relationship between the surfaces will first be explained. In this example, a waveguide type SHG device 3 including an x-cut $LiTaO_3$ crystal substrate and a waveguide 4 formed thereon is used as the optical functional device.

Figure 14A:
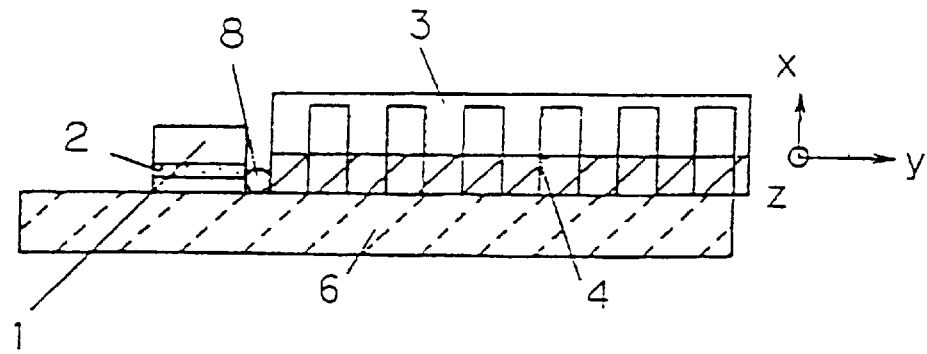
FIGS. 14A to 14E illustrates a method for adjusting the position of the optical waveguide according to the present invention.
Figure 14B:
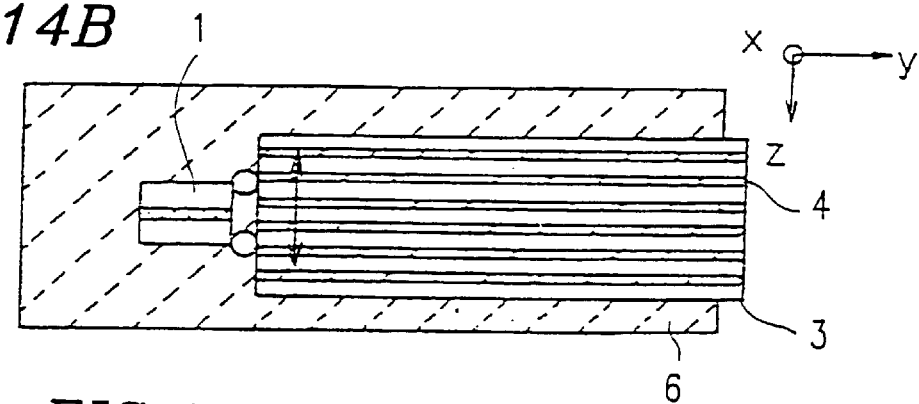
Figure 14C:
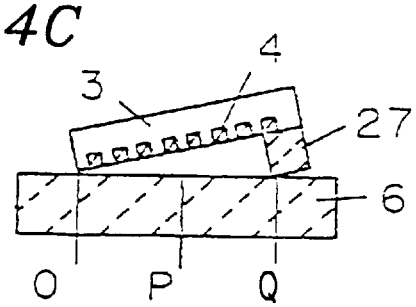

Referring to FIGS. 14A and 14B which are a side view and a plan view of the light generator in the present example, a semiconductor laser chip 1 and a waveguide type SHG device 3 are fixed on an Si submount 6, as in Example 1. Au is deposited on a portion of the Si submount 6 as an electrode and the semiconductor laser chip 1 is fixed by soldering. In Example 1, the $SiO_2$ protection film 7 is formed on the waveguide type SHG device 3 to adjust the height of the waveguide 4 with respect to the active layer 2 of the semiconductor laser chip 1. In this example, the heights of an active layer 2 and a waveguide 4 are adjusted in the following manner. Referring to FIG. 14C, a stripe projection 27 is formed on the surface of the waveguide type SHG device 3 on which the waveguide 4 is formed. The height of the projection 27 is, for example, about 10 $\mu$m. The height of the active layer 2 and the waveguide 4 is adjusted using the projection 27.

In general, a plurality of waveguides 4 are formed on the substrate of the waveguide type SHG device 3 at intervals of about 30 $\mu$m. With the projection 27 formed on the waveguide type SHG device 3, the heights of the waveguides at positions O, P, and Q are different from one another as shown in FIG. 14C. For example, the heights at the positions O, P, and Q are about 0 $\mu$m, about 5 $\mu$m, and about 10 $\mu$m, respectively. Thus, by moving the waveguide type SHG device 3 in the direction shown by the arrow in FIG. 14B, the height of the waveguide 4 can be adjusted arbitrarily so as to obtain the maximum coupling efficiency. With this arbitrary height adjustment, the coupling efficiency can be improved, for example, to about 80%, and a blue light of about 1.3 mW can be obtained.

Figure 14D:
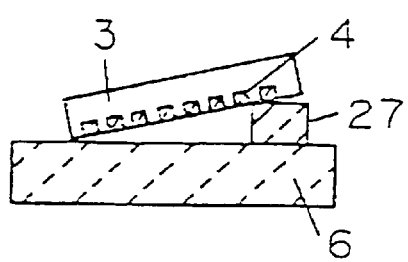
Figure 14E:
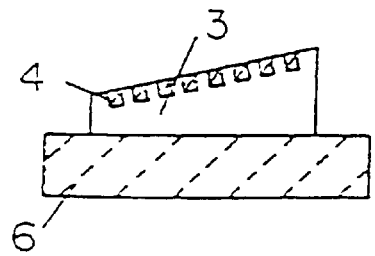

The same affect can also be obtained by forming a projection 27 on the Si surmount 6 as shown in FIG. 14D, or by grinding the crystal substrate obliquely in the case where the surface of the substrate of the SHG device 3 opposite to the waveguide-formed surface is fixed on the submount 6, as shown in FIG. 14E. In the latter case, since the waveguide 4 is positioned far from the submount 6, the heat conduction from the semiconductor laser chip 1 to the SHG device 3 through the submount 6 can be prevented more effectively.

Thus, in this example, the height of the waveguide 4 can be adjusted by uniaxial alignment adjustment of the waveguide type SHG device 3. This eliminates the necessity of strictly controlling the thickness of the soldering at the fixation of the semiconductor laser chip 1, and thus more practical assembling is realized.

EXAMPLE 11

In the above examples, the waveguide type SHG device is used as the waveguide type optical functional device. The same effect can also be obtained in the case of a waveguide type optical modulation device.

Figure 15:
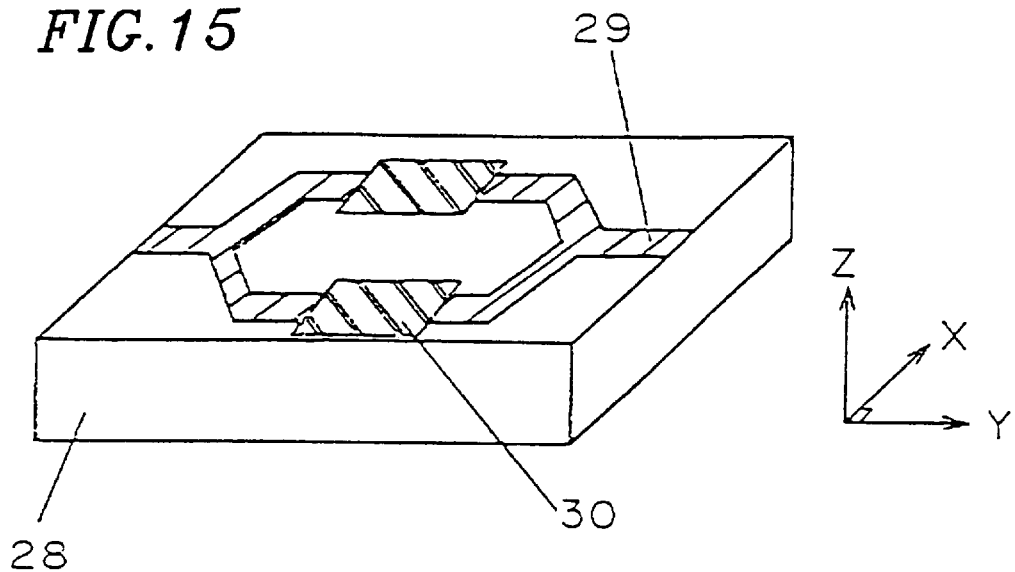
FIG. 15 is a perspective view of an optical modulation device.
Figure 16:
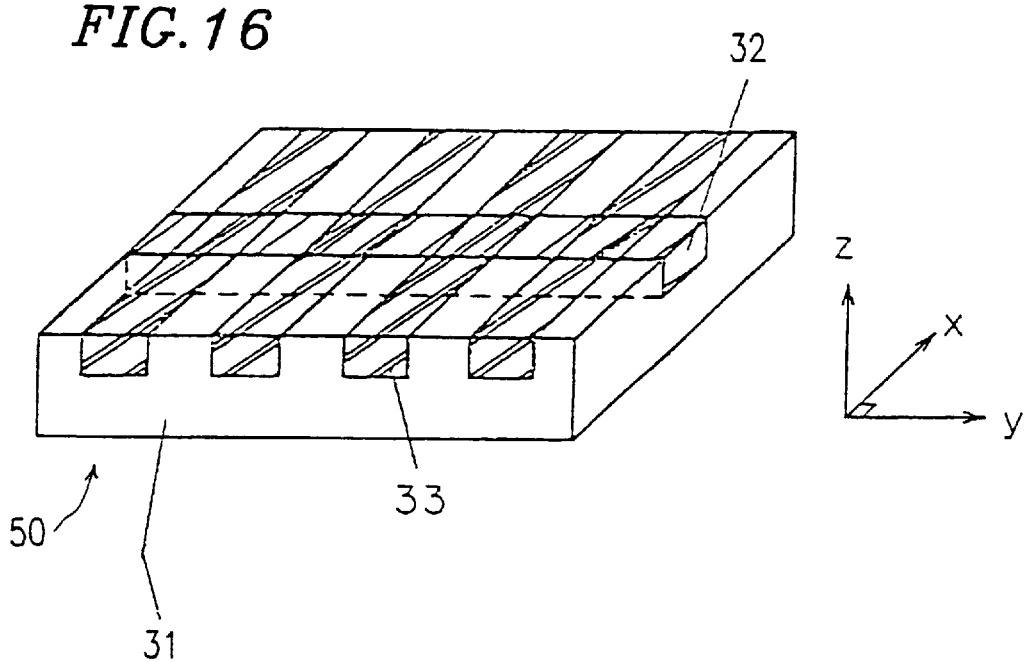
FIG. 16 is a perspective view of an SHG device.
Figure 17:
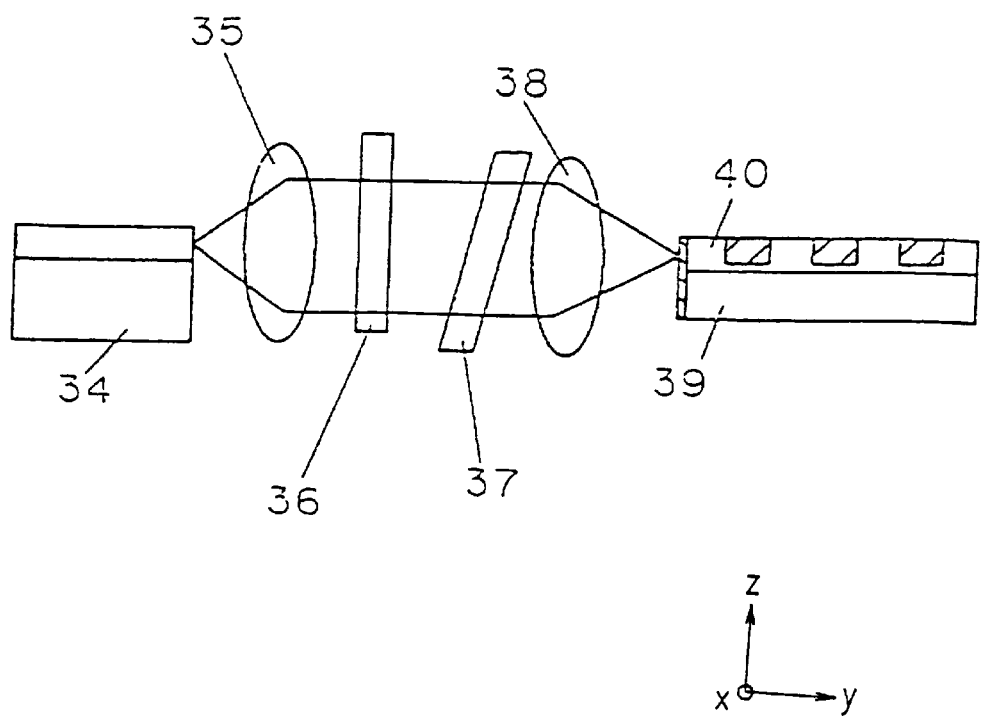
FIG. 17 is a view schematically showing a conventional light generator.

FIG. 15 shows a waveguide type optical modulation device which includes a z-cut $LiNbO_3$ crystal substrate 28 and a branched waveguide 29 formed on the substrate 28 having electrodes 30 which are formed on the branches of the waveguide 29. The phase of incident light of the TM mode is changed by $\Delta\phi$ and $-\Delta\phi$ when propagating through the two branches in the waveguide 29, producing the phase difference of $2\Delta\phi$ therebetween (a push-pull operation). The intensity of the output light is modulated for the phase difference of $2\Delta\phi$.

For the waveguide type optical modulation device, direct coupling of light from the semiconductor laser chip to the waveguide without any coupling lens is also desired for size reduction. In such a case, it is important to realize a module configuration capable of simplifying alignment adjustment for the optical coupling. In addition, in a direct-coupling type module, heat conduction from the semiconductor laser chip affects the phase change in the waveguide and thus deteriorates the modulation characteristics of the device.

The optical modulation device can be fixed on the submount in place of the SHG device in each of Examples 1 to 10 to fabricate a light generator. As a result, a small direct-coupling type optical modulation device with a volume of 1 cc or less is realized with an assembling time of about 30 seconds or less. The heat conduction from the semiconductor laser chip to the optical modulation device can be reduced by using different materials for the portion of the submount on which the semiconductor laser chip is mounted and the portion thereof on which the optical modulation device is mounted. Thus, a stable intensity modulation of output light is realized.

In the above examples, the waveguide is formed on the ferroelectric crystal substrate by proton exchange. The same effect can also be obtained by forming the waveguide on a glass substrate by ion exchange.

In the following examples, an oscillation wavelength stabilizer, a harmonic output stabilizer, and an optical disk system according to the present invention will be described.

Specifically, in accordance with the present invention, in a semiconductor laser having a DBR region (DBR semiconductor laser), the oscillation wavelength thereof can be fixed at a predetermined value or stably controlled when it is varied. In addition, in a short-wavelength light source combining such a semiconductor laser with a wavelength converting device, a stable harmonic output is realized.

Prior to the description of the embodiments, some results of the study will be explained, which was conducted by the present inventors in the process leading to the present invention.

Figure 19:
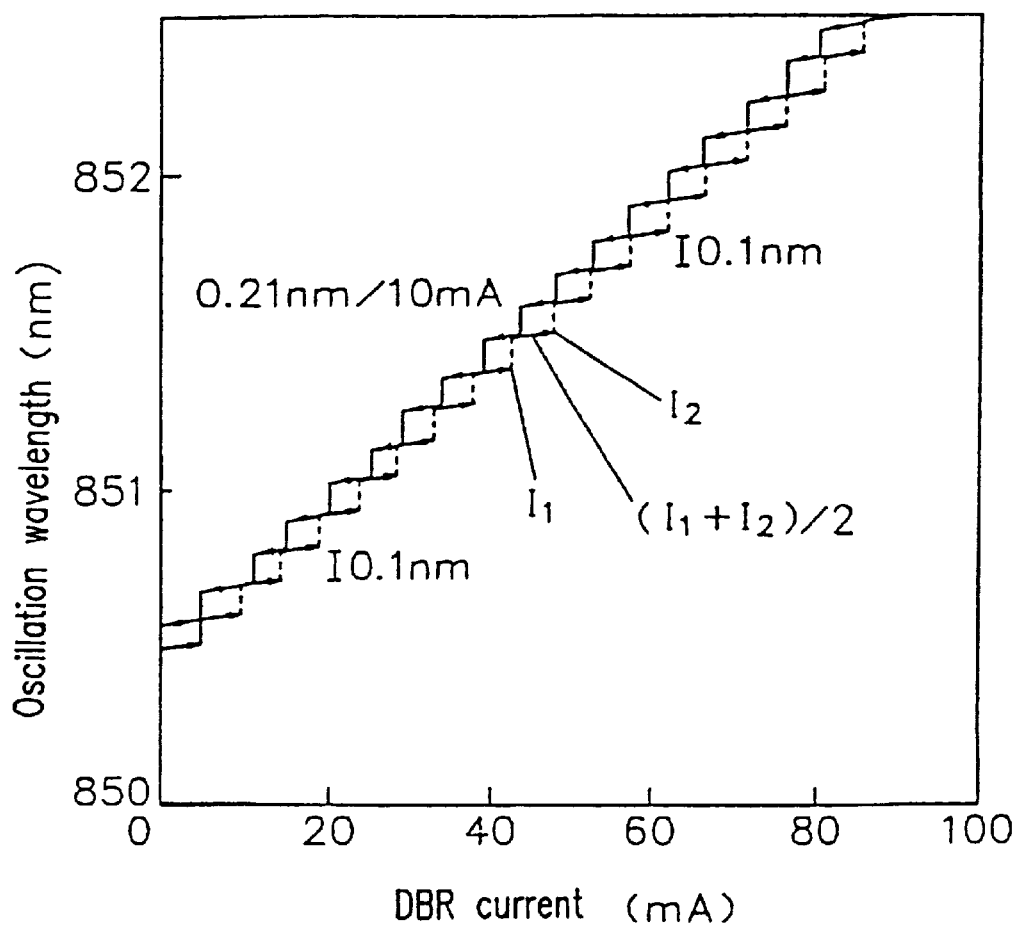
FIG. 19 is a graph illustrating the relationship between the DBR current and the oscillation wavelength of the DBR semiconductor laser.
Figure 21:
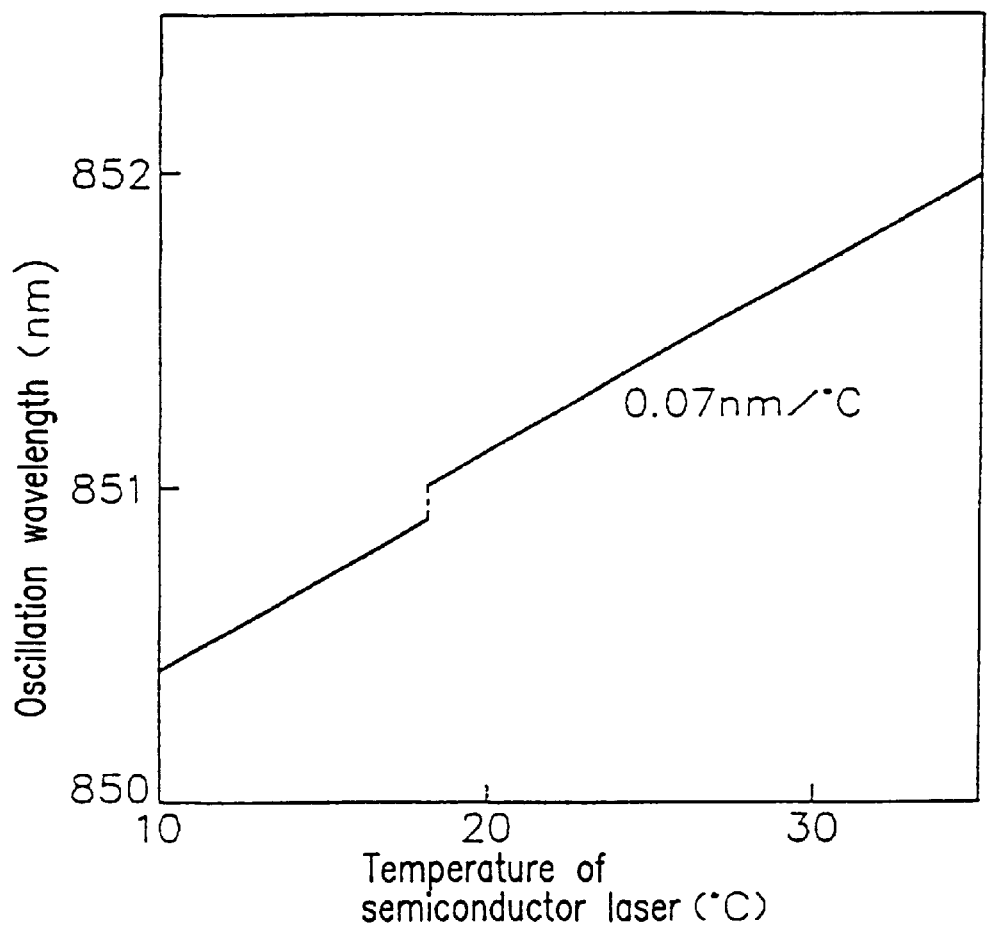
FIG. 21 is a graph illustrating the relationship between the operating temperature and the oscillation wavelength of the DBR semiconductor laser.

FIG. 19 shows the relationship between the current (DBR current) supplied to the DBR region of the semiconductor laser and the oscillation wavelength. FIG. 21 shows the relationship between the temperature of the semiconductor laser and the oscillation wavelength.

The case of varying the oscillation wavelength by varying the DBR current will be described. As is observed from FIG. 19, as the DBR current increases, the oscillation wavelength shifts toward the longer wavelength In a manner of repeating mode hopping. The oscillation wavelength for a particular current level when the DBR current increases is different from that when it decreases, exhibiting a hysteretic characteristic, As a result, when the oscillation wavelength is to be varied by varying the DBR current between a level A and a level B, the DBR current is first gradually increased (or decreased) from the level A toward the level B to detect a certain current value which corresponds to a desired wavelength value, and the current is then decreased (or increased) after reaching the level B to be set at the detected certain current value, the oscillatton wavelength is not actually set at the desired value. This is because differant wavelength levels correspond to the same DBR current value in the first increasing (or decreasing) step and the second decreasing (or increasing) step due to the hysteretic characteristics. The present inventors realized that the above aspect makes it difficult to fix the oscillation wavelength at a desired value by varying the DBR current.

On the other hand, in the case of varying the oscillation wavelength by varying the temperature of the semiconductor laser, the oscillation wavelength is continuously varied in a linear relationship with the variation Of the temperature of the semiconductor laser, as shown in FIG. 21. In this case, however, the present inventors found that the mode-hopping may occur during the temperature-varying process, resulting in a discontinuous wavelength change. The present Inventors realized that deterioration of reliability will be caused by tie above aspect when the ambient temperature range under which the semiconductor laser is used becomes large.

Hereinafter, various embodiments in connection with the oscillation wavelength stabilizer and the harmonic output stabilizer according to the present invention will be described with reference to the accompanying drawings. (Stabilization of oscillation wavelength of DBR semiconductor laser)

EXAMPLE 12

Figure 18A:
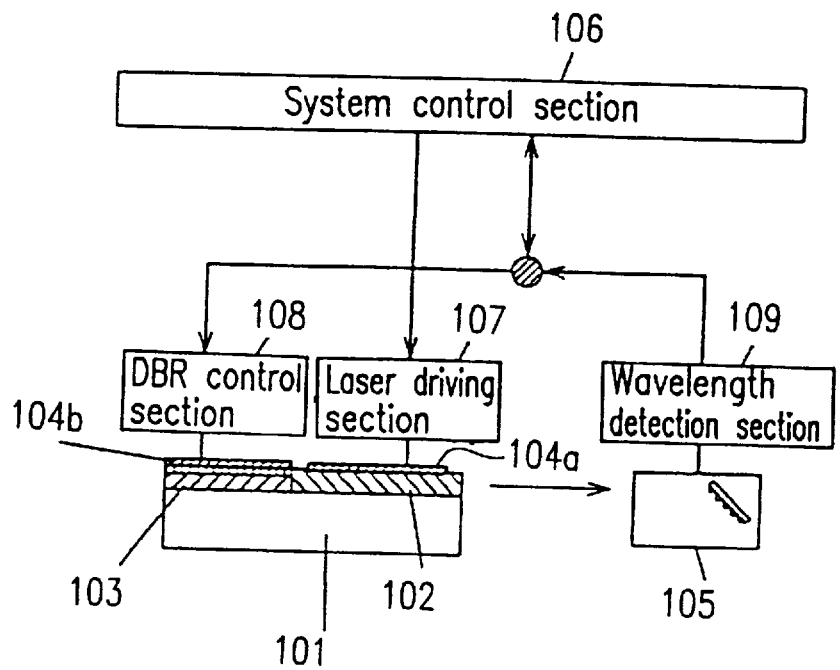
FIG. 18A is a block diagram of an oscillation wavelength stabilizer of Example 12 according to the present invention for a DBR semiconductor laser.

FIG. 18A is a block diagram showing an oscillation wavelength stabilizer of this example for a DBR semiconductor laser. FIG. 18A is a flowchart showing a method for controlling the oscillation wavelength stabilizer. In this example, a method for stably varying the oscillation wavelength by controlling a DBR current supplied to a DBR region of the semiconductor laser unidirectionally will be described.

The oscillation wavelength stabilizer of this example includes a semiconductor laser 101 having an active region 102 and a DBR region 103, and a wavemeter 105 for detecting the oscillation wavelength. The oscillation wavelength stabilizer also includes three circuit systems for controlling these three parts: that is, a laser driving section 107 for controlling a current supplied to the active region 102 of the semiconductor laser 101; a DBR control section 108 for controlling the DBR current supplied to the DBR region 103 of the semiconductor laser 101 to adjust the oscillation wavelength to a desired wavelangth; and a wavelength detection section 10 g for detecting the wavelength of laser light. The oscillation wavelength stabilizer also includes a system control section 106 for controlling the three circuit systems 107 to 109.

The semiconductor laser 101 is formed by epitaxial growth using an MOCVD apparatus. After n-AlGaAs is grown on an n-GaS substrtate, AlGaAs is grown to form a waveguide region and an active region, and then p-AlGaAs is grown as a cladding layer. Then, a waveguide is formed by photolithography. A resist is applied to the resultant wafer to form a grating pattern by interference exposure. Thereafter, only the waveguide region is etched to form a grating (DBR). In a second MOCVD growth, p-GaAs is grown on the resultant wafer for reducing contact resistance. Electrodes 104b and 104a are formed on the DBR region 103 and the active region 102 for current application. The resultant DBR semiconductor laser 101 exhibits a threshold current of about 30 mA and on operating current of about 150 mA at about 100 mW output.

Figure 18B:
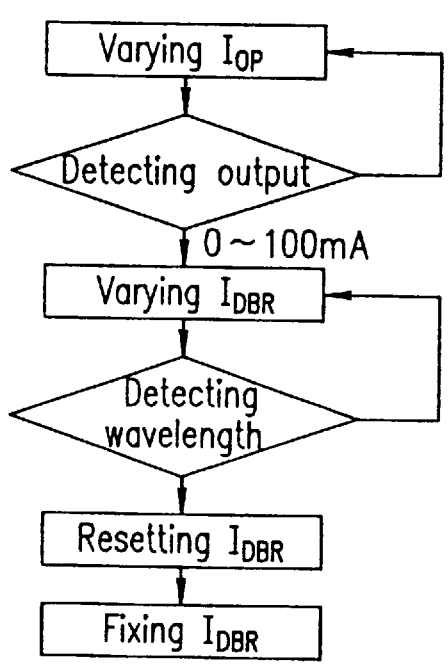
FIG. 18B is a flowchart showing a method for controlling the oscillation wavelength stabilizer of FIG. 18A.

A method for adjusting the oscillation wavelength to a desired wavelength in this example according to the present invention will be described in detail with reference to FIGS. 18A and 18B.

First, a signal is input into the laser driving section 107 from a system control section 106 to supply a current to an electrode 104a formed on the active region 102 so that the light intensity of the semiconductor laser 101 becomes a set value, i.e., 100 mW. The oscillation wavelength of laser light is detected with the wavemeter 105, and a signal indicating the detected result is output from the wavelength detection section 109. Then, a signal is input into the DBR control section 108 to supply a current to an electrode 104b formed on the DBR region 103 so that the oscillation wavelength of laser light is adjusted.

FIG. 19 shows the relationship between the DBR current and the oscillation wavelength. The oscillation wavelength shifts toward the longer wavelength in a manner of repeating mode hopping when the DBR current increases. The slope of the wavelength shift with regard to the DBR current is 0.21 nm/10 mA. The oscillation wavelength for a particular current amount when the DBR current increases is different from that when it decreases, showing the hysteretic characteristic. In this example, the following technique is adopted to avoid the hysteretic characteristic and thus perform a correct adjustment of the oscillation wavelength.

First, the DBR current is increased from 0 mA to 100 mA to scan the oscillation wavelength. Specifically, the signal output from the wavelength detection section 109 is detected, and a DBR current obtained when the wavelength of laser light is equal to a set wavelength is stored in the system control section 106. Then, after reaching 100 mA, the DBR current is lowered to a value lower than the stored DBR current by 10 mA (i.e., the DBR current is reset). Thereafter, the DBR current is changed again in the same direction as in the previous detection step (i.e., increase in this case), adjusting it to the value stored in the system control section 106, Thus, the oscillation wavelength of the semiconductor laser 101 is adjusted to the set wavelength.

As described above, when the wavelength of laser light is adjusted to the set wavelength, the DBR current is first increased to detect a certain current level corresponding to the set wavelength and then set at a value lower than the certain current level corresponding to the set wavelength, and further increased to be fixed at the corresponding current. This makes it possible to avoid the above-described hysteretic characteristic possessed by the semiconductor laser having the DBR region.

It should be noted that the DBR current may be first decreased to detect a certain current level corresponding to the set wavelength, then increased beyond the detected current level and again decreased to finally be fixed at the detected level.

If the DBR current is fixed at a value near a mode hopping current, mode hopping tends to occur due to a variation of the ambient temperature and the like. To avoid this problem, in this example, the DBR current is fixed at a value ($I_o$) between mode hopping DBR currents $I_1$ and $I_2$ ($I_o=(I_1+I_2)/2$). Thus, a more stable wavelength control is realized.

Another problem with the method for varying the oscillation wavelength using the DBR current is that noise is generated at the mode hopping. This is derived from the fact that the wavelength variation with the variation of the DBR current is a thermal phenomenon caused by a heater inside the DBR region. However, since mode hopping occurs during a short period of 10 nS or less, this is negligible for the frequency bandwidth of tens of MHz or less used for optical disks and the like. Accordingly, by lowering the supply rate of the DBR current only in the area where mode hopping occurs, wavelength variation without generating noise can be realized in the frequency bandwidth of tens of MHz or less.

Figure 35:
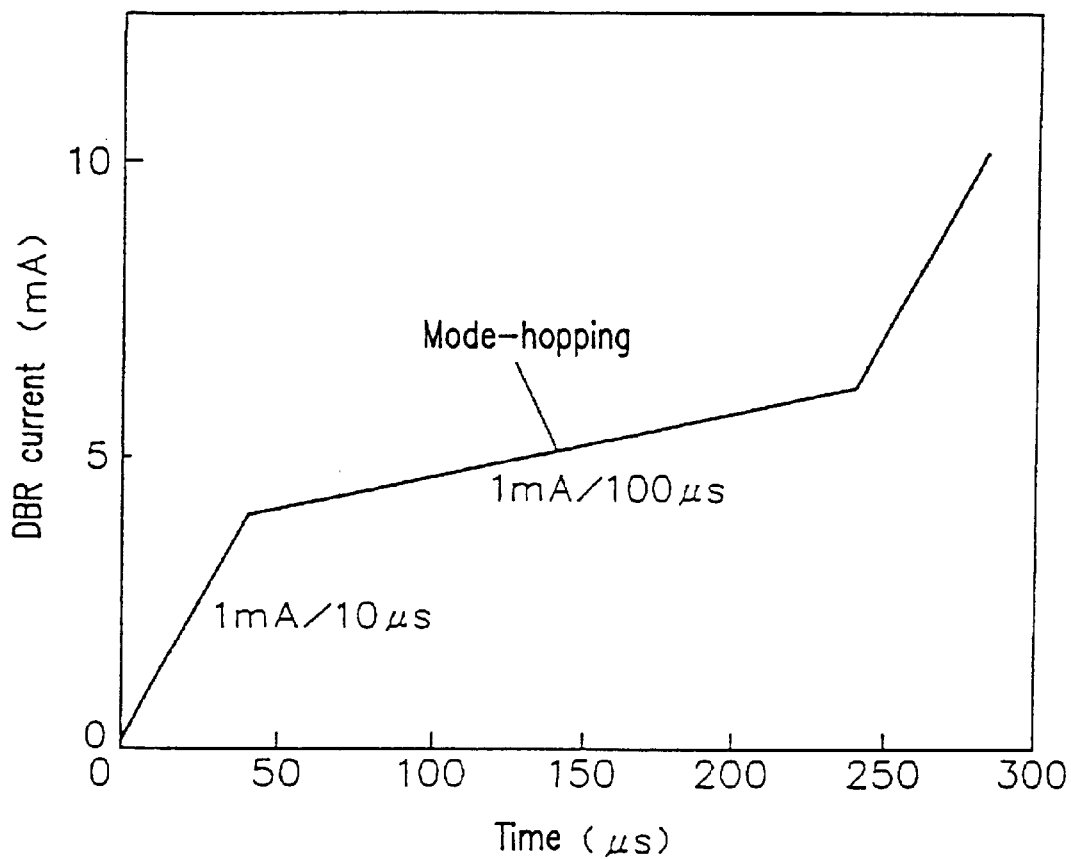
FIG. 35 is a graph illustrating the rate of the current supplied to a DBR region according to the present invention.

FIG. 35 shows an example of the DBR current supply rate. The DBR current supply rate is 1 mA/10 µs in the continuous wavelength variation area, while it is 1 mA/100 µs in the mode hopping occurring area. The wavelength variation without generating noise is realized by following the DBR current supply rates as shown in FIG. 35.

Though the DBR current supply rate of 1 mA/100 µs is used in FIG. 35, the wavelength variation without generating noise can also be realized by using a supply rate lower than 1 mA/100 µs.

EXAMPLE 13

Figure 20A:
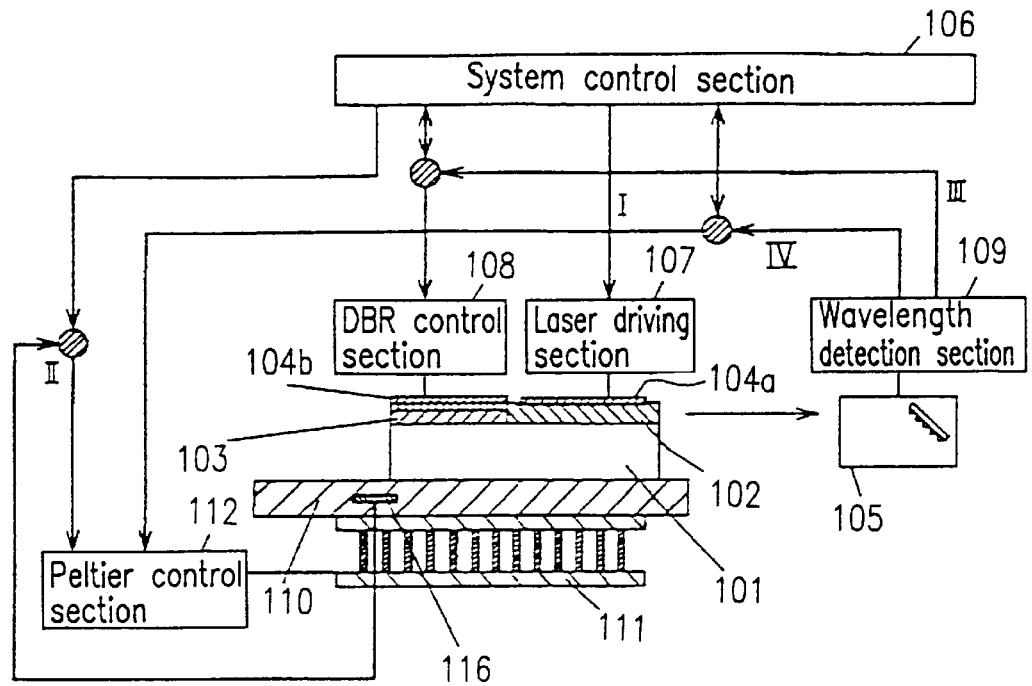
FIG. 20A is a block diagram of an oscillation wavelength stabilizer of Example 13 according to the present invention for a DBR semiconductor laser.
Figure 20B:
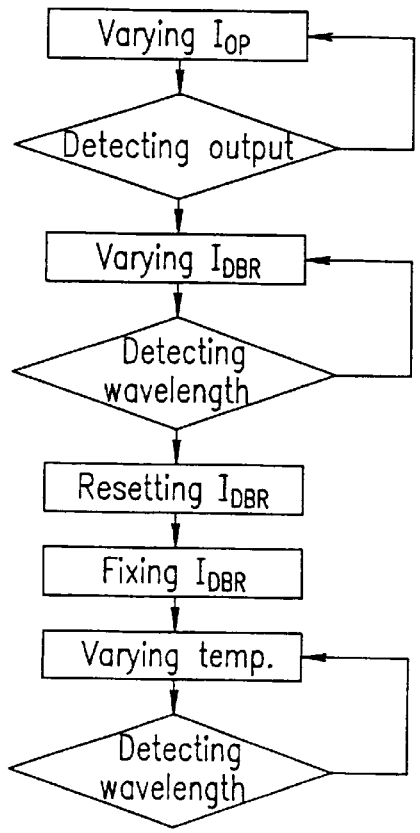
FIG. 20B is a flowchart showing a method for controlling the oscillation wavelength stabilizer of FIG. 20A.

FIG. 20A is a block diagram showing an oscillation wavelength stabilizer of this example for a DBR semiconductor laser using an electronic cooling element. FIG. 20B is a flowchart showing a method for controlling the oscillation wavelength stabilizer. In this example, a method for varying the oscillation wavelength using an electronic cooling element (Peltier element) 111 will be described.

The oscillation wavelength stabilizer of this example includes a semiconductor laser 101 having an active region 102 and a DBR region 103, a wavemeter 105 for detecting the oscillation wavelength, a temperature sensor 116 for detecting the temperature of the semiconductor laser 101, and an electronic cooling element 111 for controlling the temperature of the semiconductor laser 101. The oscillation wavelength stabilizer also includes four circuit systems for controlling these parts: that is, a laser driving section 107 for controlling a current supplied to the active region 102 of the semiconductor laser 101; a DBR control section 108 for controlling a DBR current supplied to the DBR region 103 of the semiconductor laser 101 to adjust the oscillation wavelength to a desired wavelength; a wavelength detection section 109 for detecting the wavelength of laser light; and a Peltier control section 112 for controlling the temperature of the semiconductor laser 101. The oscillation wavelength stabilizer further includes a system control section 106 for controlling the four circuit systems 107 to 109 and 112.

A method for adjusting the wavelength of laser light to a set wavelength in this example according to the present invention will be described in detail with reference to FIGS. 20A and 20B.

As the initial setting, as in Example 12, a signal is input into the laser driving section 107 from a system control section 106 to supply a current to the active region 102 so that the light intensity of the semiconductor laser 101 becomes a set value (100 mW) (Loop I). Then, the ambient temperature is detected with the temperature sensor 116, and a signal is input into the Peltier control section 112 from the system control section 106, to adjust the current supplied to the electronic cooling element 111 so that the temperature of the semiconductor laser 101 is fixed at a value near the detected ambient temperature (Loop II), Thereafter, a signal is input into the DBR control section 108 from the system control section 106 to control a current supplied to the DBR region 103 so that the oscillation wavelength of laser light is adjusted to a value near a set wavelength, while the output from the wavelength detection section 109 is detected (Loop III). Thus, the initial setting is completed.

The wavelength variation using the DBR current in Example 12 is not continuous, but discontinuous with mode hopping at intervals of about 0.1 nm. This makes it difficult to fix the oscillation wavelength of the semiconductor laser at a desired wavelength with a precision of 0.1 nm or less. In this example, however, continuous wavelength variation is possible by using the variation of the temperature of the semiconductor laser.

FIG. 21 shows the relationship between the temperature of the DBR semiconductor laser and the oscillation wavelength. In the case of the DBR semiconductor laser, the oscillation wavelength shifts toward the longer wavelength as the temperature rises by 0.07 nm/°C. The oscillation wavelength shifts continuously, not through a repeated mode hopping as shown in FIG. 19, in the wavelength range of about 1 nm. In this example, therefore, after the above initial setting, the temperature of the semiconductor laser 101 is varied using the electronic cooling element 111 to vary the oscillation wavelength.

Specifically, first, the oscillation wavelength is detected with the wavemeter 105, and a signal indicating the difference between the oscillation wavelength and the set wavelength is output from the wavelength detection section 109. Then, a signal is input into the Peltier control section 112 to adjust the current to be supplied to the electronic cooling element 111 so as to compensate the difference between the oscillation wavelength and the set wavelength. Thus, the oscillation wavelength of laser light is controlled (Loop IV).

This loop is repeated several times to match the wavelength of laser light with the set wavelength.

Thus, by using the variation of the temperature of the semiconductor laser, the wavelength variation with a precision of 0.1 nm or less is possible.

The heat absorption capacity of the electronic cooling element 111 is influential when the wavelength of the semiconductor laser 101 is varied using the electronic cooling element 111. The heat absorption capacity of the electronic cooling element 111 closely depends on the temperature. Accordingly, in this example, the temperature of the semiconductor laser 101 is set at the ambient temperature at the initial setting as described above. This greatly reduces the heat absorption capacity of the electronic cooling element 111, and thus provides a large practical effect.

There may arise a difference between the temperature of the semiconductor laser 101 and the ambient temperature due to a wavelength variation or a variation of the ambient temperature. This increases the heat absorption capacity of the electronic cooling element 111. In such a case, in this example, the initial setting is repeated, to reset the temperature of the semiconductor laser 101 at the ambient temperature to reduce the heat absorption capacity of the electronic cooling element 111.

EXAMPLE 14

Figure 22:
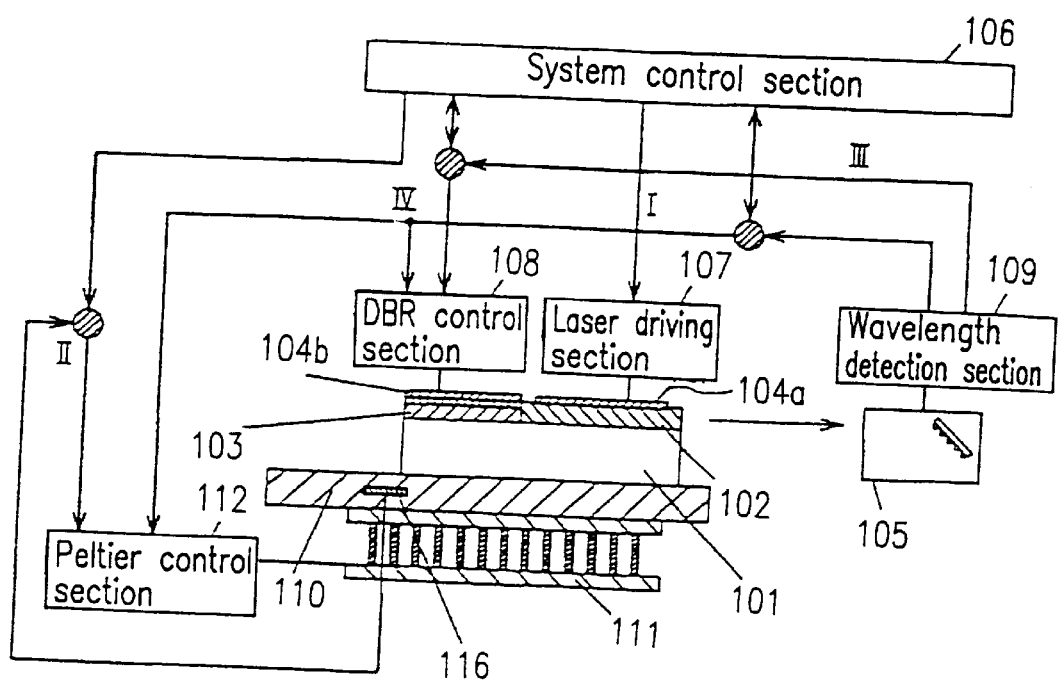
FIG. 22 is a block diagram of an oscillation wavelength stabilizer of Example 14 according to the present invention for a DBR semiconductor laser.

FIG. 22 is a block diagram showing an oscillation wavelength stabilizer of this example for a DBR semiconductor laser using an electronic cooling element. In this example, a method for compensating a phase change caused by the variation of the operating temperature using the DBR current will be described.

As in Example 13, the oscillation wavelength stabilizer of this example includes a semiconductor laser 101 having an active region 102 and a DBR region 103, a wavemeter 105 for detecting the oscillation wavelength, and an electronic cooling element 111 for controlling the temperature of the semiconductor Laser 101. The oscillation wavelength stabilizer also includes four circuit systems for controlling these parts: that is, a laser driving section 107 for controlling a current supplied to the active region 102 of the semiconductor laser 101; a DBR control section 108 for controlling a DBR current supplied to the DBR region 103 of the semiconductor laser 101 to adjust the oscillation wavelength to a desired wavelength; a wavelength detection section 109 for detecting the wavelength of laser light; and a Peltier control section 112 for controlling the temperature of the semiconductor laser 101. The oscillation wavelength stabilizer further includes a system control section 106 for controlling the four circuit systems 107 to 109 and 112.

As the initial setting, as in Example 13, a current is supplied to the active region 102 under the control of the laser driving section 107 (Loop I), the temperature of the semiconductor laser 101 is set at the ambient temperature by the Peltier control section 112 (Loop II), and the oscillation wavelength is adjusted to a value near a set wavelength by the DBR control section 108 (Loop III). As described in Example 13, continuous wavelength variation in the wavelength range of about 1 nm is possible by varying the temperature. However, mode hopping occurs when the wavelength variation exceeds the wavelength range as shown in FIG. 21. This is because there exits a minute displacement between the DBR wavelength obtained by optical feedback by the DBR region 103 and the shift amount for the temperature in the Fabry-Perot mode corresponding to the cavity length defined by the effective DBR length. In this example, the DBR current supplied to the DBR region is adjusted to compensate for this displacement (Loop IV).

Figure 23:
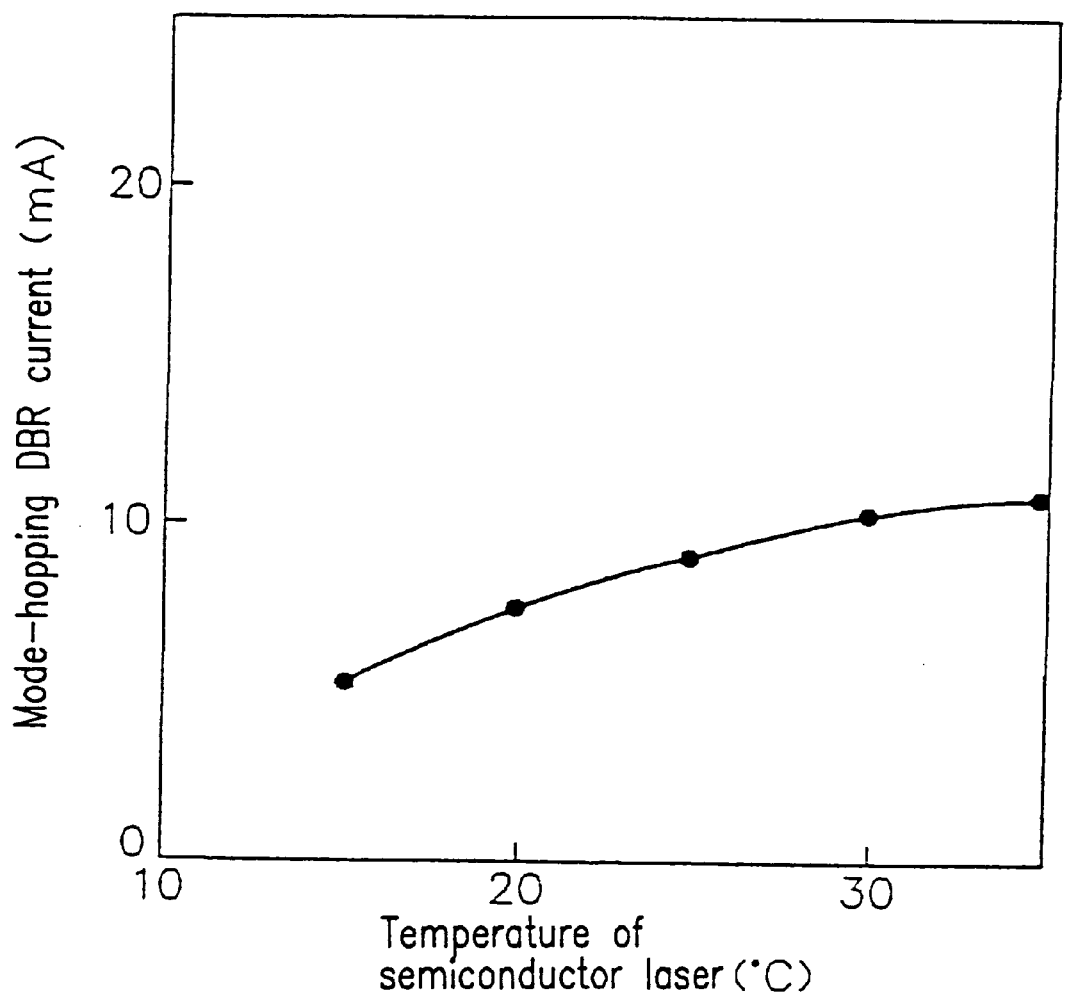
FIG. 23 is a graph illustrating the relationship between the operating temperature and the mode hopping DBR current of the DBR semiconductor laser.

FIG. 23 shows the relationship between the operating temperature and the mode-hopping DBR current (i.e., the level of the DBR current at which the mode-hopping occurs). When the operating temperature varies, the DBR current at the mode hopping which occurs due to a variation of an operating current increases. It is therefore possible to compensate the phase change by increasing the DBR current as the operating temperature rises. The phase change can be compensated by increasing the DBR current by about 3 mA for each rise in the operating temperature of 10° C. As a result, continuous wavelength variation in the wavelength range of 1 nm or more is realized.

Phase changes caused by various factors can be compensated by adjusting the DBR current as in this example. Therefore, the continuous wavelength variation using the temperature variation can be realized in a wide wavelength range. This provides a large practical effect.

EXAMPLE 15

Figure 24:
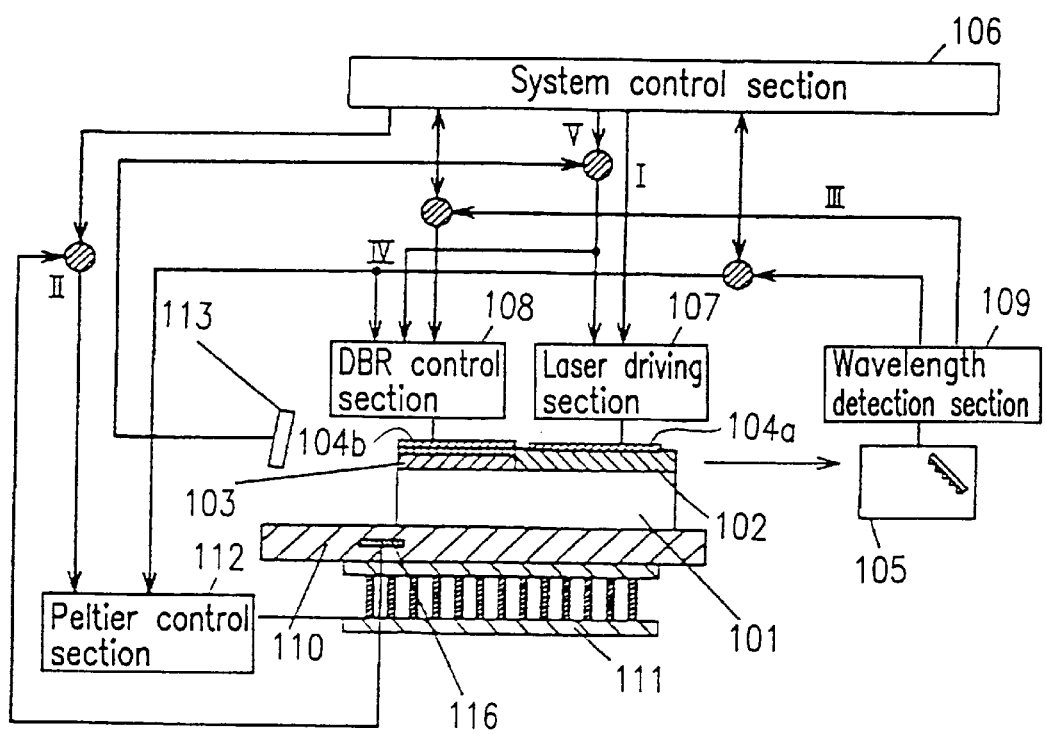
FIG. 24 is a block diagram of an oscillation wavelength stabilizer of Example 15 according to the present invention for a DBR semiconductor laser.

FIG. 24 is a block diagram showing an oscillation wavelength stabilizer of this example for a DBR semiconductor laser using an electronic cooling element. In this example, a method for compensating a phase change caused by the variation of the operating current using the DBR current will be described.

As in Example 13, the oscillation wavelength stabilizer of this example includes a semiconductor laser 101 having an active region 102 and a DBR region 103, a wavemeter 105 for detecting the oscillation wavelength, a temperature sensor 116 for detecting the temperature of the semiconductor laser 101, and an electronic cooling element 111 for controlling the temperature of the semiconductor laser 101. The oscillation wavelength stabilizer also includes four circuit systems for controlling these parts: that is, a laser driving section 107 for controlling a current supplied to the active region 102 of the semiconductor laser 101; a DBR control section 108 for controlling a DBR current supplied to the DBR region 103 of the semiconductor laser 101 to adjust the oscillation wavelength to a desired wavelength; a wavelength detection section 109 for detecting the wavelength of laser light; and a Peltier control section 112 for controlling the temperature of the semiconductor laser 101. The oscillation wavelength stabilizer further includes a system control section 106 for controlling the four circuit systems 107 to 109 and 112.

Figure 25:
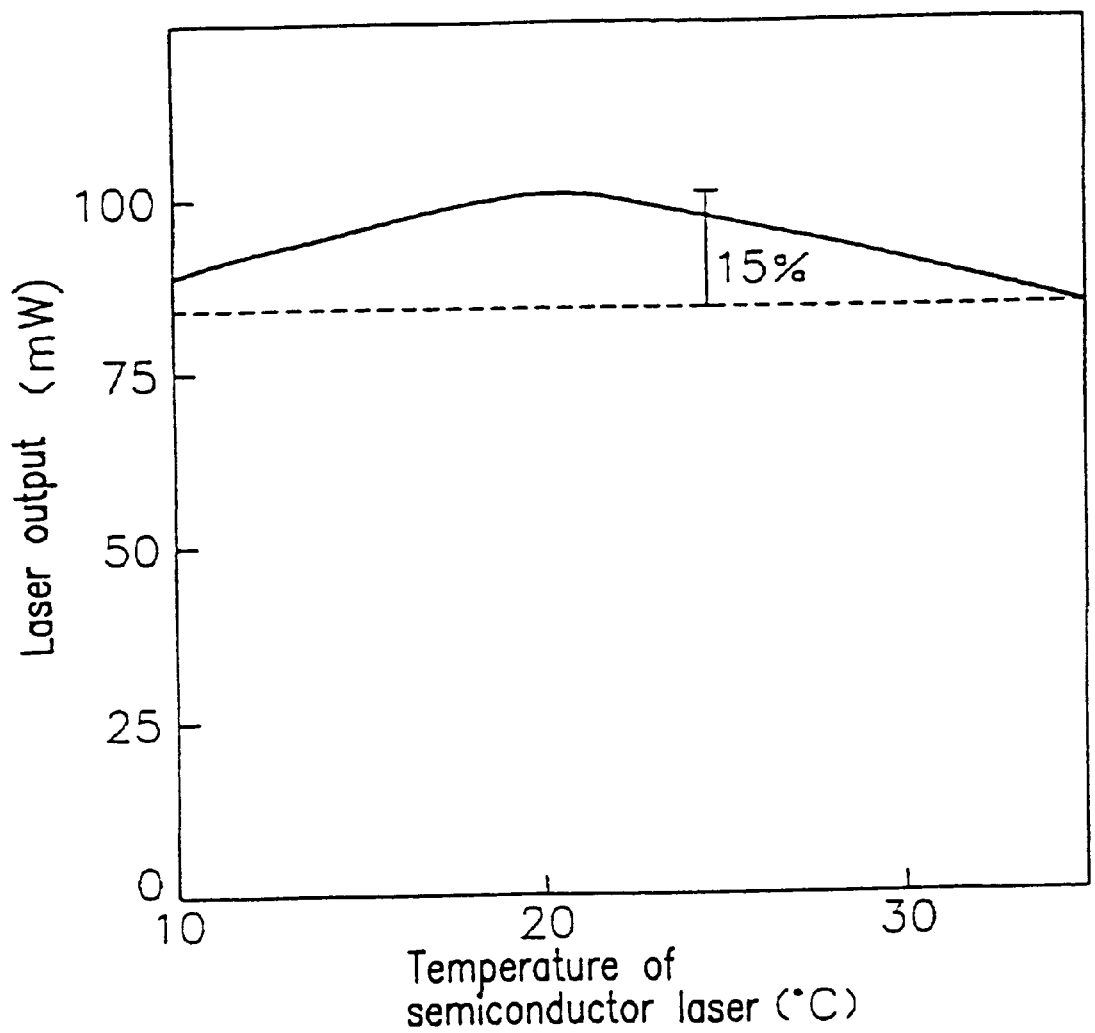
FIG. 25 is a graph illustrating the relationship between the operating temperature and the laser output of the DBR semiconductor laser.

In this example, the oscillation wavelength is varied by adjusting the operating temperature of the semiconductor laser 101 using the electronic cooling element 111. In general, the output of a semiconductor laser 101 varies as the operating temperature varies. FIG. 25 shows the relationship between the operating temperature and the laser output. In order to vary the laser wavelength by about 1 nm, the operating temperature needs to be varied by about 15° C. The variation of the operating temperature of 15° C. varies the laser output by about ±7.5%.

In this example, the laser driving section 107 is controlled so that the laser output is fixed, and the phase change caused by this fixation of the laser output is compensated by varying the DBR current.

A method for controlling the oscillation wavelength, a method for controlling the laser output, and a method for compensating the phase change by the DBR control section in this example according to the present invention will now be described in detail.

As the initial setting, as in Example 13, a set current is supplied to the active region 102 under the control of the laser driving section 107 (Loop I), the temperature of the semiconductor laser 101 is set at the ambient temperature by the Peltier control section 112 (Loop II), and the oscillation wavelength is adjusted to a value near a set wavelength by the DBR control section 108 (Loop III). As described in Example 13, after the initial setting, the temperature of the semiconductor laser 101 is varied using the electronic cooling element 111 to vary the oscillation wavelength.

Specifically, the oscillation wavelength is first detected with the wavemeter 105, and a signal indicating the difference between the oscillation wavelength and the set wavelength is output from the wavelength detection section 109. Then, a signal is input into the Peltier control section 112 to adjust the Current to be supplied to the electronic cooling element 111 so as to compensate the difference between the oscillation wavelength and the set wavelength. Thus, the oscillation wavelength of laser light is controlled (Loop IV).

These loops are repeated several times to match the wavelength of laser light with the set wavelength.

The laser driving section 107 is then controlled to compensate the output variation caused by the temperature variation. Herein, the case where the set wavelength is varied so that the wavelength is continuously shifted by the Peltier control section 112 will be described.

In order to shift the wavelength of the semiconductor laser by 1 nm, the temperature of the semiconductor laser needs to be varied by about 15° C. At this time, the laser output varies by about 7.5%. In this example, the laser output is detected all the time by an output detector 113. The current amount supplied to the active region 102 is controlled by the laser driving section 107, so as to compensate the difference between a signal obtained from the output detector 113 and a set output signal output from the system control section 106, thus allowing the laser output to be kept fixed.

Figure 26:
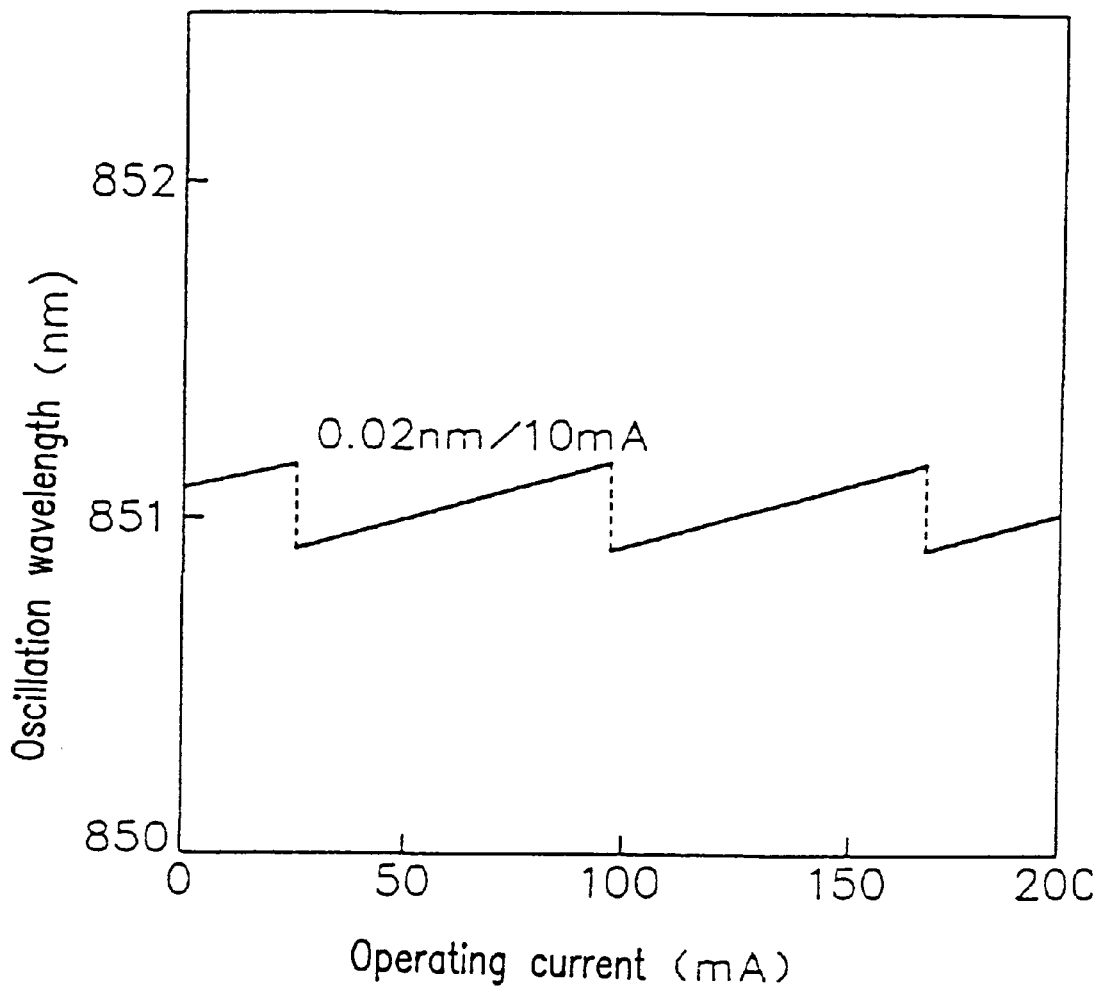
FIG. 26 is a graph illustrating the relationship between the operating current and the oscillation wavelength of the DBR semiconductor laser.

When the temperature of the semiconductor laser 101 is varied by about 15° C. as in this example, the operating current to the active region needs to be varied by about 10% since the output varies by about 7.5%. FIG. 26 shows the relationship between the operating current and the oscillation wavelength. As the operating current increases, the temperature of the active region rises, causing a phase change and thus mode hopping. The slope of the wavelength shift was 0.02 nm/10 mA. When the operating current is 150 mA, it needs to be varied by about 20 mA in order to keep the output fixed for a temperature variation of 15° C. This causes mode hopping as shown in FIG. 26.

In this example, the phase change generated by adjusting the operating current is compensated in the DBR region 103. The phase changes in the active region with the variation of the operating current of 20 mA (ΔI), shifting the Fabry-Perot mode by 0.04 nm. Thus, mode hopping can be avoided by varying the DBR current by about 2 mA (0.02 nm/0.21 nm×ΔI) by the DBR control section 108 (Loop V). The temperature of the semiconductor laser is adjusted again by the Peltier control section 112 to adjust the oscillation wavelength to the set wavelength.

By repeating these loops several times, the adjustments to the set wavelength and the set output are accomplished.

Thus, in this example, the output variation caused by the variation of the temperature of the semiconductor laser 101 is detected by the output detector 113, and the difference between the detected output and the set output is compensated. At this time, the laser driving section 107 and the DBR control section 108 are simultaneously controlled, to keep the laser output fixed while avoiding mode hopping. This realizes continuous wavelength variation over a wide wavelength range while keeping the output fixed. Thus, a large practical effect is provided.

EXAMPLE 16

Figure 27A:
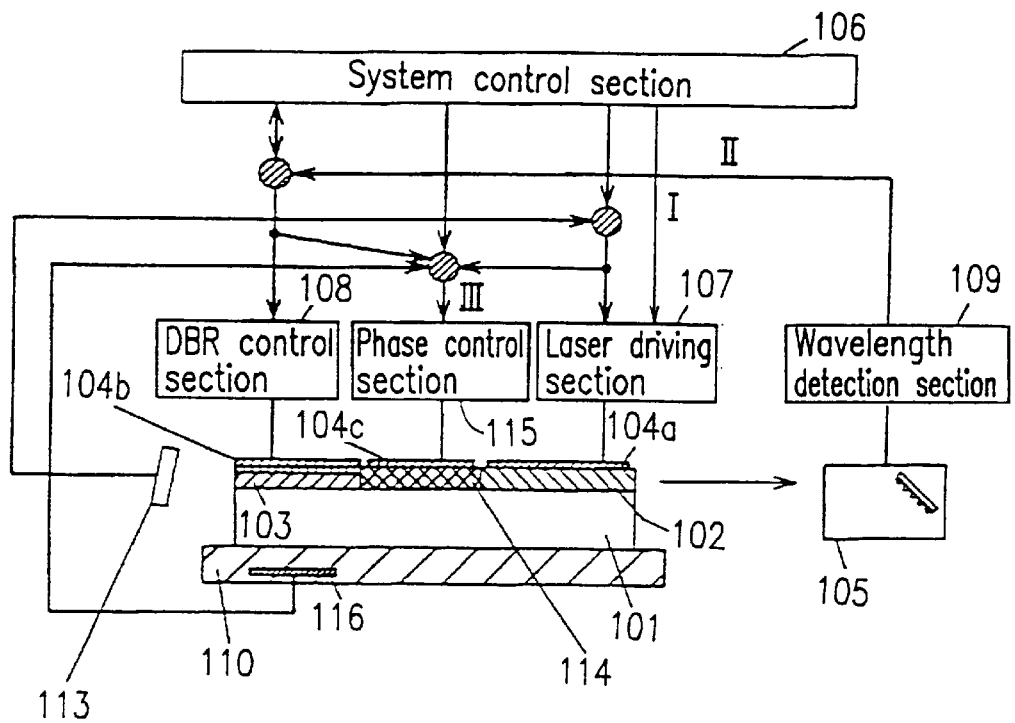
FIG. 27A is a block diagram of an oscillation wavelength stabilizer of Example 16 according to the present invention for a DBR semiconductor laser.
Figure 27B:
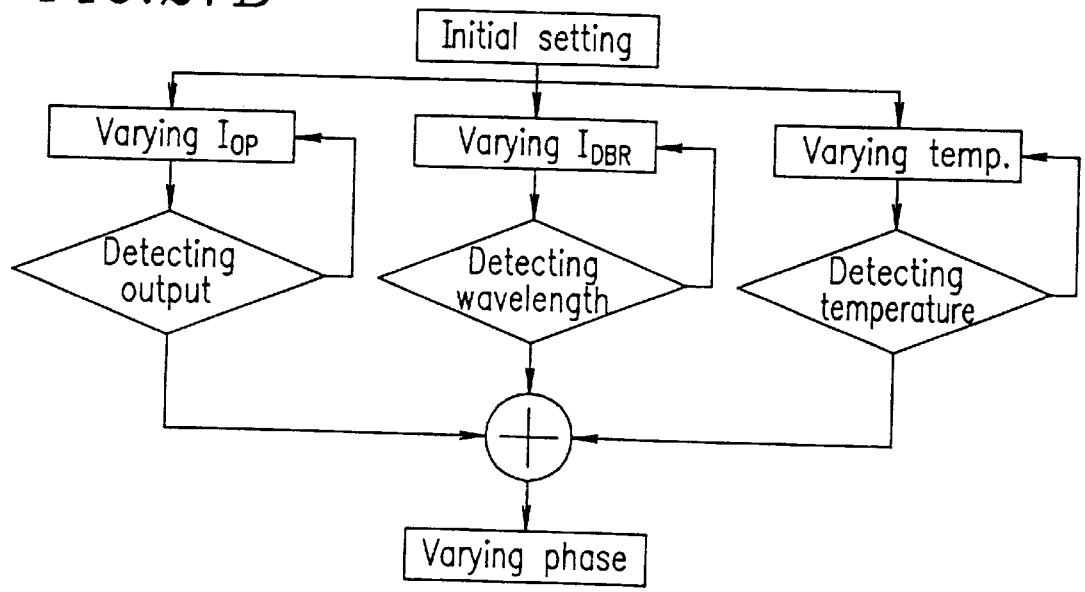
FIG. 27B is a flowchart showing a method for controlling the oscillation wavelength stabilizer of FIG. 27A.

FIG. 27A is a block diagram showing an oscillation wavelength stabilizer of this example for a DER semiconductor laser having a phase region. FIG. 27B is a flowchart showing a method for controlling the oscilation wavelength stabilizer.

The oscillation wavelength stabilizer of this example includes a semiconductor laser 101 having an active region 102, a DBR region 103, and a phase region 114, a wavemeter 105 for detecting the oscillation wavelength, a temperature sensor 116 for detecting the temperature of the semiconductor laser 101, and an output detector 113 for detecting the laser output. The oscillation wavelength stabilizer also includes four circuit systems for controlling these parts: that is, a laser driving section 107 for supplying a current to the active region 102 of the semiconductor laser 101; a DBR control section 108 for controlling a DBR current supplied to the DBR region 103 of the semiconductor laser 101 to adjust the oscillation wavelength to a desired wavelength; a wavelength detection section 109 for detecting the wavelength of laser light; and a phase control section 115 for controlling the current supplied to the phase region 114 (phase control current). The oscillation wavelength stabilizer further includes a system control section 106 for controlling the four circuit systems 107 to 109 and 115.

A method for stabilizing the oscillation wavelength of the DBR semiconductor laser 101 having the phase region 114 in this example according to the present invention will be described in detail with reference to FIGS. 27A and 27B.

As the initial setting, a signal is input into the laser driving section 107 from a system control section 106 to supply a current to the active region 102 so that the light intensity of the semiconductor laser 101 becomes a predetermined value, i.e., 100 mW (Loop I). Then, the oscillation wavelength of laser light is detected with the wavemeter 105, and a signal indicating the detected result is output from the wavelength detection section 109. A set wavelength is output from the system control section 106. A signal is input into the DBR driving section 108 to control the current supplied to the DBR region 103 so as to adjust the oscillation wavelength of laser light to compensate for the difference from the set wavelength (Loop II). This adjustment is performed, as in Example 12, by varying the current supplied to the DBR region 103 between 0 mA and 100 mA (specifically, by incrcdsing from 0 mA to 100 mA) to scan the oscillation wavelength. The signal output from the wavelength detection section 109 is detected, and a current obtained when the wavelength of laser light is equal to the set wavelength is stored. Then, the current is lowered to a value lower than the stored current by 10 mA. Thereafter, the stored current is supplied to the DBR region, and thus the oscillation wavelength of the laser light is adjusted to the set wavelength.

In this example, continuous wavelength variation can be realized by using the phase region 114 after the above initial setting in the following manner.

The oscillation wavelength of the DBR semiconductor laser is varied by varying any of the following three factors:

(1) current supplied to the DBR region (the DBR current);

(2) operating temperature of the DBR semiconductor laser; and (3) current supplied to the active region (the operating current).

More specifically, the phase in the cavity mode (Fabry-Perot mode) of the semiconductor laser changes by varying the wavelength with the variation of the DBR current (wavelength control), by varying the ambient temperature (temperature control), or varying the operating current for controlling the laser output (output control), thereby causing mode hopping. In this example, the phase region 114 is used to realize the above controls without causing mode hopping.

Figure 28:
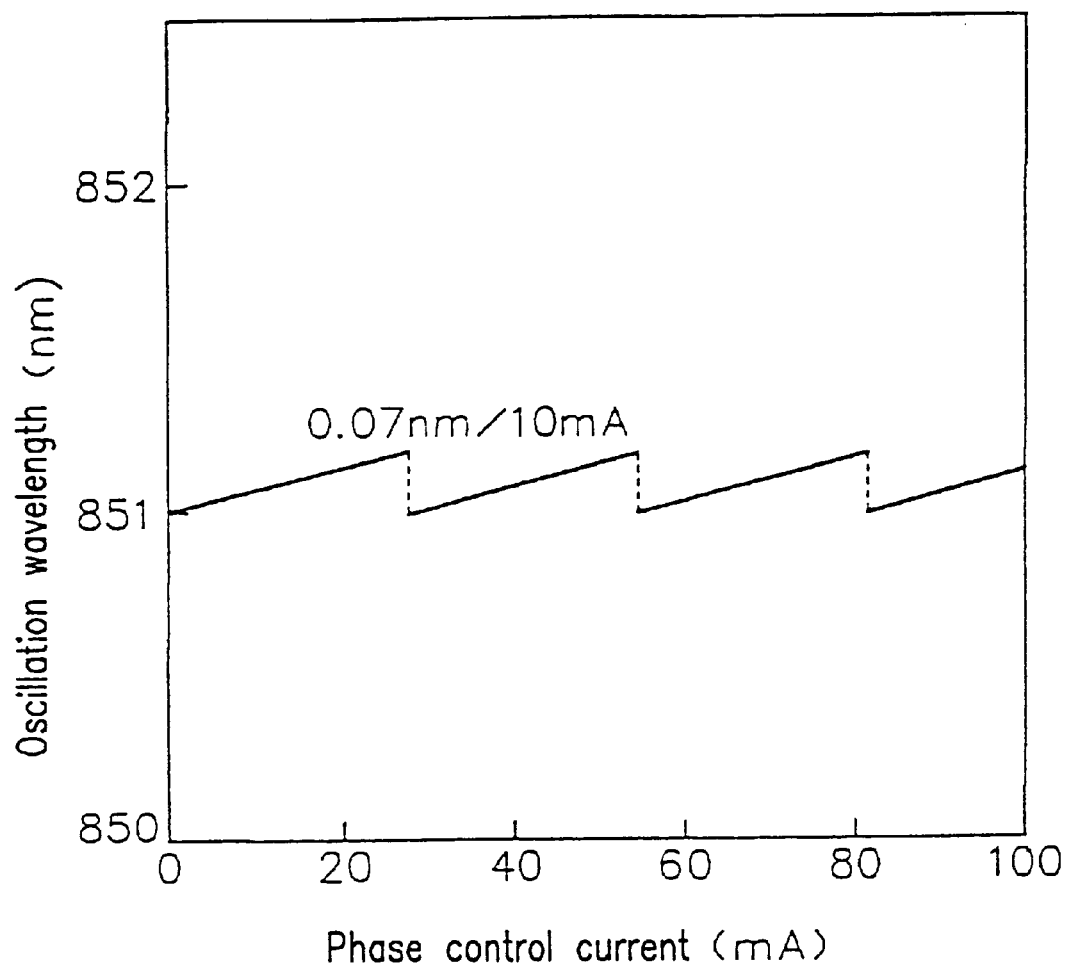
FIG. 28 is a graph illustrating the relationship between the phase control current and the oscillation wavelength of the DBR semiconductor laser.

FIG. 28 shows the relationship between the current supplied to the phase region 114 and the oscillation wavelength. The shift of the oscillation wavelength with the variation of the current supplied to the continuous wavelength variation region is 0.07 nm/10 mA. The shift of the oscillation wavelength with the variations of the DBR current and the operating current were 0.21 nm/10 mA and 0.02 nm/10 mA, respectively. This indicates that a current three times the variation of the DBR current should be supplied to the phase region 114 for the wavelength control, while a current about one-third of the variation of the operating current should be supplied to the phase region 114 for the output control. For the temperature control, the current supplied to the phase region 114 should be reduced by about 5 mA for each temperature rise of about 10° C.

In consideration of the above, in this example, the variations of the ambient temperature, the operating current, and the DBR current are controlled by the laser driving section 107 and the DBR control section 108. Then, the sum of the phase changes generated by these controls are compensated by the phase control section 115. Thus, continuous wavelength variation is realized (Loop III).

As described above, in this example, continuous wavelength variation is realized by forming the phase region 114 In the DBR semiconductor laser 101, and the continuous wavelength variation with the output being kept fixed can be realized over a wide wavelength range by compensating the sum of the phase changes in the phase When the current supply to the phase region 114, as in this example, is performed at a fixed rate, a current of about 300 mA needs to be supplied to the phase region 114 in order to supply a DBR current of about 100 mA to the DBR region 103 to vary the wavelength by about 2 nm. This, as a practical matters, requires large power consumption. In the phase region 114, the phase change is periodically repeated when a current is supplied.

Accordingly, when the oscillation wavelength stabilizer of this example is applied to an optical disk system and the like, the phase control current may be reset during the standby time of the system and the like to reduce the current. This largely reduces the power consumption.

In Examples 12 to 16 above, The AlGaAs semiconductor laser was used. The same effect can be obtained by using other material systems, such as II–VI group ZnS semiconductor lasers and III–V group GaN semiconductor lasers, incorporating the DBR region.

(Stabilization of the output of a short-wavelength light source)

In Examples 12 to 16 above, the method for adjusting the oscillation wavelength of the DBR semiconductor laser to a set wavelength and the method for continuously varying the wavelength have been described. In the following examples, a method for adjusting the oscillation wavelength of the DBR semiconductor laser to a phase-matching wavelength of a wavelength converting device for stabilizing the harmonic output of an SHG blue laser including the DBR semiconductor laser and the wavelength converting device will be described.

EXAMPLE 17

Figure 29A:
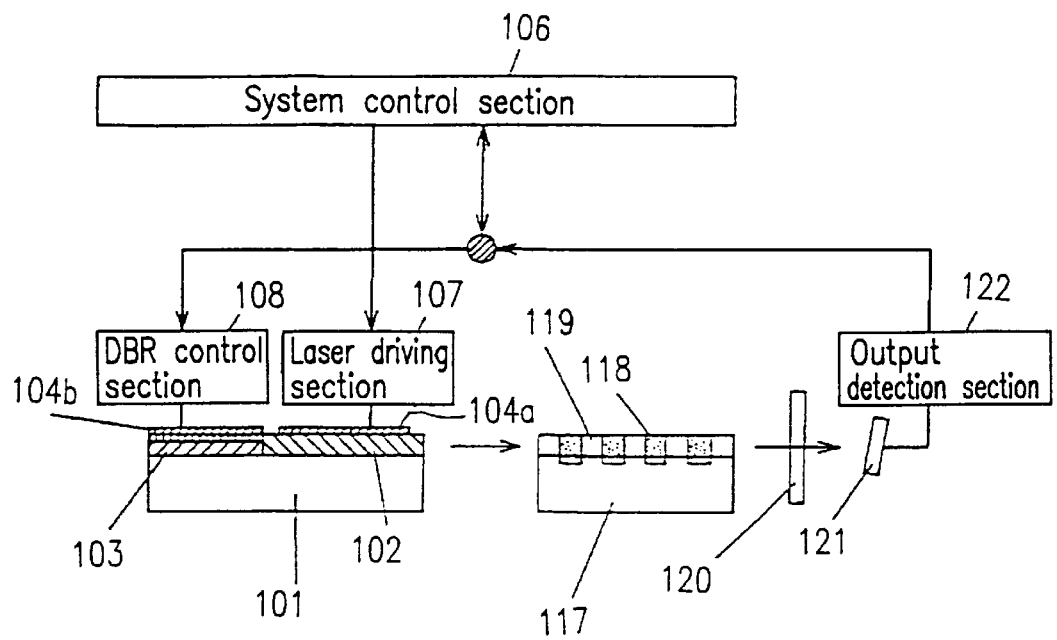
FIG. 29A is a block diagram of a harmonic output stabilizer of Example 17 according to the present invention for an SHG blue laser.
Figure 29B:
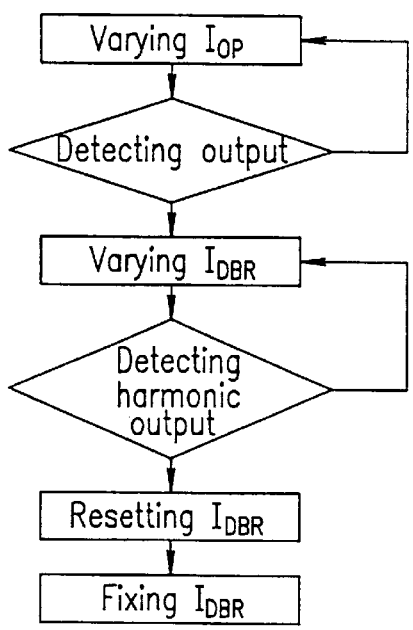
FIG. 29B is a flowchart showing a method for controlling the harmonic output stabilizer of FIG. 29A.

FIG. 29A is a block diagram of a harmonic output stabilizer of this example according to the present invention for adjusting the oscillation wavelength of a DBR semiconductor laser to a phase-matching wavelength of a wavelength converting device to stabilize the harmonic output. FIG. 29B is a flowchart showing a method for controlling the harmonic output stabilizer of this example.

Referring to FIGS. 29A and 29B, the harmonic output stabilizer of this example includes a semiconductor laser 101 having an active region 102 and a DBR region 103, a wavelength converting device 117 having periodic domain inverted regions 118 and a waveguide 119, and ar. output detector 121 for detecting the harmonic output. The harmonic output stabilizer also includes three circuit systems for controlling these parts: that is, a laser driving section 107 for supplying a current to the active region 102 of the semiconductor laser 101; a DBR control section 108 for controlling a DBR current supplied to the DBR region 103 of the semiconductor laser 101 to adjust the oscillation wavelength to a desired wavelength; and an output detection section 122 for detecting the harmonic output. The harmonic output stabilizer further includes a system control section 106 for controlling the three circuit systems 107, 108 and 122.

The wavelength converting device 117 is a waveguide type wavelength converting device of the quasi-phase matching (QPM) method including an $LiTaO_3$ crystal substrate. The phase shift between a fundamental wave and a harmonic is compensated by the periodic domain inverted regions 118, and thus high efficiency wavelength conversion is realized. The phase-matching wavelength is 851 nm, and the wavelength allowance is 0.13 nm. The periodic domain inverted regions 118 of the QPM-SHG device 117 are formed by instantaneous heat treatment. The waveguide 119 is formed by proton exchange using pyrophosphoric acid.

Semiconductor laser light is coupled to the waveguide 119 of the wavelength converting device 117 via a coupling lens (not shown). When the wavelength of the semiconductor laser 101 matches the phase-matching wavelength of the wavelength converting device 117, the laser light propagating through the waveguide 119 is converted into harmonic light. The oscillation wavelength of the DBR semiconductor laser used in this example is in the range of 850 to 852 nm, and the wavelength of the resultant harmonic light is 425 nm (blue light).

A method for adjusting the wavelength of laser light within the allowance of the phase-matching wavelength of the wavelength converting device 117 to stabilize the harmonic output in this example according to the present invention will now be described in detail.

In order to stabilize the harmonic output, it is important to stably control the wavelength of the semiconductor laser 101 within the allowance of the phase-matching wavelength of the wavelength converting device 117. For that purpose, a signal is first input into the laser driving section 107 from a system control section 106 to supply a current to the active region 102 so that the light intensity of the semiconductor laser 101 becomes a set value, i.e., 100 mW. Then, the harmonic output obtained by the wavelength conversion is detected by the output detector 121. An Si-PIN photodiode is used as the output detector 121.

As shown in FIG. 19, the oscillation wavelength shifts toward the longer wavelength in a manner of repeated mode hopping when the DBR current increases. The oscillation wavelength for a particular current level when the DBR current is increased is different from that when it is decreased, exhibiting the hysteretic characteristic. In this example, the following technique is adopted to avoid the hysteretic characteristic and thus control the wavelength of the DBR laser 101 within the allowance of the phase-matching wavelength of the wavelength converting device 117.

First, the DBR current is varied between 0 mA and 100 mA (specifically, increased from 0 mA to 100 mA) to scan the oscillation wavelength. The signal output from the output detector 121 is detected, and a current obtained when the harmonic output is at its peak is stored in the system control section 106. In this example, the maximum blue light output of 2 mW can typically be obtained when the DBR current is 50 mA. Then, the DBR current is lowered from 100 mA to a value lower than the stored DBR current by 10 mA, i.e., 40 mA. Thereafter, the DBR current is again increased up to the stored DBR current (50 mA), and the oscillation wavelength of the laser light is adjusted to the phase-matching wavelength, i.e., 851 nm, of the wavelength converting device. Long-term output stability is thus ensured by repeating the above control when the harmonic output decreases.

Thus, in this example, at the adjustment of the wavelength of laser light to a set wavelength, the DBR current is first increased to detect and store a certain current level corresponding to the set wavelength, and then decreased to be set at a value lower than the stored current corresponding to the set wavelength, and further increased to be fixed at the stored DBR current. This makes it possible to avoid the hysteretic characteristic possessed by the semiconductor laser having the DBR region at the tuning, thereby allowing the wavelength of the semiconductor laser to be correctly adjusted to the phase-matching wavelength of the wavelength converting device. Thus, a stable harmonic output is realized. Alternatively, the DBR current may be first decreased to detect and store the certain current level corresponding to the set wavelength, then increased beyond the stored certain level, and again decreased to be set at the stored level.

In particular, this method is practically effective In the case of the short-wavelength light source including the QPM-SHG device and the DBR semiconductor laser, where the allowance of the phase-matching wavelength of the QPM-SHG device is as narrow as 0.1 nm. A wavelength variation of 0.1 nm due to the hysteretic characteristic will otherwise cause a serious problem. Thus, a method according to the present invention in which the DBR current is once set at a level lower than the level corresponding to the set wavelength, which has been detected during a first increasing step, and then fixed at the desired level to be obtain the set wavelength, has significant advantages in practical use.

EXAMPLE 18

Figure 30:
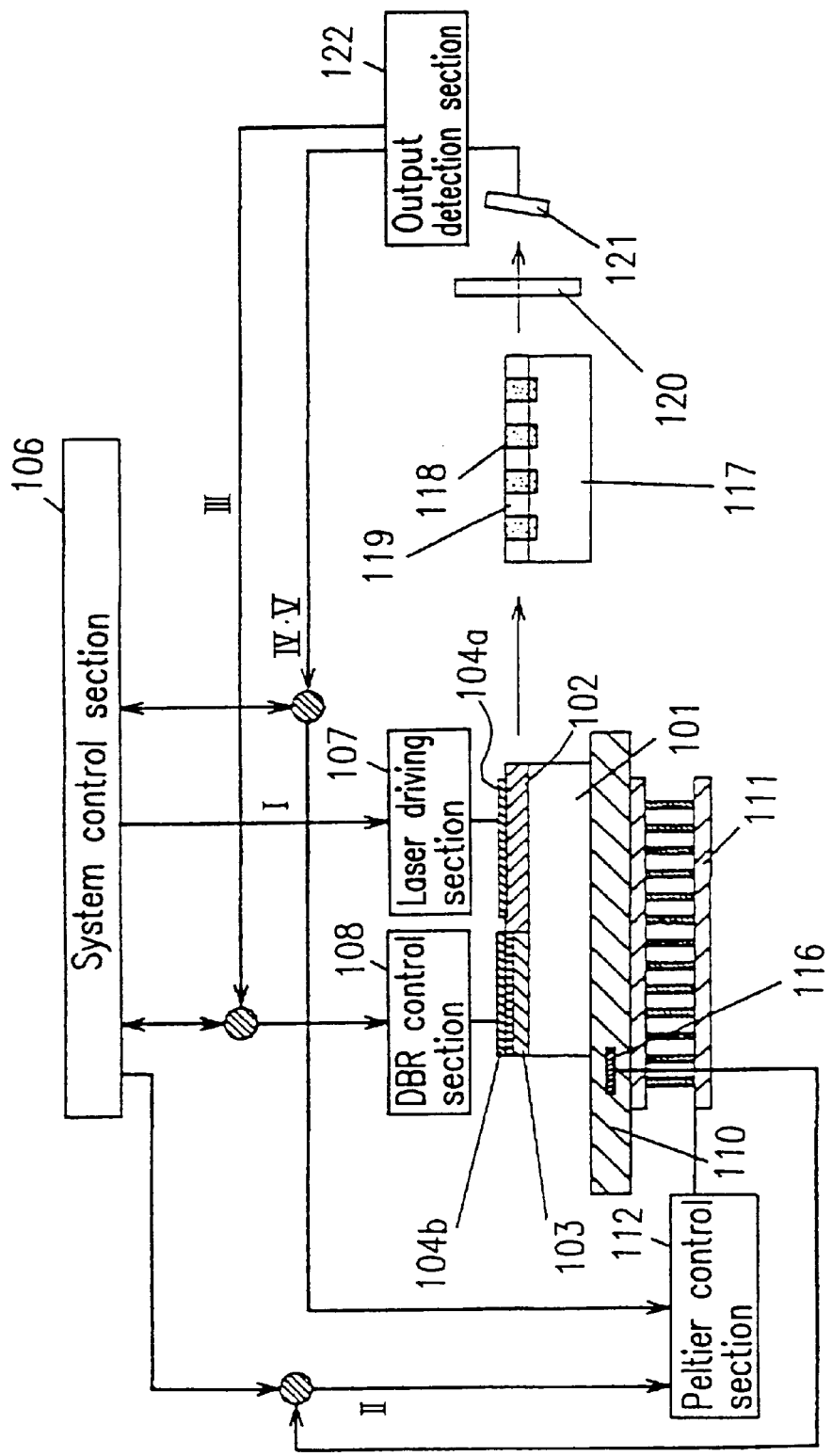
FIG. 30 is a block diagram of a harmonic output stabilizer of Example 18 according to the present invention for an SHG blue laser.

FIG. 30 is a block diagram of a harmonic output stabilizer of this example according to the present invention for an SHG blue laser using an electronic cooling element 111.

In the harmonic output stabilizer of Example 17, the oscillation wavelength of the semiconductor laser can be fixed within the phase-matching wavelength allowance. However, the wavelength variation with the variation of the DBR current is discontinuous every 0.1 nm, and the wavelength allowance of the QPM-SHG device is as narrow as about 0.1 nm. Accordingly, it is difficult to fix the oscillation wavelength at the center of the allowance of the phase-matching wavelength where the maximum conversion efficiency is obtainable. In this example, the oscillation wavelength is varied with the temperature is variation, which can realize the wavelength conversion with higher efficiency.

Referring to FIG. 30, the harmonic output stabilzer of this example includes a semiconductor laser 101 having an active region 102 and a DBR region 103, a wavelength converting device 117 having periodic domain inverted regions 118 and a waveguide 119, an output detector 121 for detecting the harmonic output, a temperature sensor 116 for detecting the temperature of the semiconductor laser 101, and an electronic cooling element 111 for controlling the temperature of the semiconductor laser 101. The harmonic output stabilizer also includes four circuit systems for controlling these parts: that is, a laser driving section 107 for applying a current to the active region 102 of the semiconductor laser 101; a DBR control section 108 for controlling a DBR current supplied to the DBR region 103 of the semiconductor laser 101 to adjust the oscillation wavelength to a desired wavelength; an output detection section 122 for detecting the harmonic output; and a Peltier control section 112 for controlling the temperature of the semiconductor laser 101. The harmonic output stabilizer further includes a system control section 106 for controlling the four circuit systems 107, 108, 112 and 122. In this example, as in example 17, a QPM-SHG device including an LiTaO$_3$ substrate is used as the wavelength converting device 117.

A method for adjusting the wavelength of laser light within the allowance of the phase-matching wavelength of the wavelength converting device 117 to stabilize the harmonic output in this example according to the present invention will now be described in detail.

In order to stabilize the harmonic output, it is important to stably control the wavelength of the semiconductor laser 101 within the allowance of the phase-matching wavelength of the wavelength converting device 117. As the initial setting, as in Example 17, the oscillation wavelength is fixed at or around the phase-matching wavelength of the wavelength converting device 117. Specifically, a signal is first input into the laser driving section 107 from a system control section 106 to supply a current to an active region 102 and control the current to be 150 mA, so that the light intensity of the semiconductor laser 101 becomes a set value, i.e., 100 mW (Loop I). Then, the ambient temperature (20° C.) is detected with the temperature sensor 116, and a signal is input into the Peltier control section 112 from the system control section 106 to adjust the current supplied to the electronic cooling element 111 so that the temperature of the semiconductor laser 101 is 20° C. (Loop II). Thereafter, as in Example 17, a signal is input into the DBR control section 108 from the system control section 106 to control the current supplied to the DBR region 103 so that the oscillation wavelength of laser light is fixed within the allowance of the phase-matching wavelength, while the harmonic output is detected by the output detector 121 (Loop III). Thus, the initial setting is completed.

The phase-matching wavelength of the QPM-SHG device is 851.05 nm. In this initial setting, the wavelength of the DBR semiconductor laser is typically fixed at 851 nm. In the wavelength variation using the variation of the DBR current having the mode intervals of 0.1 nm, it is not possible to adjust the wavelength to 851.05 nm. In this example, however, the wavelength of the DBR semiconductor laser 101 can be finely adjusted to the phase-matching wavelength by using the temperature variation.

As shown in FIG. 21, in the case of the DBR semiconductor laser, the oscillation wavelength continuously shifts toward the longer wavelength as the temperature rises by 0.07 nm/°C. On the other hand, the phase-matching wavelength of the QPM-SHO device shifts toward the longer wavelength by 0.035 nm/°C. In this example, therefore, after the above initial setting, the temperature of the semiconductor laser 101 is varied using the electronic cooling element 111, to vary the oscillation wavelength.

Specifically, the harmonic output is first detected by the output detector 121, and a signal indicating the detected result is output from the output detection section 122 to be stored in the system control section 106 as an initial value ($P_0$). Then, the temperature at the initial setting is increased by about 20.5° C. A signal is input into the Peltier control section 112, to adjust the current to be supplied to the electronic cooling element 111 and thus vary the oscillation wavelength of laser light (Loop IV). The harmonic output at this time is detected by the output detector 121, and a signal ($P_1$) indicating the detected result is output from the output detection section 122 to the system control section 106. If $P_1 > P_0$, loop IV is repeated, increasing the set temperature by 21° C., and the resultant harmonic output ($P_2$) is detected. If $P_2 < P_1$, the set temperature is lowered by about 20° C. (Loop V).

In this example, by repeating loops III and V, the harmonic output is typically stably fixed at a peak output (about 2.3 mW) at about 22° C. Long-term harmonic output stability is realized by constantly repeating the control of loop V.

The method for stabilizing the harmonic output by temperature control as in this example realizes continuous variation of the wavelength of the semiconductor laser. Accordingly, the peak of the harmonic output can be detected, which is not possible by the method using only the variation of the DBR current. Blue light output higher than that obtained in Example 17 by about 10% can be obtained. This has, therefore, a large practical effect. In particular, In the case of the short-wavelength light source including the QPM-SHG device and the DBR semiconductor laser, where the allowance of the phase-matching wavelength of the QPM-SHG device is as narrow as about 0.1 nm, continuous wavelength variation is indispensable. Therefore, the method for stabilizing the harmonic output by temperature control in this example provides a large practical effect.

The heat absorption capacity of the electronic cooling element 111 is influential when the wavelength of the semiconductor laser 101 is varied using the electronic cooling element 111. in this example, the temperature of the semiconductor laser 101 is set at the ambient temperature at the initial setting as described above. This greatly reduces the heat absorption capacity of the electronic cooling element 111 and thus provides a large practical effect.

A temperature Difference may arise between the temperature of the semiconductor laser 101 and the ambient temperature due to a wavelength variation or a variation of the ambient temperature, increasing the heat absorption capacity of the electronic cooling element 111. In such a case, in this example, the initial setting is repeated to reset the temperature of the semiconductor laser 101 at the ambient temperature and reduce the heat absorption capacity of the electronic cooling element 111.

EXAMPLE 19

Figure 31:
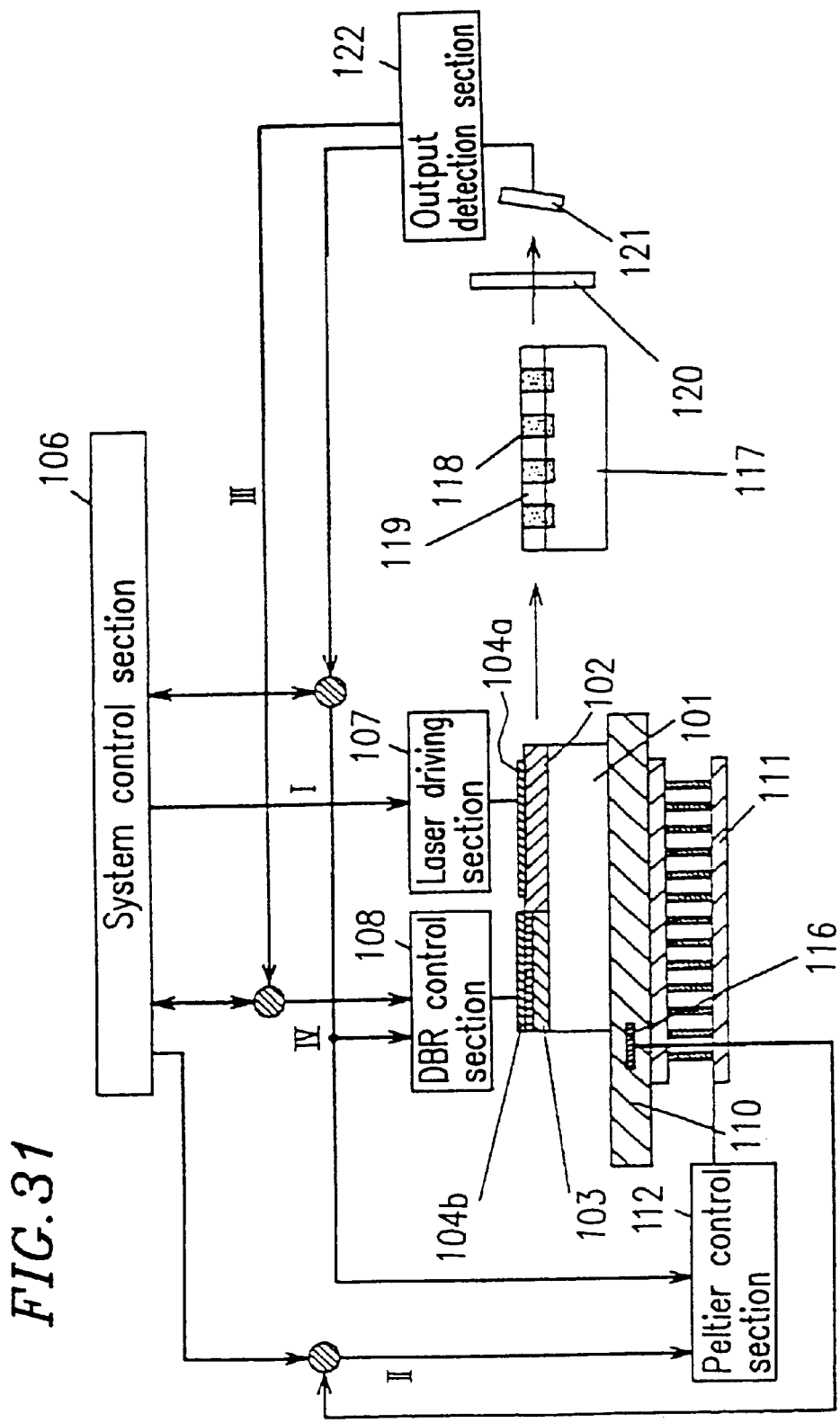
FIG. 31 is a block diagram of a harmonic output stabilizer of Example 19 according to the present invention for an SHG blue laser.

FIG. 31 is a block diagram of a harmonic output stabilizer of this example according to the present invention for an SHG blue laser using an electronic cooling element.

The harmonic output stabilizer of this example includes a semiconductor laser 101 having an active region 102 and a DBR region 103, a wavelength converting device 117 having periodic domain inverted regions 118 and a waveguide 119, an output detector 121 for detecting the harmonic output, and a temperature sensor 116 for detecting the temperature of the semiconductor laser 101. The harmonic output stabilizer also includes four circuit systems for controlling these parts: that is, a laser driving section 107 for supplying a current to the active region 102 of the semiconductor laser 101; a DBR control section 108 for controlling a DBR current supplied to the DBR region 103 of the semiconductor laser 101 to adjust the oscillation wavelength to a desired wavelength; an output detection section 122 for detecting the harmonic output; and a Peltier control section 112 for controlling the temperature of the semiconductor laser 101. The harmonic output stabilizer further includes a system control section 106 for controlling the four circuit systems 107, 108, 112 and 122. In this example, as in example 17, a QPM-SHG device is used as the wavelength converting device 117.

As the initial setting, as in Example 17, the oscillation wavelength is fixed at and around the phase-matching wavelength of the wavelength converting device, and a blue light output of 2 mW can be typically obtained. A current is supplied to an active region 102 under the control of the laser driving section 107 (Loop I). The temperature of the semiconductor laser 101 is set at the ambient temperature (20° C.) by the Peltier control section 112 (Loop II). The oscillation wavelength is adjusted at or around the set wavelength by the DBR control section 108 (Loop III).

As described in Example 13, continuous wavelength variation is possible in the wavelength range of about 1 nm when using temperature variation. However, mode hopping occurs when the wavelength variation exceeds this wavelength range, as shown in FIG. 21. This is because there exits a minute displacement between the DBR wavelength obtained by light feedback by the DBR region 103 and the shift amount for the temperature in the Fabry-Perot mode corresponding to the cavity length defined by the effective DBR length. In this example, the current supplied to the DBR region 103 is also adjusted to compensate this displacement (Loop IV).

The relationship between the variation of the operating temperature and the mode-hopping DBR current has been already described with reference to FIG. 23. When the operating temperature varies, the mode-hopping DBR current, at which the mode hopping occurs due to the variation of an operating current, decreases. It is therefore possible to compensate the phase change by decreasing the DBR current as the operating temperature rises. The phase change can be compensated by decreasing the DBR current by about 1.5 mA for each rise in the operating temperature of 10° C. As a result, continuous wavelength variation in the wavelength range of 1 nm or more was realized.

Phase changes caused by various factors can be compensated by adjusting the DBR current as in this example. Therefore, continuous wavelength variation over a wide wavelength range and thus a stable harmonic output can be realized. In particular, in the case of the short-wavelength light source including the QPM-SHG device and the DBR semiconductor laser, where the allowance of the phase-matching wavelength of the QPM-SHG device is as narrow as 0.1 nm, continuous wavelength variation is indispensable. The wavelength variation using the temperature variation is particularly advantageous for the above case. Since continuous wavelength variation characteristics can be obtained in a wide wavelength range by compensating the phase change due to the temperature variation by the DBR current, a stable short-wavelength light source is realized.

EXAMPLE 20

Figure 32:
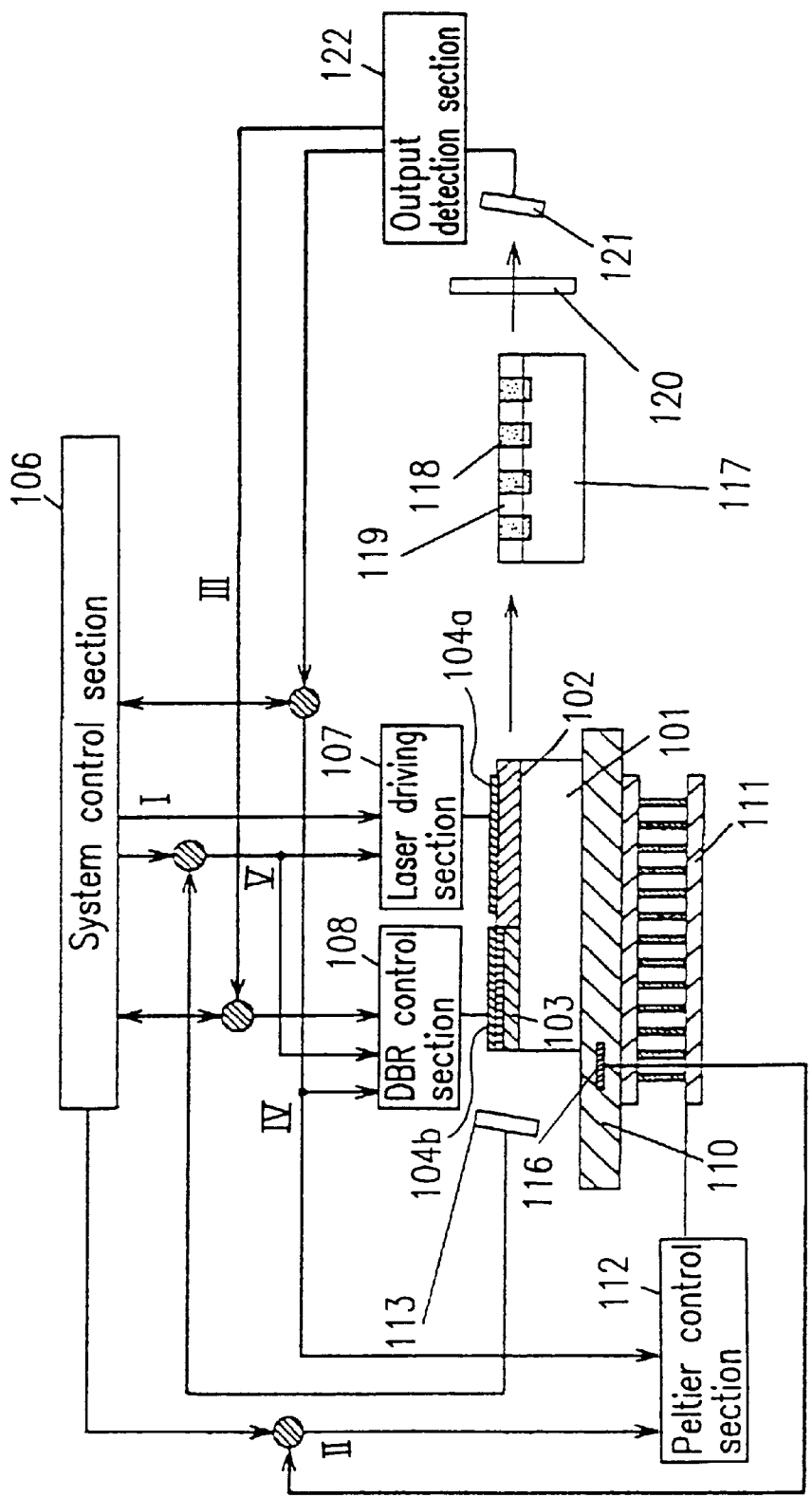
FIG. 32 is a block diagram of a harmonic output stabilizer of Example 20 according to the present invention for an SHG blue laser.

FIG. 32 is a block diagram of a harmonic output stabilizer of this example according to the present invention for an SHG blue laser using an electronic cooling element 111.

The harmonic output stabilizer of this example includes a semiconductor laser 101 having an active region 102 and a DBR region 103, a wavelength converting device 117 having periodic domain inverted regions 118 and a waveguide 119, an output detector 121 for detecting the harmonic output, a temperature sensor 116 for detecting the temperature of the semiconductor laser 101, and an electronic cooling element 111 for controlling the temperature of the semiconductor laser 101. The harmonic output stabilizer also includes four circuit systems for controlling these parts: that is, a laser driving section 107 for supplying a current to the active region 102 of the semiconductor laser 101; a DBR control section 108 for controlling a DBR current supplied to the DBR region 103 of the semiconductor laser 101 to adjust the oscillation wavelength to a desired wavelength; an output detection section 122 for detecting the harmonic output; and a Peltier control section 112 for controlling the temperature of the semiconductor laser 101. The harmonic output stabilizer further includes a system control section 106 for controlling the four circuit systems 107, 108, 112 and 122. In this example, as in example 17, a QPM-SHG device is used as the wavelength converting device 117.

In this example, the oscillation wavelength of the semiconductor laser 101 is adjusted to the phase-matching wavelength of the wavelength converting device by adjusting the operating temperature of the semiconductor laser 101 using the electronic cooling element 111. In general, the laser output varies with the variation of the operating temperature.

As described previously with reference to FIG. 25, the operating temperature needs to be varied by about 15° C. to vary the laser wavelength by about 1 nm. When the operating temperature varies by about 15° C., the laser output varies by approximately ±7.5%. In this example, the laser driving section 107 is controlled so as to obtain a fixed laser output, and the phase change generated by this control is compensated in the DBR region 103.

A method for controlling the oscillation wavelength, controlling the laser output, and compensating the phase change by the DBR control section in this example will now be described in detail.

As the initial setting, as in Example 17, the oscillation wavelength is fixed at or around the phase-matching wavelength of the wavelength converting device. A set current (150 mA) is supplied to an active region 102 under the control of the laser driving section 107 (Loop I). The temperature of the semiconductor laser 101 is set at the ambient temperature (20° C.) by the Peltier control section 112 (Loop II). The oscillation wavelength is adjusted to or around the set wavelength by the DBR control section 108 (Loop III). As described in Example 13, after the initial setting, the temperature of the semiconductor laser 101 is varied using the electronic cooling element 111 to control the oscillation wavelength (Loop IV).

By repeating these loops several times, the harmonic output is adjusted to the peak output.

Thereafter, the laser driving section 107 is controlled to compensate the output variation caused by the temperature variation. Herein, the case where the set wavelength is varied to continuously shift the wavelength by the Peltier control section 112 will be described.

In order to shift the wavelength of the semiconductor laser by 1 nm, the temperature of the semiconductor laser needs to be varied by about 15° C. At this time, the laser output varies by about 7.5%. In this example, the laser output is continuously detected by an output detector 113. The current amount supplied to the active region 102 is controlled by the laser driving section 107 so as to compensate the difference between a signal obtained from the output detector 113 and a set output signal output from the system control section 106, thus allowing the laser output to be kept fixed.

When the temperature of the semiconductor laser 101 is varied by about 15° C. as in this example, the operating current to the active region 102 needs to be varied by about 10% since the output is reduced by about 7.5%. As shown in FIG. 26, as the operating current increases, the temperature of the active region rises, causing a phase change and thus mode hopping. The slope of the wavelength shift is typically 0.02 nm, 10 mA. When the operating current is 150 mA, it needs to be varied to 20 mA in order to keep the output fixed for the temperature variation of 15° C. This causes mode hopping as shown in FIG. 26.

In this example, the phase change generated by adjusting the operating current is compensated by varying the DBR current. The phase changes in the active region with the variation of the operating current ($\Delta I$) of 20 mA, thereby shifting the Fabry-Perot mode by 0.04 nm. Thus, mode hopping can be avoided by varying the DBR current by about 2 mA (0.02 nm/0.21 nm×$\Delta I$) by the DBR control section 108 (Loop V). The temperature of the semiconductor laser is adjusted again by the Peltier control section 112 to obtain the peak harmonic output.

By repeating these loops several times, the harmonic output is stabilized at a fixed value.

Thus, in this example, the output variation caused by the variation of the temperature of the semiconductor laser 101 is detected by the output detector 113, and the difference between the detected output and the set output signal is compensated. At this time, the laser driving section 107 and the DBR control section 108 are simultaneously controlled to keep the laser output fixed while avoiding mode hopping. This realizes continuous wavelength variation over a wide wavelength range while keeping the output fixed. Thus, a stable harmonic output is realized.

EXAMPLE 21

Figure 33:
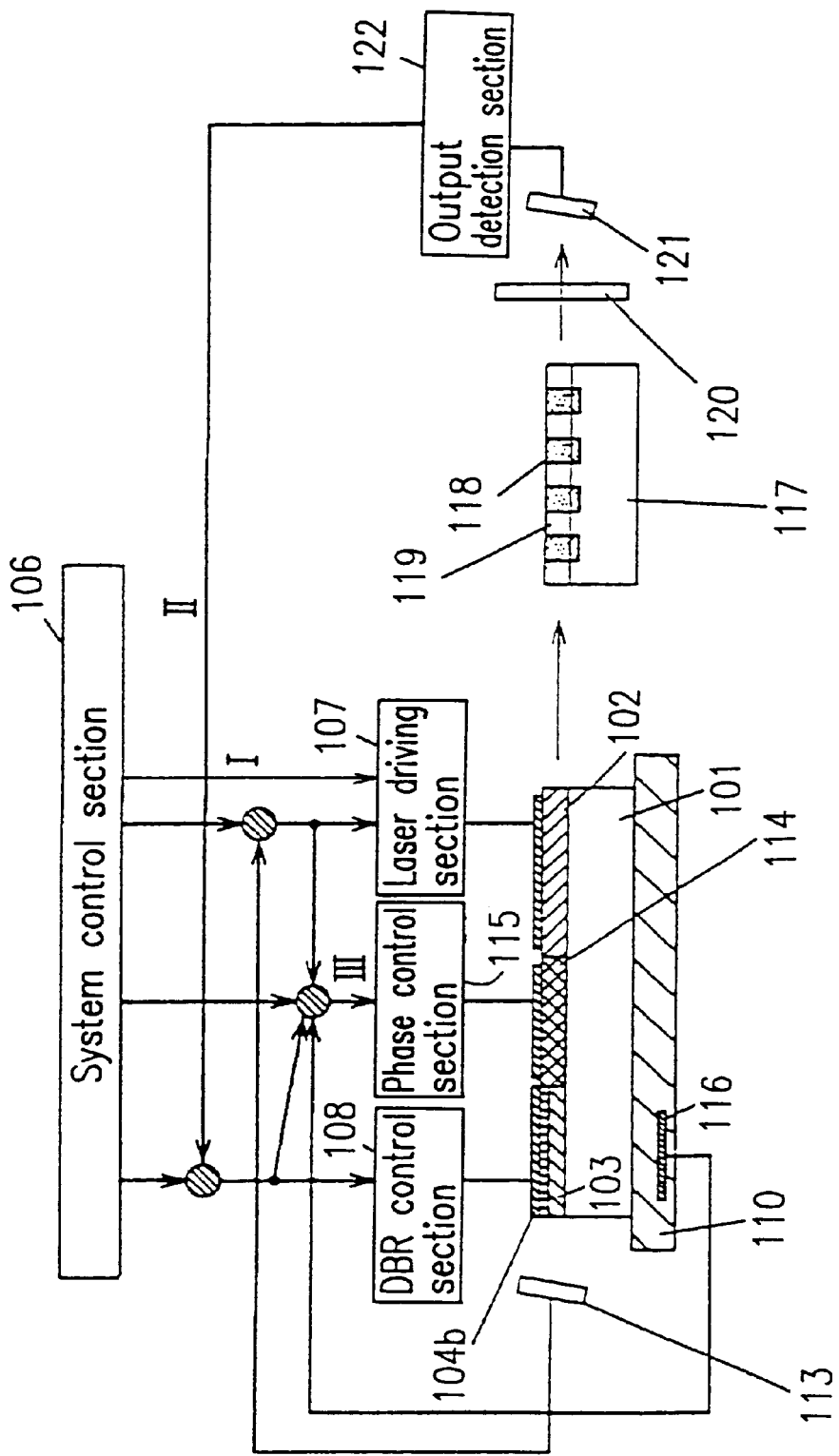
FIG. 33 is a block diagram of a harmonic output stabilizer of Example 21 according to the present invention for an SHG blue laser.
Figure 34:
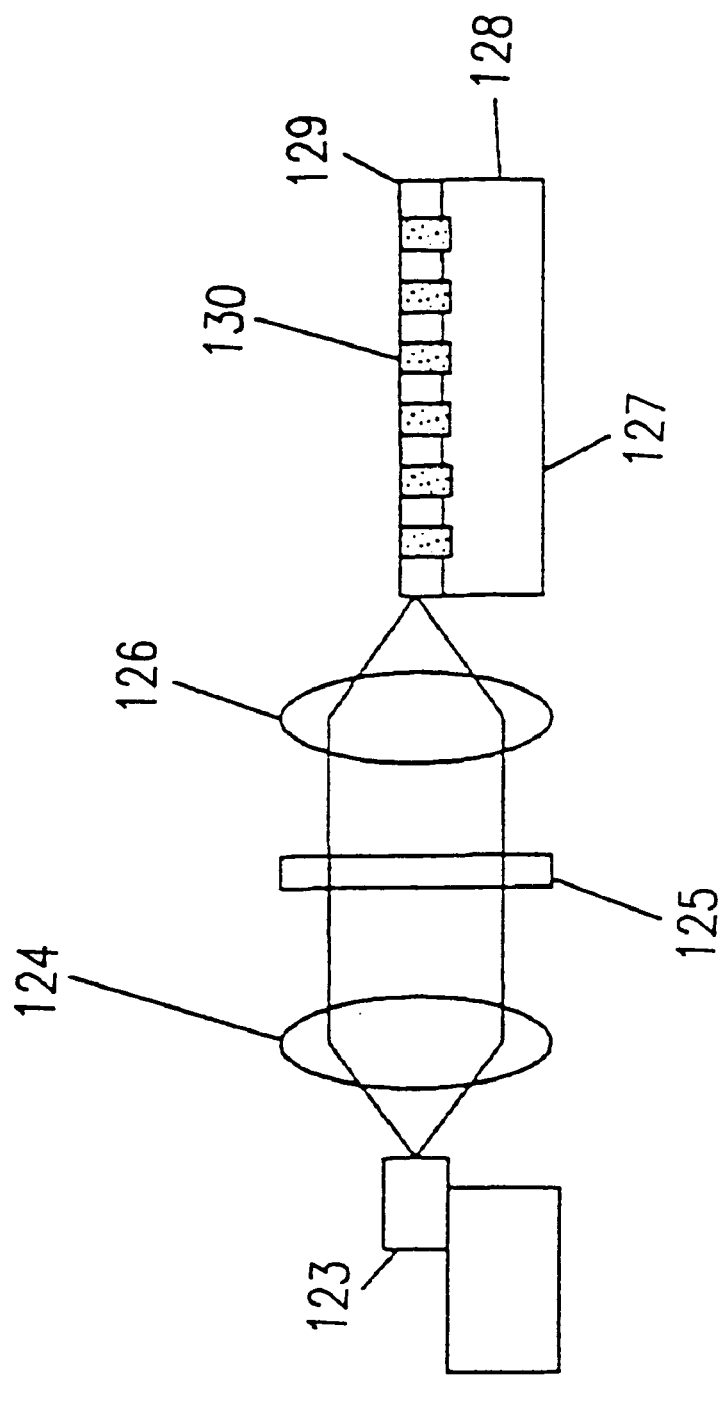
FIG. 34 is a view schematically showing an SHG blue laser.

FIG. 33 is a block diagram of a harmonic output stabilizer of this example according to the present invention for an SHG blue laser using an electronic cooling element 111.

The harmonic output stabilizer of this example includes a semiconductor laser 101 having an active region 102, a DBR region 103, and a phase region 114, a wavelength converting device 117 having periodic domain inverted regions 118 and a waveguide 119, an output detector 121 for detecting the harmonic output, a temperature sensor 116 for detecting the temperature of the semiconductor laser 101, and an output detector 113 for detecting the laser output. The harmonic output stabilizer also includes four circuit systems for controlling these parts: that is, a laser driving section 107 for supplying a current to the active region 102 of the semiconductor laser 101; a DBR control section 108 for controlling a DBR current supplied to the DBR region 103 of the semiconductor laser 101 to adjust the oscillation wavelength to a desired wavelength; an output detection section 122 for detecting the harmonic output; and a phase control section 115 for controlling a phase control current supplied to the phase region 114. The harmonic output stabilizer further includes a system control section 106 for controlling the four circuit systems 107, 108, 115 and 122. In this example, as in example 17, a QPM-SHG device is used as the wavelength converting device 117.

A method for adjusting the wavelength of laser light within the allowance of the phase-matching wavelength of the wavelength converting device to stabilize the harmonic output in this example according to the present invention will now be described in detail.

As the initial setting, as in Example 17, the oscillation wavelength is fixed at or around the phase-matching wavelength of the wavelength converting device. First, a signal is input into the laser driving section 107 from a system control section 106 to supply a current to the active region 102 so that the light intensity of the semiconductor laser 101 becomes a set value, i.e., 100 mW (Loop I). Then, the harmonic output is detected by an output detector 121, and a signal indicating the detected result is output from the output detection section 122. The DBR current at which the harmonic output is at its peak is stored in the system control section 106, the stored DBR current is supplied to the DBR region, and thus the oscillation wavelength of the laser light is adjusted to the phase-matching wavelength of the wavelength converting device (Loop II).

In this example, continuous wavelength variation can be realized by using the phase region 114 after the above initial setting in the following manner.

The oscillation wavelength of the DBR semiconductor laser is varied by varying any of the following three factors:

(1) current supplied to the DBR region (the DBR current);

(2) operating temperature of the DBR semiconductor laser; and (3) current supplied to the active region (the operating current).

More specifically, the phase in the cavity mode (Fabry-Perot mode) of the semiconductor laser changes by varying the wavelength with the variation of the DBR current (wavelength cnntrol), by varying the ambient temperature (temperature control), or varying the operating current for controlling the laser output (output control), causing mode hopping. In this example, the phase region 114 is used to realize the above controls without causing mode hopping.

As described previously with reference to FIG. 28, the shift of the oscillation wavelength with the variation of the current supplied to the continuous wavelength variation portion is 0.07 nm/10 mA. The shifts of the oscillation wavelength with the variations of the DBR current and the operating current were 0.21 nm/10 mA and 0.02 nm/10 mA, respectively. This indicates that a current three times the variation of the DBR current should be supplied to the phase region 114 for the wavelength control, while a current about one-third of the variation of the operating current should be supplied to the phase region 114 for the output control. For the temperature control, the current supplied to the phase region 114 should be reduced by 5 mA for each temperature rise of 10° C.

In consideration of the above, in this example, the variations of the ambient temperature, the operating current, and the DBR current are controlled by the laser driving section 107 and the DBR control section 108. Then, the sum of the phase changes generated by these controls are compensated by the phase control section 115. Thus, continuous wavelength variation is realized.

In this example, continuous wavelength variation is realized by using the phase region for the shift of the phase-matching wavelength caused by the ambient temperature variation and the like. By this continuous wavelength variation, the harmonic output is controlled to be fixed at its peak. In particular, continuous wavelength variation is indispensable in the case of the short-wavelength light source including the QPM-SHG device and the DBR semiconductor laser, where the allowance of the phase-matching wavelength of the QPM-SHG device is as narrow as 0.1 nm. The method for stabilizing the harmonic output using the phase control section of this example, therefore, has a large practical effect.

In Examples 17 to 21 above, the waveguide type wavelength converting device of the quasi-phase matching system is used as the wavelength converting device. The same effect can also be obtained by using a bulk type wavelength converting device of the quasi-phase matching system or a wavelength converting device of a phase matching system utilizing birefringence.

EXAMPLE 22

A light source used for an optical disk system requires long-term output stability. When a short-wavelength light source including a DBR semiconductor laser and a wavelength converting device is used for an optical desk system, the long-term output stability is a problem to be overcome. In order to overcome this problem, the short-wavelength light source needs to be controlled so that the wavelength of the semiconductor laser matches with the phase-matching wavelength of the wavelength converting device.

In Examples 18 to 21 above, the wavelength of the semiconductor laser is continuously varied to stabilize the harmonic output. However, the electronic cooling element and the like fail to respond to an abrupt change of the ambient temperature and the like, thereby causing output variation. In the short-wavelength light source having the harmonic output stabilizer of Example 17, where the wavelength variation in the DBR region is discontinuous, a large output variation occurs when the harmonic output is adjusted. Another problem is that power consumption increases since a large current is required for the electronic cooling element and the phase region.

In this example, a method for providing stable disk reproduction characteristics when the short-wavelength light source is applied to an optical disk will be described. In this method, the stabilization of the harmonic output, the current resetting for the electronic cooling element or the phase region is performed during the system operation standby period. Alternatively, the stabilization of the harmonic output, the current resetting for the electronic cooling element or the phase region is performed after the read-out information is stored once in a memory or the like.

Figure 36A:
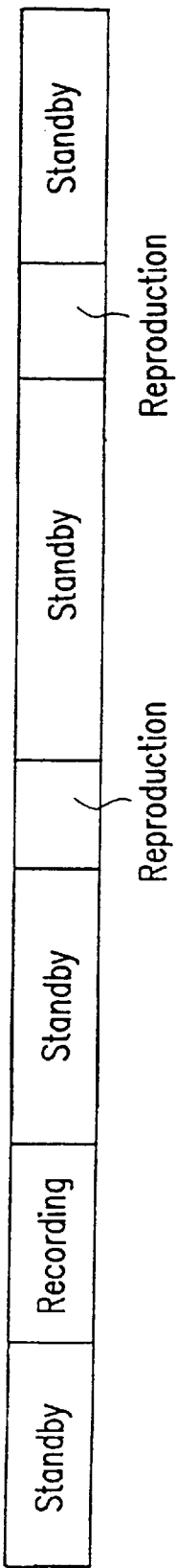
FIGS. 36A and 36B show the operation states of an optical disk system.
Figure 36B:
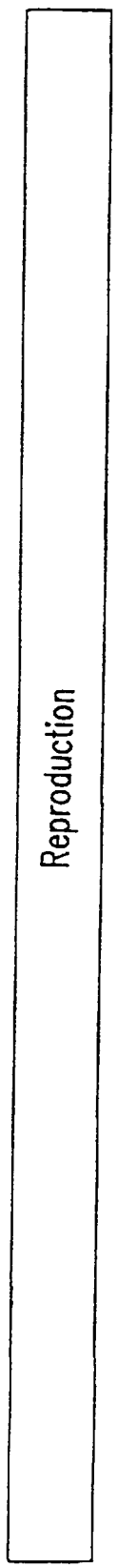

FIGS. 36A and 36B show the operation status of a recordable/reproducible optical disk system.

As shown in FIG. 36A, when used for a computer, an optical disk system is not always busy in exchanging information with the computer, but operates only when reproduction (read-out) and recording (writing) are performed. Accordingly, stable recording and reproduction characteristics can be realized by stabilizing the harmonic output during the system standby period when reproduction and recording are not performed as shown in FIG. 36A. The stabilization of the harmonic output is performed by the methods described in the above examples, and again are described below:

When the wavelength variation is performed only in the DBR region; the wavelength of the semiconductor laser is fixed at the phase-matching wavelength of the wavelength converting device by varying the DBR current in the same direction as in the detection phase so as to avoid the hysteretic characteristic as described in Example 17. Thus, a stable harmonic output is obtained.

When the wavelength variation is performed using the electronic cooling element; continuous wavelength variation is performed using the electronic cooling element as described in Example 18. When the phase-matching wavelength of the wavelength converting device is shifted due to some reason, increasing the wavelength variation allowance, a difference arises between the ambient temperature and the temperature of the short-wavelength light source. This increases the heat absorption capacity of the electronic cooling element and thus the power consumption. In order to reduce the power consumption, the temperature of the short-wavelength light source is reset at the ambient temperature and the DBR current is readjusted during the system standby period, to fix the wavelength of the semiconductor laser at the phase-matching wavelength.

When the wavelength variation is performed using the phase region and the DBR region; as the wavelength variation allowance becomes wide, the current supplied to the phase region increases, as in the case of using the electronic cooling element. To overcome this problem and reduce the power consumption, the current to the phase region is reset and the wavelength of the semiconductor laser is readjusted to the phase-matching wavelength.

On the other hand, as shown in FIG. 36B, when an optical disk storing movies and other software of this type is reproduced, the reproduction lasts two consecutive hours or so. It is therefore required to keep the output stable for over two hours. To achieve this, in this example, reproduced disk information is stored in a memory or the like, and the stored information is retrieved as an image at the time of the stabilization of the harmonic output. Thus, invariably stable reproduction characteristics can be realized.

Figure 37:
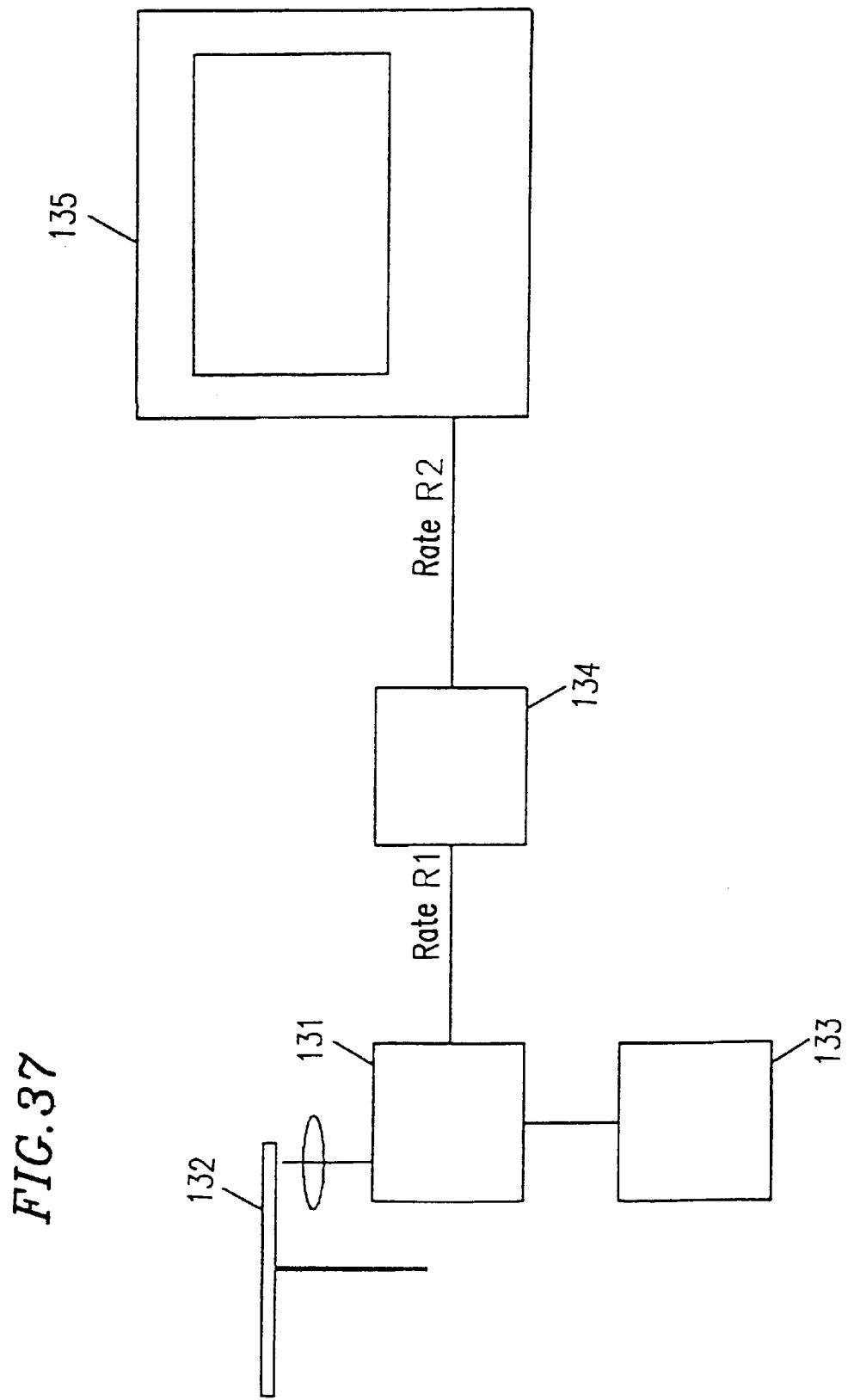
FIG. 37 is a block diagram of an optical disk system according to the present invention.

FIG. 37 shows the configuration of a video reproduction system. A semiconductor memory is normally used for a memory 134. In this example, a DRAM (random access memory) and a flash memory are used. Information in an optical disk 132 reproduced by use of an optical pickup 131 is sent to the memory 134 at a transfer rate R1. The information is then sent to a display 135 at a transfer rate R2. If R1>R2, the memory 134 gradually accumulates reproduced information from the optical disk 132. When the memory 134 is full of information, the information in the memory 134 is transferred to the display 135, during which the stabilization of the harmonic output is performed by a stabilization control circuit 133. Upon the completion of the stabilization control, the memory 134 again accumulates information.

By repeating this procedure, long-term stable reproduction characteristics are realized.

The semiconductor laser having the DBR region is useful for a variety of applications since the oscillation wavelength thereof can be varied to a desired wavelength. in particular, the DBR semiconductor laser has a large effect when used for the SHG laser composed of the wavelength converting device such as the QPM-SHG device and the semiconductor laser, where the oscillation wavelength of the semiconductor laser needs to be fixed within the allowance of the phase-matching wavelength of the wavelength converting device.

As described above, the oscillation wavelength of the DBR semiconductor laser can be varied by methods including: (1) supplying a current to the DBR region, and (2) varying the temperature of the entire semiconductor laser using the electronic cooling element and the like. In method (1), however, mode hopping and the hysteretic wavelength variation characteristics are exhibited. In method (2), the capacity of the electronic cooling element and the like cause problems at the commercialization.

In order to overcome the problem in method (1), the wavelength variation is performed while increasing the DBR current to avoid the hysteretic characteristic and thus achieve stable wavelength variation. For an SHG blue laser, in particular, stable wavelength variation is indispensable for the stabilization of the harmonic (blue light) output since the allowance of the phase-matching wavelength is as narrow as about 0.1 nm. By using the above wavelength control, the phase-matching wavelength of the wavelength converting device can be detected without fail at the activation of the SHG blue laser, thereby realizing instantaneous activation of the laser. The practical effect thereof is therefore very large.

The wavelength variation by temperature control is useful because it can be performed continuously. In particular, in the SHG blue laser where the allowance of the phase-matching wavelength is as narrow as about 0.1 nm, the wavelength needs to be finely controlled in order to stabilize the harmonic output. Since the SHG blue laser is used for optical disks, laser printers, and the like, reduction of power consumption is critical for the commercialization of the laser. The power consumption of the electronic cooling element is therefore a problem to be overcome for the wavelength variation by electronic cooling element increases as the difference between the ambient temperature and the control temperature increases. Thus, by setting the initial set temperature at the ambient temperature as in the present invention, continuous wavelength variation can be realized with reduced power consumption.

Stable continuous wavelength variation by temperature control is difficult if the ambient temperature and the operating temperature vary. In this example, the DBR region is used not only for the wavelength variation but also for the compensation of a phase change to ensure stable continuous wavelength variation. Thus, a more reliable SHG blue laser with stabilized blue light output is realized.

Semiconductor lasers having a phase control region have been proposed as the means for realizing continuous wavelength variation. However, stable continuous wavelength variation is difficult if the ambient temperature and the operating temperature vary. In the DBR semiconductor laser, the wavelength varies in a certain proportion with the variations of the ambient temperature, the DBR Current, the operating current, the phase control current, and the like. In this example, therefore, the phase change generated due to the variations of the ambient temperature, the DBR current, and the operating current is determined as the sum of the respective phase change amounts, and the resultant phase change is compensated by the phase control current. Thus, stable continuous wavelength variation is realized. Since this method requires no electronic cooling element, the power consumption is reduced. The SHG blue laser with reduced power consumption can be applied to portable optical disks, providing a large practical effect.

Thus, according to the present invention, a plurality of substances, such as balls or fibers, having a same diameter, are interposed between the semiconductor laser chip and the farroelectric crystal substrate functioning as an optical functional device such as the SHG device or the optical modulation device. With this arrangement, the optical coupling adjustment for coupling semiconductor laser light to the waveguide, especially the adjustment in the length direction of the semiconductor laser chip and the ferroelectric crystal substrate is simplified, and a super-small light generator is realized.

In the light generator according to the present invention where the semiconductor laser chip and the ferroelectric crystal substrate (the optical functioning device) having the waveguide formed thereon are fixed on the submount, the surface of the submount on which the semiconductor laser chip is fixed is perpendicular to the surface thereof on which the ferroelectric crystal substrate (the optical functioning device) having the waveguide formed thereon is formed. With this structure, the optical adjustment (alignment adjustment) for introducing semiconductor laser light to the waveguide can be simplified, thereby realizing a super-small light generator. Especially, when the optical functional device such as the SHG device is formed on the z-cut crystal substrate, the optical coupling adjustment can be performed without using any half-wave plate. The effect of this structure is therefore extremely large.

An the light generator according to the present invention where at least the semiconductor laser chip and the ferroelectric crystal substrate (the optical functioning device) having the waveguide formed thereon are fixed on the submount, the heat conductivity of the material of the portion of the submount on which the semiconductor laser chip is mounted is made larger than that of the material of the portion thereof on which the ferroelectric crystal substrate is formed. With this arrangement, the conduction of heat generated in the semiconductor laser chip to the ferroelectric crystal substrate can be reduced, thereby preventing the characteristics of the optical functioning device formed on the ferroelectric crystal substrate from deteriorating. When a ceramic is used as the material for the submount, the heat conductivity and the linear expansion coefficient can be freely selected. Ceramics also have good processability. Thus, the conduction of the heat from the semiconductor laser chip to the optical functional device can be reduced.

Further, the crystal thin plate is interposed between the portion of the submount on which the semiconductor laser chip is mounted and the portion thereof on which the ferroelectric crystal substrate (the optical functional device) is formed. With this arrangement, a light generator where the alignment adjustment for optical coupling is easily conducted and the heat radiation characteristic of the semiconductor laser is good can be realized.

In the light generator according to the present invention where at least the semiconductor laser chip and the ferroelectric crystal substrate (the optical functional device) having the waveguide formed thereon are fixed on the submount, markings for alignment are formed on the semiconductor laser chip, the ferroelectric crystal substrate, and the submount. The surface of the submount opposite to the surface thereof where the semiconductor laser chip and the ferroelectric crystal substrate are formed is irradiated with light, which is allowed to pass through the submount, to identify the markings through their images. The identified markings are used for an alignment process, thereby resulting in an easier adjustment process.

The semiconductor laser chip may be fixed at a desired position of the submount by allowing the semiconductor laser chip to emit light by light excitation, by allowing external light to couple to the waveguide portion of the active layer of the semiconductor laser chip, or by pulse-driving the semiconductor laser chip. By these methods, the optical adjustment can be performed in a short period, while recognizing the light emitting portion, without deteriorating the semiconductor laser chip.

Furthermore, according to the oscillation wavelength stabilizer of the present invention including the semiconductor laser having the active region for obtaining a gain and the distributed Bragg-reflector (DBR) region for fixing the oscillation wavelength, the oscillation wavelength is fixed at a desired wavelength by varying the current supplied to the DBR region in the following manner. First, the DBR current is increased or decreased in a first direction to detect a value of the DBR current corresponding to the desired wavelength. Then, after varying the DBR current in the opposite direction, the DBR current is again varied in the first direction to fix at the detected value. Thus, the hysteretic characteristic is avoided, and stable oscillation wavelength control is realized.

In the oscillation wavelength stabilizer of the present invention including the semiconductor laser having the active region and the DBR region, the oscillation wavelength is controlled to a desired wavelength by the current supplied to the DBR region in the following manner. Different current supply rates are used for the area where mode hopping occurs and the area where continuous wavelength variation is obtained, so as to avoid noise generation at the mode hopping.

In the oscillation wavelength stabilizer of the present invention including the semiconductor laser having the active region and the DBR region and the electronic cooling element, in the initial state, the temperature of the semiconductor laser is set at or around the ambient temperature by the electronic cooling element, and the oscillation wavelength is fixed at a desired wavelength by varying the DBR current. After the initial setting, the temperature of the semiconductor laser is varied by the electronic cooling element to vary the wavelength. Thus, the oscillation wavelength control is realized while reducing the power consumption of the electronic cooling element.

In the oscillation wavelength stabilizer of the present invention including the semiconductor laser having the active region and the DBR region and the electronic cooling element, when the wavelength variation is performed by varying the temperature of the semiconductor laser using the electronic cooling element, the phase change generated due to the temperature variation of the semiconductor laser is compensated by varying the DBR current. Thus, continuous wavelength variation is realized while avoiding mode hopping which may otherwise occur due to the temperature variation.

In the oscillation wavelength stabilizer of the present invention including the semiconductor laser having the active region and the DBR region and the electronic cooling element, when the wavelength variation is performed by varying the temperature of the semiconductor laser using the electronic cooling element, the current supplied to the active region is adjusted according to the variation of the output of the semiconductor laser. The phase change generated due to this adjustment is compensated by varying the DBR current. Thus, continuous wavelength variation is realized while reducing the laser output variation and avoiding the mode hopping.

In the oscillation wavelength stabilizer of the present invention including the semiconductor laser having the active region, the DBR region, and the phase region and the temperature sensor, there are provided a first control section for adjusting the current supplied to the active region so that the output of the semiconductor laser is fixed, a second control section for adjusting the current supplied to the DBR region so that the oscillation wavelength becomes a desired wavelength, and a third control section for adjusting the current supplied to the phase region to compensate the phase change amount generated as the ambient temperature varies. Thus, continuous wavelength variation without mode hopping is realized.

In the short-wavelength light source according to the present invention including the semiconductor laser having the active region and the DBR region and the wavelength converting device made of nonlinear optical crystal, the oscillation wavelength is adjusted to the phase-matching wavelength of the wavelength converting device by varying the current supplied to the DBR region in the following manner. First, the DBR current is increased or decreased in a first direction to detect a value of the DBR current corresponding to the phase-matching wavelength. Then, after varying in the opposite direction, the DBR current is again varied in the first direction to fix at the detected value. Thus, the hysteretic characteristic at the wavelength variation is avoided and a stable harmonic output is realized.

In the short-wavelength light source according to the present invention where the semiconductor laser having the active region and the DBR region and the wavelength converting device made of nonlinear optical crystal are integrated together with the electronic cooling element, in the initial state, the temperature of the short-wavelength light source is set at or around the ambient temperature by the electronic cooling element, and the oscillation wavelength is adjusted to the phase-matching wavelength of the wavelength converting device by varying the current supplied to the DBR region. After the initial setting, the oscillation wavelength is adjusted to the phase-matching wavelength by varying the temperature of the semiconductor laser by the electronic cooling element Thus, the power consumption of the electronic cooling element is reduced, and the peak harmonic output can be detected by continuous wavelength variation.

In the short-wavelength light source according to the present invention where the semiconductor laser having the active region and the DBE region and the wavelength converting device made of nonlinear optical crystal are integrated together with the electronic cooling element, when the oscillation wavelength is adjusted to the phase-matching wavelength of the wavelength converting device by varying the temperature of the semiconductor laser by the electronic cooling element, the phase change amount generated due to the temperature variation of the semiconductor laser is compensated by varying the DBR current. Thus, a stable harmonic output without mode hopping is realized.

In the short-wavelength light source where the semiconductor laser having the active region and the DBR region and the wavelength converting device made of nonlinear optical crystal are fixed on the electronic cooling element, the semiconductor laser oscillates when a current is supplied to the active region, the resultant laser light is introduced into the wavelength converting device, and the oscillation wavelength is adjusted to the phase-matching wavelength by varying the temperature of the semiconductor laser by the electronic cooling element. At the adjustment of the oscillation wavelength to the phase-matching wavelength, the current supplied to the active region is adjusted according to the output variation of the semiconductor laser, and the resultant phase change amount is compensated by varying the DBR current. Thus, the laser output variation is reduced and a stable harmonic output without mode hopping is realized.

In the short-wavelength light source according to the present invention including the semiconductor laser having the active region, the DBR region, and phase region, the temperature sensor, and the wavelength converting device made of nonlinear optical crystal, there are provided a first control section for adjusting the current supplied to the active region so that the output of the semiconductor laser is fixed, a second control section for adjusting the current supplied to the DBR region so that the oscillation wavelength becomes a desired wavelength, and a third control section for adjusting the current supplied to the phase region to compensate the phase change amount generated as the ambient temperature varies. Thus, continuous wavelength variation is realized, and a harmonic peak output is detected.

In the optical disk system according to the present invention for recording or reproducing a signal by scanning an optical disk, light emitted from the short-wavelength light source where the semiconductor laser having the active region and the DBR region and the wavelength converting device made of nonlinear optical crystal are integrated together with the electronic cooling element, the following procedure is performed. The operating temperature of the short-wavelength light source is readjusted to the ambient temperature by the electronic cooling element, and the wavelength of the semiconductor laser is recontrolled to the phase-matching wavelength of the wavelength converting device by varying the current supplied to the DBR region during the standby period of the optical disk system, the transition period from the reproduction to the recording of the optical disk, or the period required to reach the start point of the reproduction at the transition from the recording to the reproduction (seek time). Thus, good long-term reproduction characteristics are ensured for the resultant optical disk system.

In the optical disk system according to the present invention for recording or reproducing a signal by scanning an optical disk, light emitted from the short-wavelength light source where the semiconductor laser having the active region and the DBR region and the wavelength converting device made of nonlinear optical crystal are integrated together with the electronic cooling element, the optical disk system is provided with a memory for accumulating reproduced information Thus, good long-term reproduction characteristics are ensured for the resultant optical disk system.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a light generating apparatus, comprising the steps of:

allowing at least a portion of a layered structure for laser oscillation in a semiconductor laser chip to emit light so as to form a light emitting region;

identifying the light emitting region of the semiconductor laser chip to obtain a positional information of the semiconductor laser chip, and mounting the semiconductor laser chip at a predetermined position on a submount based on the positional information; and mounting a substrate on the submount, the substrate including an optical waveguide.

2. A method according to claim 1, wherein the light emitting region is formed by optical excitation.

3. A method according to claim 1, wherein the light emitting region is formed by coupling external light to an active layer of the semiconductor laser chip.

4. A method according to claim 1, wherein the light emitting region is formed by pulse-driving the semiconductor laser chip.

5. A method according to claim 1, wherein the substrate is a ferroelectric crystal substrate.

6. A method according to claim 5, wherein the ferroelectric crystal substrate comprises $LiTa_xNb_{1-x}O_3$ ($0 \leq x \leq 1$).

7. A method according to claim 5, further comprising the step of providing a periodic domain inverted structure on the ferroelectric substrate.

8. A method according to claim 1, further comprising the step of forming the optical waveguide by an ion-exchange technique.

* * * * *

UNITED STATES PATENT AND TRADEMARK OFFICE
CERTIFICATE OF CORRECTION

PATENT NO. : 5,960,259
DATED : September 28, 1999
INVENTOR(S) : Kitaoka et al.

It is certified that error appears in the above-identified patent and that said Letters Patent is hereby corrected as shown below:

On the Cover Page, item [57], ABSTRACT, at line 3, "mount" should read -- mounted --.

Signed and Sealed this

Twenty-fourth Day of October, 2000

Attest:

Q. TODD DICKINSON

*Attesting Officer*      *Director of Patents and Trademarks*

UNITED STATES PATENT AND TRADEMARK OFFICE
CERTIFICATE OF CORRECTION

PATENT NO. : 5,960,259
DATED : September 28, 1999
INVENTOR(S) : Kitaoka et al

It is certified that error appears in the above-identified patent and that said Letters Patent is hereby corrected as shown below:

On the Title page, please add the following:

Foreign Application Priority Data
--[30]  Nov. 16, 1995    [JP]   Japan..........7-298027
        May 22, 1996    [JP]   Japan..........8-126740--

Signed and Sealed this

Twenty-first Day of August, 2001

Attest:

Attesting Officer

NICHOLAS P. GODICI
Acting Director of the United States Patent and Trademark Office